US008029698B2

(12) United States Patent
Ruckenstein et al.

(10) Patent No.: US 8,029,698 B2
(45) Date of Patent: *Oct. 4, 2011

(54) PRODUCTION OF PHOTOLUMINESCENT SILICON NANOPARTICLES HAVING SURFACES THAT ARE ESSENTIALLY FREE OF RESIDUAL OXYGEN

(75) Inventors: Eli Ruckenstein, Amhert, NY (US); Mark T. Swihart, Williamsville, NY (US); Fengjun Hua, Knoxville, TN (US)

(73) Assignee: The Research Foundation of State University of New York, Amherst, NY (US)

( * ) Notice: Subject to any disclaimer, the term of this patent is extended or adjusted under 35 U.S.C. 154(b) by 1485 days.

This patent is subject to a terminal disclaimer.

(21) Appl. No.: 11/406,940

(22) Filed: Apr. 19, 2006

(65) Prior Publication Data
US 2007/0196297 A1 Aug. 23, 2007

Related U.S. Application Data

(60) Provisional application No. 60/672,808, filed on Apr. 19, 2005.

(51) Int. Cl.
C09K 11/08 (2006.01)
C09K 11/66 (2006.01)
B32B 3/10 (2006.01)
H01L 21/20 (2006.01)
H01L 21/36 (2006.01)

(52) U.S. Cl. ............... 252/301.4 F; 977/774; 977/814; 428/131; 438/507

(58) Field of Classification Search ............... 252/301.4, 252/301.4 F; 977/774, 814; 428/131; 438/507
See application file for complete search history.

(56) References Cited

U.S. PATENT DOCUMENTS

| 4,613,440 | A | 9/1986 | Zupancic et al. |
|---|---|---|---|
| 6,471,930 | B2 | 10/2002 | Kambe et al. |
| 6,585,947 | B1 | 7/2003 | Nayfeh et al. |
| 6,586,785 | B2 | 7/2003 | Flagan et al. |
| 6,743,406 | B2 | 6/2004 | Nayfeh et al. |
| 6,846,565 | B2 | 1/2005 | Korgel et al. |
| 6,918,946 | B2 | 7/2005 | Korgel et al. |
| 7,371,666 | B2 * | 5/2008 | Swihart et al. ............... 438/507 |
| 7,446,335 | B2 | 11/2008 | Kortshagen et al. |
| 2002/0142218 | A1 | 10/2002 | Reitz et al. |
| 2004/0076813 | A1 | 4/2004 | Han et al. |
| 2004/0229447 | A1 | 11/2004 | Swihart et al. |
| 2006/0051505 | A1 | 3/2006 | Kortshagen et al. |
| 2008/0220175 | A1 | 9/2008 | Mangolini et al. |
| 2009/0056628 | A1 | 3/2009 | Kortshagen et al. |
| 2009/0074649 | A1 | 3/2009 | Korgel et al. |

OTHER PUBLICATIONS

Wolkin. Electronic States and Luminescence in Porous Silicon Quantum Dots: The Role of Oxygen. Phys. Rev. Lett. vol. 82 Issue 1, pp. 197-200.*
Li. Process for Preparing Macroscopic Quantities of Brightly Photoluminescent Silicon Nanoparticles with emission spanning the visible spectrum. Langmiur 2003. 19, 8490-8496.*
Seraphin. Surface control of luminescence in silicon nanoparticles. J. Appl. Phys. 80 (11), Dec. 1, 1996.*
Stewart. Exciton-Mediated Hydrosilylation on Photoluminescent Nanocrystalline Silicon. J. Am. Chem. Soc. 2001, 123, 7821-7830.*
Baldwin et al., "Solution Reduction Synthesis of Surface Stabilized Silicon Nanoparticles," Chem. Commun. 1822-3 (2002).
Belomoin et al., "Observation of a Magic Discrete Family of Ultrabright Si Nanoparticles," Appl. Phys. Lett. 80(5):841-3 (2002).
Bley & Kauzlarich, "A Low-temperature Solution Phase Route for the Synthesis of Silicon Nanoclusters," J. Am. Chem. Soc. 118:12461-2 (1996).
Bocarsly & Wimbish, Abstract, "Surface-chemical Control of Optical Quenching Processes at Porous Silicon Interfaces: Generation of a Stable-selective Sulfur-dioxide Sensor," ACS National Meeting Book of Abstracts (Mar. 26-30, 2000).
Borsella et al., "Optical and Morphological Characterization of Si Nanocrystals/Silica Composites Prepared by Sol-13 Gel Processing," Mater. Sci. Engin. B79:55-62 (2001).
Botti et al., "Photoluminescence from Silicon Nano-particles Synthesized by Laser-induced Decomposition of Silane," J. Appl. Phys. 88(6):3396-401 (2000).
Brus et al., "Electronic Spectroscopy and Photophysics of Si Nanocrystals: Relationship to Bulk c-Si and Porous Si," J. Am. Chem. Soc. 117:2915-22 (1995).
Brus, "Luminescence of Silicon Materials: Chains, Sheets, Nanocrystals, Nanowires, Microcrystals, and Porous Silicon," J. Phys. Chem. 98:3575-81 (1994).
Buriak, "Organometallic Chemistry on Silicon and Germanium Surfaces," Chem. Rev. 102(5):1271-1308 (2002).
Ding et al., "Electrochemistry and Electrogenerated Chemiluminescence from Silicon Nanocrystal Quantum Dots," Science 296:1293-7 (2002).
Ehbrecht et al., "Photoluminescence and Resonant Raman Spectra of Silicon Films Produced by Size-selected Cluster Beam Deposition," Phys. Rev. B 56(11):6958-64 (1997).
Ehbreht et al., "Deposition and Analysis of Carbon and Silicon Clusters Generated by Laser-induced Gas Phase Reaction," Proc. SPIE 2778:171-2 (1996).
English et al., "Size Tunable Visible Luminescence from Individual Organic Monolayer Stabilized Silicon Nanocrystal Quantum Dots," Nano Lett. 2(7):681-5 (2002).

(Continued)

Primary Examiner — Carol M Koslow
Assistant Examiner — Matthew Hoban
(74) Attorney, Agent, or Firm — LeClairRyan

(57) ABSTRACT

The present invention relates to a method for preparing photoluminescent silicon nanoparticles having uniformly hydrogen-terminated surfaces that are essentially free of residual oxygen. The present invention also relates to a method of preparing a blue-emitting photoluminescent silicon nanoparticle. The present invention further relates to a composition that includes a photoluminescent silicon nanoparticle having a surface that is uniformly hydrogen-terminated and essentially free of residual oxygen. The present invention also relates to a composition including a photoluminescent silicon nanoparticle having a surface that is uniformly coated with an organic layer and essentially free of residual oxygen. The present invention additionally relates to a composition including a photoluminescent silicon nanoparticle stably dispersed in an organic solvent and having a surface that is uniformly coated with an organic layer and essentially free of residual oxygen.

20 Claims, 43 Drawing Sheets

OTHER PUBLICATIONS

Fojtik et al., "Formation of Nanometer-size Silicon Particles in a Laser Induced Plasma in SiH$_4$," *Ber. Bunsenges. Phys. Chem.* 97(11):1493-6 (1993).

Fojtik & Henglein, "Luminescent Colloidal Silicon Particles," *Chem. Phys. Lett.* 221:363-7 (1994).

Heath, "A Liquid-solution-phase Synthesis of Crystalline Silicon," *Science* 258(5085):1131-3 (1992).

Higashi et al., "Comparison of Si(111) Surfaces Prepared Using Aqueous Solutions of NH$_4$F versus HF," *Appl. Phys. Lett.* 58(15):1656-8 (1991).

Holmes et al., "Highly Luminescent Silicon Nanocrystals with Discrete Optical Transitions," *J. Am. Chem. Soc.* 123:3743-8 (2001).

Huisken, "Light-emitting Silicon Nanocrystals from Laser Pyrolysis," *Adv. Mater.* 14(24):1861-5 (2002).

Huisken & Kohn, "Structured Films of Light-emitting Silicon Nanoparticles Produced by Cluster Beam Deposition," *Appl. Phys. Lett.* 74(25):3776-8 (1999).

Lam et al., "Large-scale Synthesis of Ultrafine Si Nanoparticles by Ball Milling," *J. Crystal Growth* 220:466-70 (2000).

Ledoux et al., "Effect of Passivation and Aging on the Photoluminescence of Silicon Nanocrystals," *App. Phys. Lett.* 79(24):4028-30 (2001).

Ledoux et at, "Photoluminescence of Size-separated Silicon Nanocrystals: Confirmation of Quantum Confinement," *Appl. Phys. Lett.* 80(25):4834-6 (2002).

Li et al., "Photothermal Aerosol Synthesis of and Photoluminescence from Silicon Nanoparticles," *Electmchem. Soc'y Proc.* 2003-08:1161-7 (2002).

Li et al., "Luminescent Silicon Nanoparticles Capped by Conductive Polyaniline Through the Self-assembly Method," *Langmuir* 20:1963-71 (2004).

Lie et al., "Preparation and Characterisation of Luminescent Alkylated-silicon Quantum Dots," *J. Electroanal. Chem.* 538-539:183-90 (2002).

Littau et al., "A Luminescent Silicon Nanocrystal Colloid via a High-temperature Aerosol Reaction," *J. Phys. Chem.* 97:1224-30 (1993).

Liu & Kauzlarich, "A New Synthetic Route for the Synthesis of Hydrogen Terminated Silicon Nanoparticles," *Mater. Sci. Engin.* B96:72-5 (2002).

Mayeri et al., "NMR Study of the Synthesis of Alkyl-terminated Silicon Nanoparticles from the Reaction of SiCl$_4$ with the Zintl Salt, NaSi," *Chem. Mater.* 13:765-70 (2001).

Murray et al., "Synthesis and Characterization of Monodisperse Nanocrystals and Close-packed Nanocrystal Assemblies," *Annu. Rev. Mater. Sci.* 30:545-610 (2000).

Murray et al., "Synthesis and Characterization of Nearly Monodisperse CdE (E=S, Se, Te) Semiconductor Nanocrystallites," *J. Am. Chem. Soc.* 115:8706-15 (1993).

Nayfeh et al., "Second Harmonic Generation in Microcrystallite Films of Ultrasmall Si Nanoparticles," *App. Phys. Lett.* 77(25):4086-8 (2000).

Nayfeh et al., "Stimulated Blue Emission in Reconstituted Films of Ultrasmall Silicon Nanoparticles," *App. Phys. Lett.* 78(8):1131-3 (2001).

Ostraat et al., "Synthesis and Characterization of Aerosol Silicon Nanocrystal Nonvolatile Floating-gate Memory Devices," *App. Phys. Lett.* 79(3):433-5 (2001).

Ostraat et al., "Ultraclean Two-stage Aerosol Reactor for Production of Oxide-passivated Silicon Nanoparticles for Novel Memory Devices," *J. Electrochem. Soc.* 148(5):G265-G270 (2001).

Pettigrew et al., "Solution Synthesis of Alkyl- and Alkyl/Alkoxy-capped Silicon Nanoparticles via Oxidation of Mg$_2$Si," *Chem. Mater.* 15:4005-11 (2003).

Seraphin et al., "Influence of Nanostructure Size on the Luminescence Behavior of Silicon Nanoparticle Thin Films," *J. Mater. Res.* 12(12):3386-92 (1997).

Wilson et al., "Quantum Confinement in Size-selected, Surface-oxidized Silicon Nanocrystals," *Science* 262(5137):1242-4 (1993).

Withrow et al., "Effects of Hydrogen in the Annealing Environment on Photoluminiscence from Si Nanoparticles in SiO$^2$," *J. Appl. Phys.* 86(1):396-401 (1999).

Wojtyk et al., "Modification of Porous Silicon Surfaces with Activated Ester Monolayers," *Langmuir* 18:6081-7 (2002).

Zou et al., Abstract, "Surface Functionalization of Si Nanoclusters with Alkoxides and NMR Studies," 225th ACS National Meeting Abstracts of Papers (Mar. 23-27, 2003).

\* cited by examiner

PRODUCTION OF PHOTOLUMINESCENT SILICON NANOPARTICLES HAVING SURFACES THAT ARE ESSENTIALLY FREE OF RESIDUAL OXYGEN

This application claims the benefit of U.S. Provisional Patent Application Ser. No. 60/672,808, filed Apr. 19, 2005, which is hereby incorporated by reference in its entirety.

The subject matter of this application was made with support from the United States Government under NSF Grant Nos. DGE0114330 and DMR0243833. The government may have certain rights.

FIELD OF THE INVENTION

The present invention relates to methods of preparing photoluminescent silicon nanoparticles having uniformly hydrogen-terminated surfaces that are essentially free of residual oxygen. The present invention also relates to a method of producing blue-emitting photoluminescent silicon nanoparticles. The present invention also relates to photoluminescent silicon nanoparticles that are essentially free of residual oxygen, as well as to compositions including these particles.

BACKGROUND OF THE INVENTION

Light emission from silicon has been a topic of intense research interest due to its potential use in displays, general illumination, and the integration of optoelectronics with silicon technology (Lockwood, D. J., Ed., *Light Emission in Silicon From Physics to Devices,* New York:Academic Press (1998)). Most of this research has been carried out on porous silicon (PSi). However, it is now well understood that visible photoluminescence (PL) from PSi arises from silicon nanocrystals within it (Nirmal et al., *Acc. Chem. Res.* 32:407 (1999)). For many applications, well-characterized discrete nanocrystals would be much more useful than PSi. In silicon nanocrystals less than about 5 nm in diameter, quantum confinement widens the band gap, leading to particle size -dependence of the PL wavelength, from blue to the near infrared. Finite size effects also increase the probability of radiative recombination of excitons and decrease the possibility of non-radiative recombination (Nirmal et al., *Acc. Chem. Res.* 32:407 (1999)). Both non-radiative and radiative recombination may occur at the nanocrystal surface as well as within the nanocrystal. In particular, oxygen at the surface may introduce states within the bandgap that lead to loss of emission or red-shifted emission (Wolkin et al., *Appl. Phys. Lett.* 82:197 (1999)).

Several methods have been developed for preparing luminescent silicon nanoparticles outside of porous silicon, including fracturing of porous silicon by ultrasonication (Belomoin et al., App. Phys. Lett. 80:841 (2002), Yamani et al., *J. Appl. Phys.* 83:3929 (1998)), inverse micellar growth (Wilcoxon et al., *Phys. Rev. B.* 60:2704 (1999)), laser ablation (Carlisle et al., *Chem. Phys. Lett.* 326:335 (2000), Carlisle et al., *J. Electron Spectroscopy* 229:114-116 (2001)), thermal decomposition of organosilane precursors in supercritical solvents (English et al., *Nano Letters* 2:681 (2002), Holmes et al., *J. Am. Chem. Soc.* 123:3743 (2001)), solution phase methods (Baldwin et al., *J. Am. Chem. Soc.* 124:1150 (2002), Baldwin et al., *Chem. Commun.* 17:1822 (2002), Bley et al., *J. Am. Chem. Soc.* 118:12461 (1996), Heath, J. R. *Science* 258:1131 (1992)), plasma decomposition of silane (Bapat et al., *J. App. Phys.* 94:1969 (2003), Shen et al., *J. Appl. Phys.* 94:2277 (2003)), and vapor phase thermal decomposition of silane or disilane (Littau et al., *J. Phys. Chem.* 97:1224 (1993), Schuppler et al., *Phys. Rev. Lett.* 72:2648 (1994), Wilson et al., *Science* 262:1242 (1993)). However, two major barriers have prevented the further investigation and application of free silicon nanoparticles: (i) lack of stability of the PL properties and surface state of the particles, and (ii) difficulty in producing macroscopic quantities of high-quality particles as stable colloidal dispersions.

A method for preparing relatively large quantities of brightly luminescent silicon nanoparticles was previously developed, in which non-luminescent, crystalline nanoparticles (~5 nm diameter) are prepared by $CO_2$ laser heating of $SiH_4$-$H_2$-He mixtures, and are then etched with a $HF/HNO_3$/water mixture to reduce their size and passivate their surface (Li et al., *Langmuir* 19:8490 (2003)). By controlling the etching time and conditions, the particle luminescence could be tuned from green to the near-IR. However, the green and yellow emitting particles produced by this method are unstable in air. On time scales of minutes to hours, their emission red shifts and/or decreases in intensity due to surface oxidation. Formation of an organic monolayer by hydrosilylation is an effective means of stabilizing the surface of PSi (Buriak, J. M., *Chem. Rev.* 102:1271 (2002), Waltenburg et al., *J. Chem. Rev.* 95:1589 (1995)). Several groups have reported grafting of 1-alkenes or alkynes onto H-passivated PSi or silicon wafers (Linford et al., *J. Am. Chem. Soc.* 115:12631 (1993), Linford et al., *J. Am. Chem. Soc.* 117:3145 (1995), Boukherroub et al., *J. Am. Chem. Soc.* 121:11513 (1999), Buriak et al., *J. Am. Chem. Soc.* 121:11491 (1999), Buriak et al., *J. Luminescence* 80:29 (1999), Buriak et al., *J. Am. Chem. Soc.* 120:1339 (1998)). This technique has been extended to discrete nanoparticles, to produce clear, stable dispersions of them in polar or nonpolar solvents and to stabilize the PL properties of orange-emitting particles (Li et al., *Nano Letters* 4:1463 (2004), Ruckenstein et al., *Adv. Coll. Inter. Sci.* 113:43 (2005), Li et al., *Langmuir* 20:4720 (2004)).

Si particles ranging from 1 to 5 nm in diameter exhibit PL emission ranging from blue to the near infrared. The small size of these nanocrystals widens the band gap due to quantum confinement effects, relaxes the selection rules that decrease the efficiency of radiative recombination in indirect band gap materials, and reduces the probability of nonradiative recombination at defects. Both non-radiative and radiative recombination may occur at the nanocrystal surface, as well as within the core of the nanoparticle. Therefore, the origin and characteristics of the luminescence are associated with both the crystallite size and with the nature of the crystallite surface. In particular, as Wolkin et al. pointed out, the presence of oxygen at the particle surface can introduce states within the bandgap that lead to red-shifted emission (Wolkin et al., *Phys. Rev. Lett.* 82:197-200 (1999)). An effective means of stabilizing the silicon surface and photoluminescence properties is to graft an organic monolayer to it through hydrosilylation of a hydrogen-terminated surface (Li et al., *Nano Letters* 4:1463-1467 (2004), Li et al., *Langmuir* 20:47204727 (2004), Buriak, J. M., *Chem. Rev.* 102:1271-1308 (2002), Buriak et al., *J. Luminescence* 80:29-35 (1999)) or through organosilane chemistry on a hydroxyl-terminated surface (Li et al., *Langmuir* 20:47204727 (2004), Ruckenstein et al., *Adv. Coll. Inter. Sci.* 113 :43-63 (2005), Li et al., *Langmuir* 20:1963-1971 (2004)). However, this has not generally been possible for blue-emitting silicon nanoparticles (~1 nm in diameter). Preparation of organically-protected silicon nanoparticles with blue emission that remains stable in air has been a persistent challenge that has limited the possibility of using silicon nanoparticles in potential applications such as full-color displays or general illumination where full coverage of the visible spectrum is required. Alkyl-capped silicon nanoparticles prepared in solution have shown UV to blue photoluminescence, but in that case the alkyl groups were readily displaced from the surface by reaction with air (Yang et al., *J. Am. Chem. Soc.* 121:5191-5195 (1999)). More recently, siloxane-coated silicon nanoparticles with blue emission were prepared in solution and shown to be very stable against further reaction or degradation (Zou et al., *Nano Letters* 4:1181-1186 (2004). Silicon nanoparticles with blue emission have also been prepared from porous silicon (Belomoin et al., *Appl. Phys. Lett.* 80:841-843 (2002)).

The present invention is directed to overcoming these and other deficiencies in the art.

SUMMARY OF THE INVENTION

One aspect of the present invention relates to a method for preparing photoluminescent silicon nanoparticles having uniformly hydrogen-terminated surfaces that are essentially free of residual oxygen. This method involves providing a plurality of silicon nanoparticles. The silicon nanoparticles are acid etched with a non-oxidizing acid mixture under conditions effective to produce photoluminescent silicon nanoparticles. The photoluminescent silicon nanoparticles are rinsed with a rinsing mixture containing water and methanol under conditions effective to yield photoluminescent silicon nanoparticles having uniformly hydrogen-terminated surfaces that are essentially free of residual oxygen. Photoluminescent silicon nanoparticles produced by this method are also disclosed.

Another aspect of the present invention relates to a method of preparing blue-emitting photoluminescent silicon nanoparticles. This method involves providing an organically capped photoluminescent silicon nanoparticle that emits yellow photoluminescence and that has a surface that is coated with an organic layer and essentially free of residual oxygen. The organically capped photoluminescent silicon nanoparticle is partially oxidized under conditions effective to yield a blue-emitting photoluminescent silicon nanoparticle. Blue-emitting photoluminescent silicon nanoparticles produced by this method are also disclosed.

Another aspect of the present invention relates to a composition including a photoluminescent silicon nanoparticle having a surface that is uniformly hydrogen-terminated and essentially free of residual oxygen.

Yet another aspect of the present invention relates to a composition including a photoluminescent silicon nanoparticle having a surface that is uniformly coated with an organic layer and essentially free of residual oxygen.

Another aspect of the present invention relates to a composition including a photoluminescent silicon nanoparticle stably dispersed in an organic solvent and having a surface that is uniformly coated with an organic layer and essentially free of residual oxygen.

The present invention is useful in addressing deficiencies in prior methods of preparing photoluminescent silicon nanoparticles. These prior methods produced photoluminescent silicon nanoparticles having only partial Si—H coverage on their surface, with substantial oxygen present as well. These deficiencies in the prior art prevented the production of air-stable green-emitting particles and limited the range of molecules that could be grafted to the surface of the nanoparticles. The present invention overcomes these important limitations by using a modified etching procedure that can generate H-terminated silicon nanoparticles with minimal surface oxygen. In one embodiment, this is done by carefully removing oxygen from reagents, and by excluding oxygen during the hydrosilylation reactions. These modifications to the previously reported procedure result in dramatic improvements in the surface coverage of the grafted organic molecules and, therefore, in the properties and processibility of the resulting particles.

The present invention is also useful in enabling the preparation of organically grafted blue-emitting silicon nanoparticles. In one embodiment of the present invention, the organically grafted blue-emitting silicon nanoparticles can be prepared by slow oxidation of silicon nanoparticles that, prior to oxidation, emitted in the yellow region of the visible spectrum. This oxidation can be driven by UV irradiation or by heating in air. These organically grafted particles resisted oxidation when heated at lower temperatures or when exposed to longer wavelength UV excitation (Hua et al., *Langmuir* 21:6054-6062 (2005), which is hereby incorporated by reference in its entirety).

The methods, compositions, and photoluminescent silicon nanoparticles of the present invention can be used in various applications, including, for example, in displays, general illumination, and integration of optoelectronics with silicon technology (see Lockwood, D. J., Ed., *Light Emission in Silicon From Physics to Devices,* New York:Academic Press (1998), which is hereby incorporated by reference in its entirety). A wide range of applications, from bioimaging techniques to hybrid inorganic/organic light emitters, to photovoltaic devices, can also benefit from the present invention. Some advantages of the photoluminescent silicon nanoparticles of the present invention include (i) low toxicity, (ii) emission across the entire visible spectrum from a single material, (iii) compatibility with silicon microelectronics, and (iv) the capability of silicon to form covalent bonds with carbon and thereby integrate inorganic and organic components at the molecular level. The present invention can also be used to produce macroscopic quantities of high-quality silicon nanoparticles as colloidal dispersions.

BRIEF DESCRIPTION OF THE DRAWINGS

FIG. 3A: red emitting particles. FIG. 3B: yellow emitting particles. FIG. 3C: green emitting particles.

In FIG. 43A, crystalline domains have been outlined for ease of identification. The insets show the corresponding selected area electron diffraction patterns. In both parts, the scale bar is 5 nm.

DETAILED DESCRIPTION OF THE INVENTION

Figure 1:
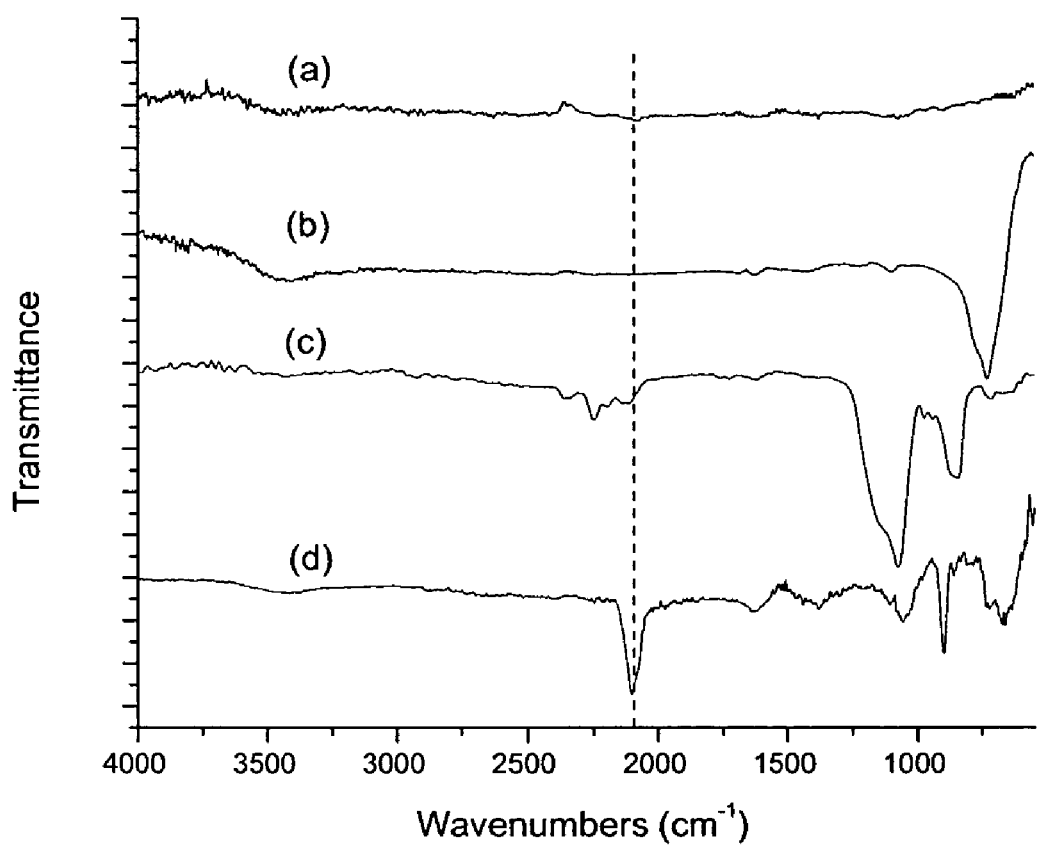
FIG. 1 is a graph showing Fourier transform infrared absorption (FTIR) spectra of silicon particles in KBr pellets. (a) unetched silicon particles, (b) after etching with mixture of HF(48 wt %)/HNO$_3$(69 wt %) (10/1, v/v) then washing with methanol, (c) after etching with a solution containing 3 wt % HF and 30 wt % HNO$_3$ then washing with water, (d) after etching with HF (48 wt %)/HNO$_3$(69 wt %) (10/1, v/v) then washing with methanol/water (3/1, v/v).

The present invention relates to a method for preparing photoluminescent silicon nanoparticles having uniformly hydrogen-terminated surfaces that are essentially free of residual oxygen. In one embodiment, this method involves providing a plurality of silicon nanoparticles. The silicon nanoparticles are acid etched with a non-oxidizing acid mixture under conditions effective to produce photoluminescent silicon nanoparticles. The photoluminescent silicon nanoparticles are rinsed with a rinsing mixture containing water and methanol under conditions effective to yield photoluminescent silicon nanoparticles having uniformly hydrogen-terminated surfaces that are essentially free of residual oxygen. The present invention also relates to the photoluminescent silicon nanoparticles produced by this method.

The photoluminescent silicon nanoparticles produced by the acid etching step of the methods of the present invention can have a diameter of between 0.1-10 nanometers. The photoluminescent silicon nanoparticles produced by the etching step can emit photoluminescence of all ranges, including photoluminescent silicon nanoparticles that emit red photoluminescence, orange photoluminescence, yellow photoluminescence, green photoluminescence, and blue photoluminescence. In one embodiment, the photoluminescent silicon nanoparticles produced by the acid etching step have a diameter of between about 0.1-3 nanometers. In another embodiment, the photoluminescent silicon nanoparticles produced by the acid etching step have a diameter of between about 3-4 nanometers. In yet another embodiment, the photoluminescent silicon nanoparticles produced by the acid etching step have a diameter of between about 4-5 nanometers.

Suitable non-oxidizing acid mixtures that can be used in the methods of the present invention can include any acid mixture that is useful in etching silicon nanoparticles to yield photoluminescent silicon nanoparticles. In one embodiment, the suitable non-oxidizing mixture contains hydrofluoric acid (HF) and nitric acid ($HNO_3$). Suitable concentrations of the $HF/HNO_3$ acid mixture for use as a non-oxidizing mixture of the present invention can include, without limitation, a mixture of about 35 to 48 weight percent hydrofluoric acid and about 2 to 15 weight percent nitric acid. In a particular embodiment, the non-oxidizing acid mixture can include about 80 to 95 volume percent of a concentrated hydrofluoric acid solution and about 5 to 20 volume percent of a nitric acid solution. Suitable concentrated hydrofluoric acid solutions can include about 40 to 55 weight percent of hydrofluoric acid. Suitable concentrated nitric acid solution can include about 60 to 75 weight percent of nitric acid. In another embodiment, the non-oxidizing acid mixture can include a hydrofluoric acid/nitric acid solution having about a 10:1 ratio by volume of concentrated hydrofluoric acid solution to concentrated nitric acid solution. In this particular embodiment, a suitable concentrated hydrofluoric acid solution can include about 40 to 55 weight percent of hydrofluoric acid and a suitable concentrated nitric acid solution can include about 60 to 75 weight percent of nitric acid. More particularly, the suitable concentrated hydrofluoric acid solution can include about 46 to 52 weight percent of hydrofluoric acid and the suitable concentrated nitric acid solution can include about 66 to 72 weight percent of nitric acid.

As used herein, suitable rinsing mixtures for use in the methods of the present invention are those that include a mixture of water and methanol, with water being present in a greater volume percent than methanol. In one embodiment, the rinsing mixture includes about 10 to 40 volume percent methanol. In another embodiment, the rinsing mixture includes about 20 to 30 volume percent methanol. In still another embodiment, the rinsing mixture includes about 25 volume percent methanol.

The above-described method for preparing photoluminescent silicon nanoparticles having surfaces that are essentially free of residual oxygen can also include additional steps. In one such modification, the method can include a step of grafting an organic molecule to the surface of the photoluminescent silicon nanoparticles after the rinsing step. This grafting step can be performed using procedures for grafting organic molecules onto hydrogen-terminated surfaces that are well known by those of ordinary skill in the art. Suitable examples for this grafting step can include, without limitation, grafting that is carried out by photoinitiated hydrosilylation.

The grafting step can be used to graft various organic molecules to the surface of the photoluminescent silicon nanoparticles. Suitable examples of organic molecules that can be used for grafting include, for example, alcohols, alkenes, alkynes, thiols, ethers, thioethers, phosphines, amines, amides, carboxylates, sulfonates, and quaternary ammonium compounds. In one particular embodiment, the organic molecule can contain a terminal double bond. Suitable organic molecules containing a terminal double bond can include, without limitation, 1-pentene, 1-hexene, 1-octene, 1-decene, 1-dodecene, 1-octadecene, styrene, vinyl acetate, ethyl undecylenate, 1-hexen -5-ol, 10-undecen-1-ol, and derivatives thereof. An advantage of the covalently bound monolayers was the resulting protection of the nanoparticles from chemical attack and partial protection from PL quenching by triethyl amine. The organic monolayer also allows formation of stable nanoparticle dispersions in a variety of solvents. Chromatographic separation of particles by size is possible using these stable dispersions. Organic molecules including styrene, vinyl acetate, and ethyl undecylenate provide functional groups useful for carrying out further derivatization. As an example, vinyl acetate and ethyl undecylenate grafted silicon can be hydrolyzed to generate alcohol and carboxylic acid functional groups. As another example, reaction with 1-hexen-5-ol and 10-undecen-1-ol can provide an alcohol-functionalized surface without further reaction steps. These functional groups can allow the further derivatization of the particles for use as reactive probes in bioimaging, in sensors, or for assembling nanoscale hybrid inorganic/organic semiconductor devices.

The method described above can be used for efficient (high-coverage) grafting of organic molecules onto photoluminescent silicon nanoparticles. High coverage grafting was enabled by use of a modified etching process that produces a hydrogen-terminated surface on the nanoparticles with very little residual oxygen and by carefully excluding oxygen during the grafting process. Prior to the method of the present invention, it had not been feasible to produce such a clean H-terminated surface on free silicon nanoparticles or, subsequently, to produce grafted particles without significant surface oxygen. The method of the present invention therefore allows for the (i) preparation of air-stable green-emitting silicon nanoparticles; (ii) preparation of stable dispersions of grafted silicon nanoparticles in a variety of organic solvents from which particles can readily be precipitated by addition of nonsolvent, dried, and redispersed; (iii) separation of these nanoparticles by size (and therefore emission color) using conventional chromatographic methods; (iv) protection of the particles from chemical attack and photoluminescence quenching; and (v) providing of finctional groups on the particle surface for further derivatization.

The present invention also relates to a method of preparing a blue-emitting photoluminescent silicon nanoparticle. In one embodiment, this method involves providing an organically capped photoluminescent silicon nanoparticle that emits yellow photoluminescence and that has a surface that is coated with an organic layer and essentially free of residual oxygen. The organically capped photoluminescent silicon nanoparticle is partially oxidized under conditions effective to yield a blue-emitting photoluminescent silicon nanoparticle. The present invention also relates to the blue-emitting photoluminescent silicon nanoparticles produced by this method.

The organically capped photoluminescent silicon nanoparticle that emits yellow photoluminescence and that has a surface that is coated with an organic layer and essentially free of residual oxygen can be provided using the methods previously described. Various methods well known by those of ordinary skill in the art can be used to partially oxidize this organically capped photoluminescent silicon nanoparticle that emits yellow photoluminescence and that has a surface that is coated with an organic layer and essentially free of residual oxygen. In one embodiment, the partial oxidizing step includes heat treating the organically capped photoluminescent silicon nanoparticle at a temperature of between about 140-160 degrees centigrade under conditions effective to yield the blue-emitting photoluminescent silicon nanoparticle. In another embodiment, the partial oxidizing step includes treating the organically capped photoluminescent silicon nanoparticle with ultraviolet radiation under conditions effective to yield the blue-emitting photoluminescent silicon nanoparticle. In a particular embodiment, the ultraviolet radiation can be at about 254 nm.

The organic layer that is coated on the surface of the yellow-emitting organically capped photoluminescent silicon nanoparticle can be in the form of an organic monolayer or an organic multilayer. The organic layer can include any of the above-mentioned organic molecules or combinations thereof. In a particular embodiment, the organic molecule of the organic layer can include, without limitation, 1-pentene, 1-hexene, 1-octene, 1-decene, 1-dodecene, 1-octadecene, styrene, vinyl acetate, ethyl undecylenate, 1-hexen-5-ol, 10-undecen-1-ol, and/or derivatives thereof.

The above-described method is a facile method that can be used for preparing stable blue-emitting silicon nanoparticles that are dispersible in common organic solvents. Oxidation of yellow-emitting silicon nanoparticles having an organic monolayer grafted to their surface, using, for example, either UV irradiation in solution or heating of dry particles in air, can convert the particles from yellow-emitting to blue-emitting. The organic monolayer grafted to the particle surface is not affected by this oxidation process. The presence of the organic monolayer allows these nanoparticles to form stable dispersions in a variety of common organic solvents, and provides for the possibility of further chemical functionalization of the particles. Combined with surface grafted silicon nanoparticles with green through near infrared emission, this enables the efficient and scalable preparation of stable colloidal dispersions of organically grafted silicon nanoparticles with emission spanning the entire visible spectrum.

The present invention further relates to a composition that includes a photoluminescent silicon nanoparticle having a surface that is uniformly hydrogen-terminated and essentially free of residual oxygen. Suitable methods of making this composition can include, without limitation, the methods of the present invention or variations of the method. The photoluminescent silicon nanoparticles of this composition can have a diameter of between about 0.1-10 nanometers, and can emit photoluminescence of all ranges, including red photoluminescence, orange photoluminescence, yellow photoluminescence, green photoluminescence, and blue photoluminescence. In one embodiment, the photoluminescent silicon nanoparticles of this composition can have a diameter of between about 0.1-3 nanometers. In another embodiment, the photoluminescent silicon nanoparticles of this composition can have a diameter of between about 3-4 nanometers. In yet another embodiment, the photoluminescent silicon nanoparticles of this composition can have a diameter of between about 4-5 nanometers.

The present invention also relates to a composition that includes a photoluminescent silicon nanoparticle having a surface that is uniformly coated with an organic layer and is essentially free of residual oxygen. Suitable methods of making this composition can include, without limitation, the methods of the present invention or variations of the method. The photoluminescent silicon nanoparticles of this composition can have a diameter of between about 0.1-10 nanometers, and can emit photoluminescence of all ranges, including red photoluminescence, orange photoluminescence, yellow photoluminescence, green photoluminescence, and blue photoluminescence. In one embodiment, the photoluminescent silicon nanoparticles of this composition can have a diameter of between about 0.1-3 nanometers. In another embodiment, the photoluminescent silicon nanoparticles of this composition can have a diameter of between about 3-4 nanometers. In yet another embodiment, the photoluminescent silicon nanoparticles of this composition can have a diameter of between about 4-5 nanometers. The organic layer that is coated on the surface of the organically capped photoluminescent silicon nanoparticles can be in the form of an organic monolayer or an organic multilayer. The organic layer can include any of the above-mentioned organic molecules or combinations thereof. In a particular embodiment, the organic molecule of the organic layer can include, without limitation, 1-pentene, 1-hexene, 1-octene, 1-decene, 1-dodecene, 1-octadecene, styrene, vinyl acetate, ethyl undecylenate, 1-hexen-5-ol, undecenol, and/or derivatives thereof. In another embodiment, the composition can also include a functional group attached to at least one organic molecule of the organic layer. Suitable functional groups are any groups known in the chemical arts as suitable for attachment to an organic molecule (as described herein). In one embodiment, such suitable functional groups can include, without limitation, alcohol groups and carboxylic groups.

The present invention further relates to a composition that includes a photoluminescent silicon nanoparticle stably dispersed in an organic solvent and having a surface that is uniformly coated with an organic layer and essentially free of residual oxygen. Suitable methods of making the photoluminescent silicon nanoparticle of this composition can include, without limitation, the corresponding methods of the present invention or variations of these methods. The photoluminescent silicon nanoparticle can be stably dispersed in various organic solvents, including, without limitation, solvents such as tetrahydrofuran, chloroform, dichloromethane, toluene, dimethylformamide, and dimethyl sulfoxide. The photoluminescent silicon nanoparticles of this composition can have a diameter of between about 0.1-10 nanometers, and can emit photoluminescence of all ranges, including red photoluminescence, orange photoluminescence, yellow photoluminescence, green photoluminescence, and blue photoluminescence. In one embodiment, the photoluminescent silicon nanoparticles of this composition can have a diameter of between about 0.1-3 nanometers. In another embodiment, the photoluminescent silicon nanoparticles of this composition can have a diameter of between about 3-4 nanometers. In yet another embodiment, the photoluminescent silicon nanoparticles of this composition can have a diameter of between about 4-5 nanometers. The organic layer that is coated on the surface of the organically capped photoluminescent silicon nanoparticles can be in the form of an organic monolayer or an organic multilayer. The organic layer can include any of the above-mentioned organic molecules or combinations thereof. In a particular embodiment, the organic molecule of the organic layer can include, without limitation, 1-pentene, 1-hexene, 1-octene, 1-decene, 1-dodecene, 1-octadecene, styrene, vinyl acetate, ethyl undecylenate, 1-hexen-5-ol, undecenol, and/or derivatives thereof. In another embodiment, the composition can also include a functional group attached to at least one organic molecule of the organic layer. Suitable functional groups are any groups known in the chemical arts as suitable for attachment to an organic molecule (as described herein). In one embodiment, such suitable functional groups can include, without limitation, alcohol groups and carboxylic groups.

EXAMPLES

The following examples are provided to illustrate embodiments of the present invention but are by no means intended to limit its scope.

Example 1

Efficient Surface Grafting of Luminescent Silicon Quantum Dots by Photoinitiated Hydrosilylation Examples 1-9 relate to a method for efficient (high-coverage) grafting of organic molecules onto photoluminescent silicon nanoparticles (see Hua et al., *Langmuir* 21(13):6054-6062 (2005), which is hereby incorporated by reference in its entirety). High coverage grafting was enabled by use of a modified etching process that produces a hydrogen-terminated surface on the nanoparticles with very little residual oxygen and by carefully excluding oxygen during the grafting process. It had not previously been possible to produce such a clean H-terminated surface on free silicon nanoparticles or, subsequently, to produce grafted particles without significant surface oxygen. This allowed for the (1) preparation of air-stable green-emitting silicon nanoparticles; (2) preparation of stable dispersions of grafted silicon nanoparticles in a variety of organic solvents from which particles can readily be precipitated by addition of nonsolvent, dried, and redispersed; (3) separation of these nanoparticles by size (and therefore emission color) using conventional chromatographic methods; (4) protection of the particles from chemical attack and photoluminescence quenching; and (5) provision of functional groups on the particle surface for further derivatization. It was shown, by using $^1$H NMR, that the photoinitiated hydrosilylation reaction does not specifically graft the terminal carbon atom to the surface, but that attachment at both the first and second atom occurs.

As a summary of Examples 2-9, an improved etching procedure has been developed to generate luminescent silicon nanocrystals with very high Si—H coverage and low oxygen content on their surface. This enables efficient (high coverage) grafting of various molecules containing a terminal double bond onto the particle surface via UV-initiated hydrosilylation reactions. The resulting covalently bound monolayers were able to protect the particles from chemical attack and partially protect them from PL quenching by triethyl amine. The organic monolayer also allowed formation of stable nanoparticle dispersions in a variety of solvents. Chromatographic separation of particles by size was possible using these stable dispersions. Organic molecules including styrene, vinyl acetate and ethyl undecylenate provide functional groups useful for carrying out further derivatization. Vinyl acetate and ethyl undecylenate grafted silicon can be hydrolyzed to generate alcohol and carboxylic acid functional groups. Reaction with 1-hexen-5-ol and 10-undecen-1-ol directly provided an alcohol -functionalized surface. These functional groups can allow the further derivatization of the particles for use as reactive probes in bioimaging, in sensors, or for assembling nanoscale hybrid inorganic/organic semiconductor devices.

Example 2

Materials Used for the Experimental Procedures Described in Examples 3 to 9

Silane ($SiH_4$), (electronic grade, Scott Gases), 1-pentene (Acros, 95 wt %), 1-hexene (Acros, 97 wt %), 1-octene (Acros, 99+ wt %), 1-dodecene (Acros, 94 wt %), 1-octadecene (Acros, tech, 90 wt %), 5-hexen-1-ol (Aldrich, 99 wt %), 10-undecen-1-ol (Aldrich, 99 wt %), ethyl undecylenate (Aldrich, 97 wt %), styrene (Aldrich, 99 wt %, 15 ppm tert-4-tert-butylcatechol), vinyl acetate (Alfa Aesar, 99 wt %, stabilized with hydroquinone), triethylamine (Aldrich, 99.5 wt %), trifluoroacetic acid (Aldrich, 99 wt %), were used as received or were degassed by a series of freeze-thaw cycles as described herein. Silicon nanoparticles were prepared by silane ($SiH_4$) dissociation through heating with a $CO_2$ laser beam (Coherent, Model 42, 60 Watts) in an aerosol reactor, as described in detail by Li et al., *Langmuir* 19:8490 (2003), which is hereby incorporated by reference in its entirety. The resulting crystalline particles, with sizes ranging from 5 to 10 nm, were collected on cellulose nitrate membrane filters. They did not exhibit photoluminescence.

Example 3

Etching Procedure

The particles were etched with a mixture of HF (48 wt %) and $HNO_3$ (69 wt %) (10/1, v/v). 20 mg of silicon nanoparticles was dispersed via sonication into 2 to 6 ml of methanol. 11 ml of acid mixture was added to the resulting dispersion. The particle sizes decreased and the particle surfaces were passivated during this etching process. As a result, the particles exhibited bright, visible photoluminescence. The color of the photoluminescence changed from red to yellow to green as the etching proceeded. The etching rate decreased with increasing amount of methanol used to disperse the particles initially. When the desired emission color was reached, the etching was slowed by adding about 10 ml of methanol or a methanol/water mixture (1/3, v/v). The particles were collected on a polyvinylidene fluoride (PVDF) membrane filter (pore size 100 nm) and washed with a large amount of the methanol/water mixture to remove any adsorbed acid mixture. Finally, the particles were rinsed with pure methanol.

Example 4

Photoinitiated Hydrosilylation

The freshly etched particles (6 mg of red emitting particles, 3 mg of yellow emitting particles, or 1.5 mg of green emitting particles) were transferred into a 25 ml Aldrich Schlenk-type reactor containing a magnetic stirrer and 2 ml of the compound that was to be attached to the particles. Sonication was used to disperse the particles, but a stable colloidal dispersion was not formed and the reactor contents appeared cloudy in all cases. The reactor was attached to a high-vacuum line and the contents were degassed using at least three freeze-thaw cycles. A Rayonet Photochemical Reactor (Southern New England Ultraviolet Co.) equipped with 10 RPR-2537 Å UV tubes was used to initiate the hydrosilylation reaction. The reaction time required varied substantially depending on the compound being attached to the particles and the particle size, as discussed further below. After reaction, a clear dispersion was obtained. It was drawn through a PTFE syringe filter (pore size 0.45 μm). For the relatively volatile compounds (1-pentene, 1-hexene, 1-octene, styrene, or vinyl acetate), the excess monomer was removed under vacuum on a rotary evaporator at room temperature. The excess of 1-dodecene or 5-hexen-1-ol was removed under vacuum at 60° C., and of 1-octadecene, 10-undecen-1-ol or ethyl undecylenate in a vacuum oven at 90° C. Styrene-grafted and vinyl acetate-grafted particles were further purified by passing the dispersion through an inhibitor remover (Aldrich, part numbers 30632-0 and 30631-2, respectively to remove tert-butyl catechol and hydroquinone, respectively) using THF as the solvent.

Example 5

Size Separation Using Column Chromatography

The ethyl undecylenate-grafted silicon particles were dispersed in THF (20 mg/ml) and introduced into a silica gel column (Aldrich, 200-400 mesh). Size separation was carried out with a 2 to 1 (v/v) mixture of cyclohexane and THF as the mobile phase. The fractions exhibiting emission of different colors were collected and the solvents were removed using a rotary evaporator.

Example 6

Characterization

Fourier transform infrared (FTIR) spectra for etched silicon and grafted particles were examined using a Mattson Galaxy Series 5000 FTIR spectrometer. IR spectra of the etched Si nanoparticle powders were obtained in transmission after mixing the particles with KBr and pressing the mixture into a pellet. The spectra of the grafted silicon particles were measured in the horizontal attenuated reflectance (ATR) mode by casting a drop (chloroform solution) on the internal reflection element card. For studying the stability of the organic monolayer upon exposure to heat, UV illumination, and basic conditions by FTIR, the particles were first deposited on the internal reflection element card and then spectra were measured before and after periods of exposure to heat, light, or basic solutions. Proton NMR and UV absorption were carried out on a 400 MHz INOVA-400 and a Thermo Spectronic Genesys-6, respectively.

Transmission electron micrographs (TEM) of the etched silicon and grafted silicon particles were obtained using a JEOL JEM 2010 microscope at an acceleration voltage of 200 kV in the bright field image mode. Etched silicon powders were prepared for imaging by dispersing them in methanol and evaporating multiple drops of this dispersion onto an ultrathin carbon coated copper grid. Similarly, samples of the grafted silicon particles were dissolved in toluene or cyclohexane overnight and then dropped onto an ultrathin carbon coated grid.

The powder XRD spectra of the etched silicon particles were recorded on a SIEMENS, D500, X-ray diffractometer, operated at 30 MA and 40 KVP MAX. The grafted silicon particles were first dissolved in chloroform and placed on a glass plate. After evaporating the solvent, a film was formed on the plate, and this supported film was used for the measurement.

Photoluminescence (PL) spectra were recorded using a SLM model 8100 spectrofluorimeter with a 385 or 425 nm emission cutoff filter. The excitation wavelength was set at 310 nm and the emission scanned from 400 to 900 nm. Solution samples of grafted silicon particles were prepared at a concentration of about 0.01 g/l, filtered through a syringe filter (PTFE, pore size 450 nm), then introduced into a quartz cuvette. Solid film samples were prepared by dropping the sample solution onto a quartz plate followed by evaporation of the solvent. PL quenching experiments were performed by adding 50 μL triethyl amine to 3 mL aliquots of each dispersion. After mixing three minutes to allow the system to reach equilibrium, the PL spectrum was recorded. Following this, 200 μL of trifluoroacetic acid (TFA) was added, and the PL was again determined after mixing.

The differential scanning calorimetery (DSC, Perkin Elmer, DSC-7) of the grafted silicon particles was carried out using a heating rate of 10° C./min from −50 to 200° C. The thermogravimetric analysis (TGA) of the grafted particles was performed using a Du Pont Thermal Analyst 2000 module from 20 to 900° C. at a heating rate of 15 ° C./min.

Example 7

Improved Particle Etching Procedure

Figure 2:
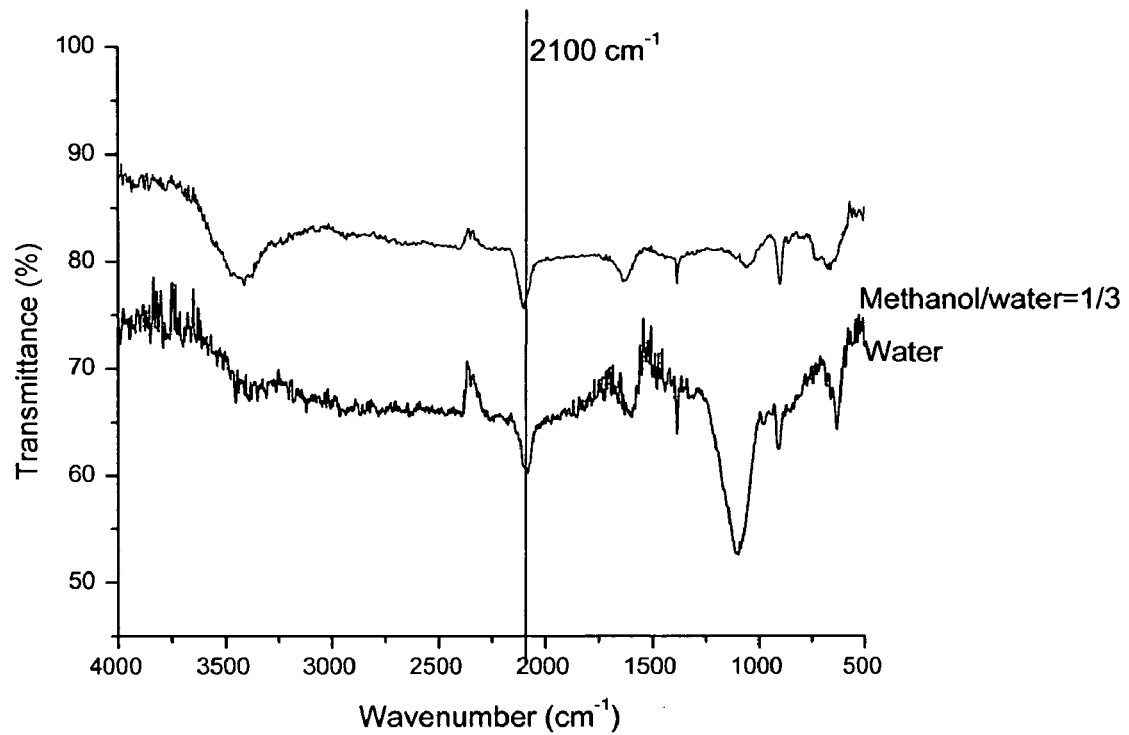
FIG. 2 is a graph showing FTIR spectra of samples etched with HF/HNO$_3$ (10/1) and washed with water or methanol/water mixture (1/3). Spectra were measured in a pressed KBr pellet.

The first advance described herein is an improved etching procedure that produces silicon nanoparticles with bright photoluminescence ranging from red to green, with a remarkably high density of hydrogen and low density of oxygen on their surface. Particles produced by laser heating of silane were first etched with a mixture of concentrated HF (48 wt %) and $HNO_3$ (69 wt %) (10/1, v/v). The FTIR spectrum from particles washed with pure methanol after etching is shown in FIG. 1 (see line (b)). This spectrum exhibits a single peak at 760 $cm^{-1}$, which we tentatively assign to Si—$F_x$ stretching. While it is well established that HF etching of silicon wafers results in H-termination (Higashi et al., *Appl. Phys. Lett.* 56:656 (1990), which is hereby incorporated by reference in its entirety), it is also clear that the etching chemistry for these nanoparticles differs significantly from that of bulk silicon. For example, the etching rate is orders of magnitude slower for the same etchant concentrations (less than 1 nm per min for the nanoparticles vs. microns per minute for a silicon wafer). The IR spectrum of $SiF_x$ on a surface is not well established, but for $(CH_3)_3SiSiF_3$ and $F_3SiSiF_3$, the $SiF_3$ symmetric stretch is at 815 $cm^{-1}$ and 824 $cm^{-1}$, respectively (Xue et al., *J. Mol. Struct. (Theochem)* 469:151 (1999) and Zink et al., *Spectrochimica Acta, part A* 55:333 (1999), which are hereby incorporated by reference in their entirety). In going from these small molecules to a surface (of effectively infinite mass) a shift of the absorbtion to lower frequency is expected. Thus fluorine-termination, though unexpected, seems the most likely interpretation of the spectrum in FIG. 1 (see line (b)). In any case, the particle surface after etching and washing with methanol was highly reactive toward water. Subsequent treatment with a 3:1 (v/v) water/methanol mixture resulted in a hydrogen-passivated surface, as demonstrated by the FTIR spectrum in FIG. 1 (see line (d)), where the strong absorption at 2105 $cm^{-1}$ is characteristic of Si—$H_x$ stretching. The very weak absorption at 1087 $cm^{-1}$, which can be assigned to Si—O stretching, demonstrates that very little oxygen is present. This contrasts sharply with previous work in which the particles were etched under oxidizing conditions, using a HF to $HNO_3$ ratio that was lower than that used here by a factor of about 70 (Li et al., *Langmuir* 19:8490 (2003) and Li et al., *Langmuir* 20:4720 (2004), which are hereby incorporated by reference in their entirety). Under those conditions of relatively high $HNO_3$ and low HF concentration, a substantial amount of oxygen was always present on the particle surface after etching. A typical FTIR spectrum of particles etched under those conditions is included in FIG. 1 (see line (c)) for comparison. Even further treatment with various concentrations of HF alone did not lead to complete removal of oxygen from the surface (Li et al., *Langmuir* 20:4720 (2004), which is hereby incorporated by reference in its entirety) after etching with high $HNO_3$ and low HF concentrations. Both the HF to $HNO_3$ ratio used in the etching and the 3:1 (v/v) water to methanol ratio used to treat the particles after etching were essential to minimizing oxygen incorporation on the particle surface. Significant deviations in either direction from the 3:1 (v/v) ratio of water to methanol, substitution of ethanol for methanol, and other variations in the procedure all led to significant oxygen incorporation on the particle surface. FIG. 2 shows the FTIR spectrum from the largely oxygen-terminated surface formed when the particles were washed with pure water after etching in comparison to that obtained when the 3:1 (v/v) water/methanol mixture was used.

Figure 3:
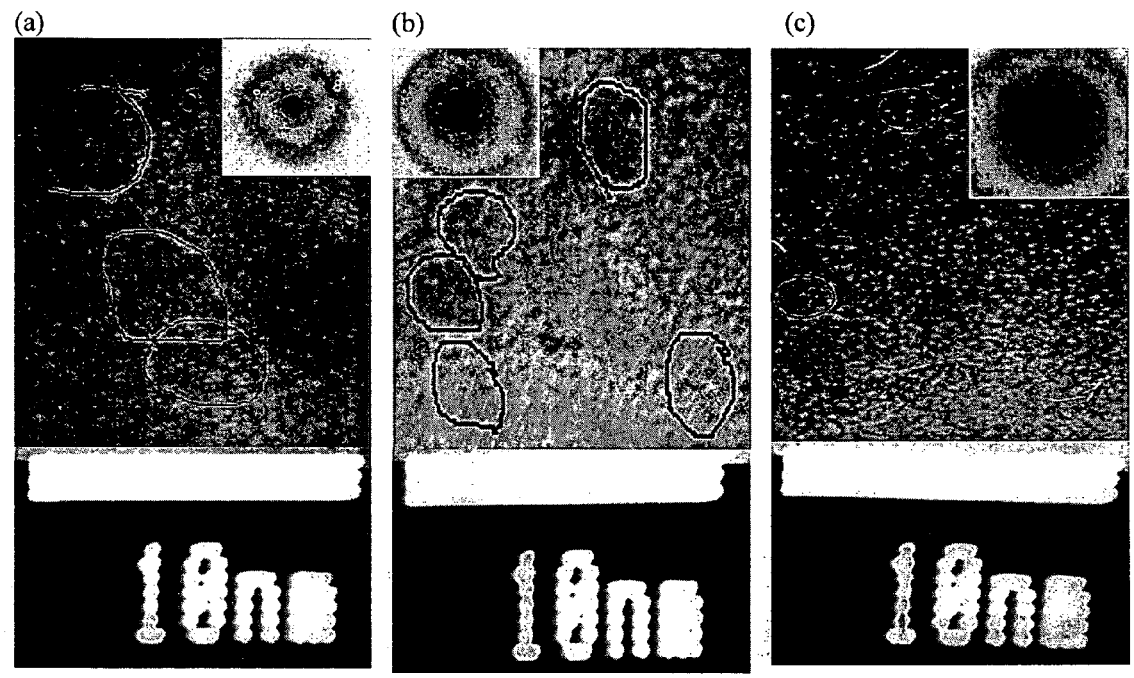
FIGS. 3A-C show high-resolution transmission electron microscope (HRTEM) images and selected area electron diffraction patterns for etched silicon particles.
Figure 4:
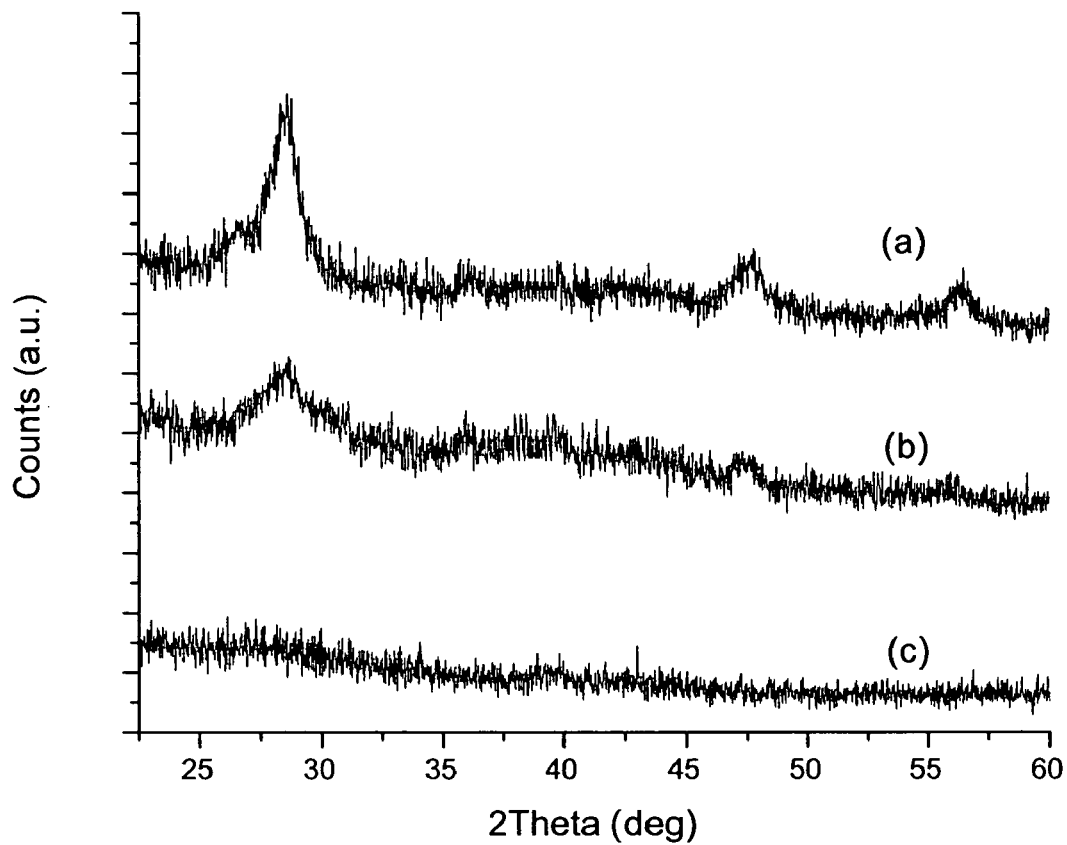
FIG. 4 is a graph showing powder x-ray diffraction (XRD) spectra of etched silicon particles. (a) red-emitting particles, (b) yellow emitting particles, (c) green emitting particles.

With the improved procedure using high HF concentrations, luminescent silicon particles displaying green to red emission were readily prepared by varying the ratio of etchant solution to unetched particles and the etching time. The yield of etched particles (fraction of the particle mass before etching that remained after etching) was significantly higher (typically>50% for red-emitting particles) than that obtained using the previous method. High-resolution TEM images showed small crystalline domains in red-emitting (~5 nm domains), yellow-emitting (~3 nm domains), and green-emitting (<3 nm domains) samples (see FIG. 3), but it was not possible to obtain quantitative size distributions from the images. Powder XRD spectra for the yellow and red-emitting particles showed the three characteristic diffraction peaks for silicon at 28.4, 47.5 and 56.3°, but these peaks were not resolvable for the green-emitting particles (see FIG. 4).

Example 8

Photooxidation of Etched Particles

Figure 5:
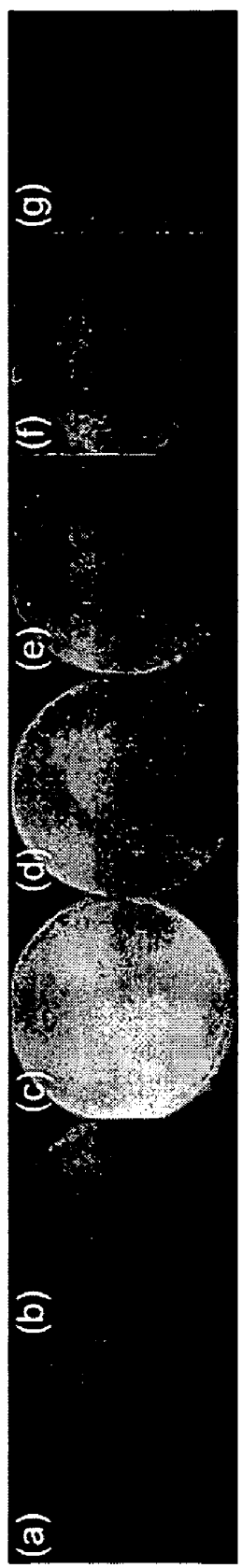
FIGS. 5A-G show photooxidation of particles under 355 nm UV excitation in air. Red-emitting particles (a) initially (FIG. 5A) and (b) after 10 min. illumination (FIG. 5B). Yellow emitting particles (c) initially (FIG. 5C) and (d) after 3 minutes illumination (FIG. 5D). Green-emitting particles (e) initially (FIG. 5E), (f) after 20 s illumination (FIG. 5F), and (g) after 40 s illumination (FIG. 5G).

Green-emitting particles were rapidly photooxidized in air when illuminated with 355 nm light. Under ordinary room illumination in air, they lost their PL on time scales of minutes to hours. However, in a nitrogen-filled glovebox under the same conditions they were stable indefinitely. The photoluminescence of yellow-emitting particles was also degraded by photooxidation, but much more slowly than that of green-emitting particles. Photoluminescence from red-emitting particles was not rapidly degraded by photooxidation. This is illustrated in FIG. 5.

Example 9

Grafting of Organic Molecules onto Silicon Nanoparticles

Figure 6:
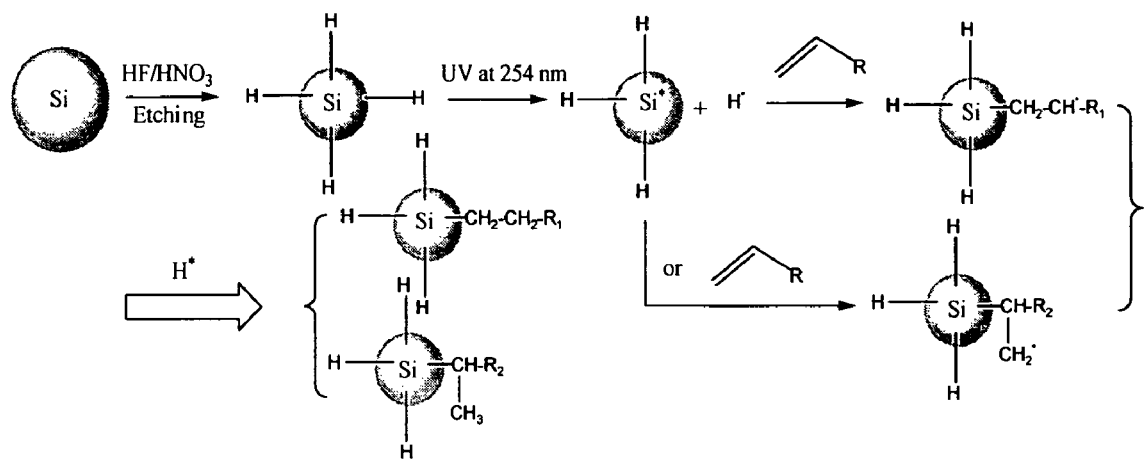
FIG. 6 is a schematic showing attachment of molecules with a terminal double bond to H-terminated silicon particles via hydrosilylation.
Figure 7:
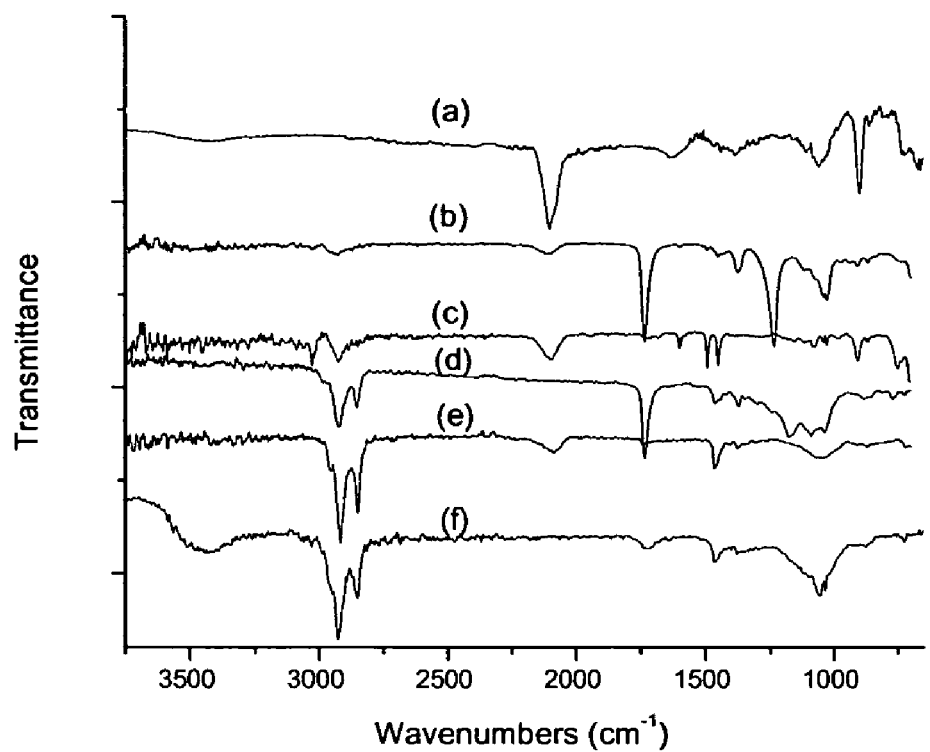
FIG. 7 is a graph showing FTIR spectra from nanoparticles with (a) hydrogen, (b) vinyl acetate, (c) styrene, (d) ethyl undecylenate, (e) 1-dodecene, and (f) 11-undec-1-enol on their surface. Spectrum (a) was taken in transmission in a KBr pellet. All others were taken in attenuated total reflection (ATR) mode.
Figure 8:
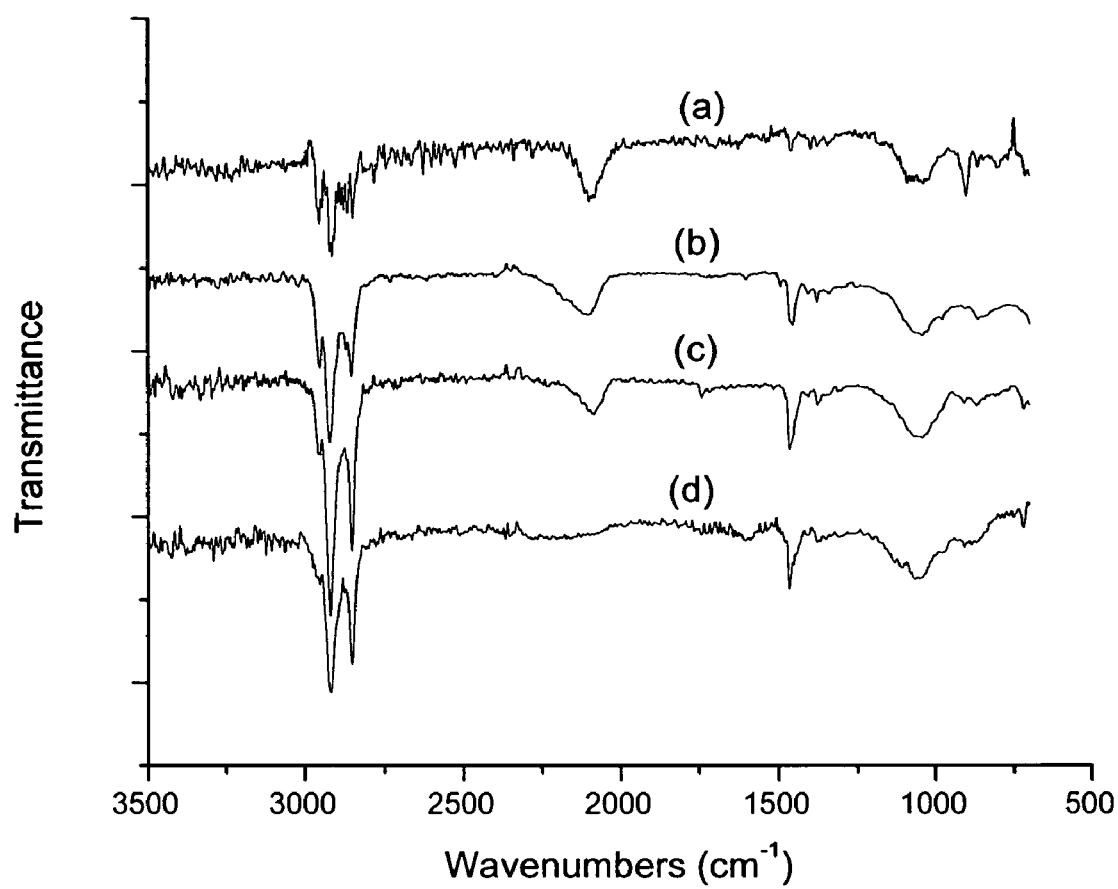
FIG. 8 is a graph showing ATR FTIR spectra of silicon particles with various alkenes grafted on their surface. (a) 1-pentene, (b) 1-hexene, (c) 1-octene, (d) 1-octadecene.

Photoinitiated hydrosilylation was carried out in a UV reactor using several compounds that each contained a terminal double bond, as illustrated in FIG. 6. Removal of dissolved oxygen from the reagents, by several freeze-pump-thaw cycles, was essential. If the reagents were used as-received or if they were only bubbled with nitrogen to displace some of the dissolved oxygen from them, then photooxidation competed with the hydrosilylation reaction and significant oxidation of the particle surface occurred. FIG. 7 shows attenuated total reflection (ATR) FTIR spectra for orange-emitting silicon nanoparticles before and after photoinitiated hydrosilylation with various double-bond-terminated compounds (vinyl acetate, styrene, 1-dodecene, ethyl undecylenate and 10-undecen-1-ol). The clear presence of characteristic vibrations for each organic molecule in the particle samples after reaction, along with the reduction in Si—H intensity and the absence of peaks characteristic of the terminal double bond, indicate that the organic molecules were covalently attached to the silicon surface. Similar FTIR spectra for 1-pentene, 1-hexene, 1-octene, and 1-octadecene are included in FIG. 8.

Figure 9:
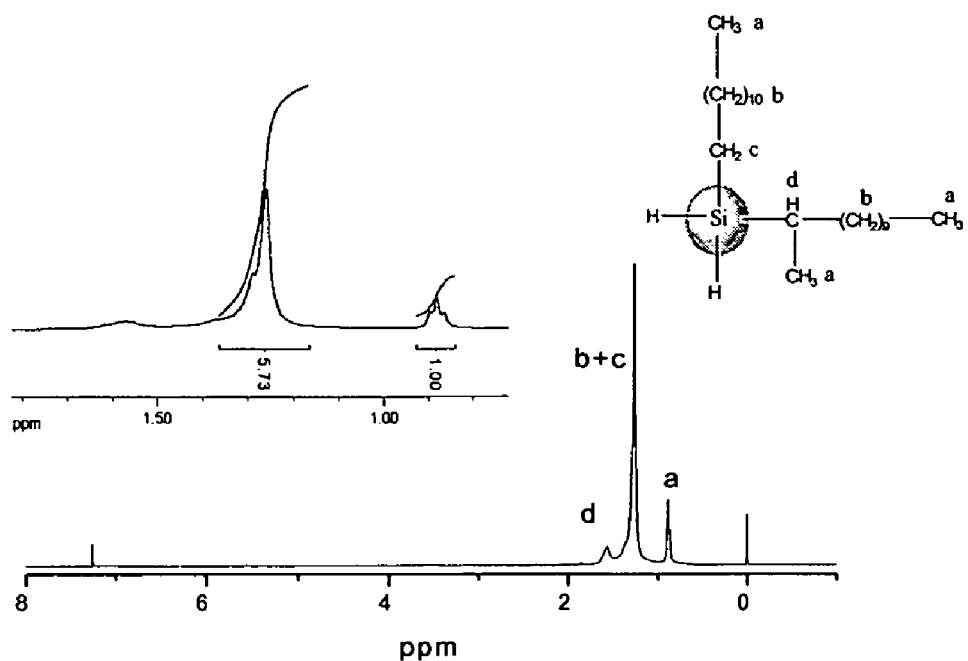
FIG. 9 is a graph showing $^1$H nuclear magnetic resonance (NMR) spectrum of 1-dodecene-grafted silicon particles in deuterated chloroform.
Figure 10:
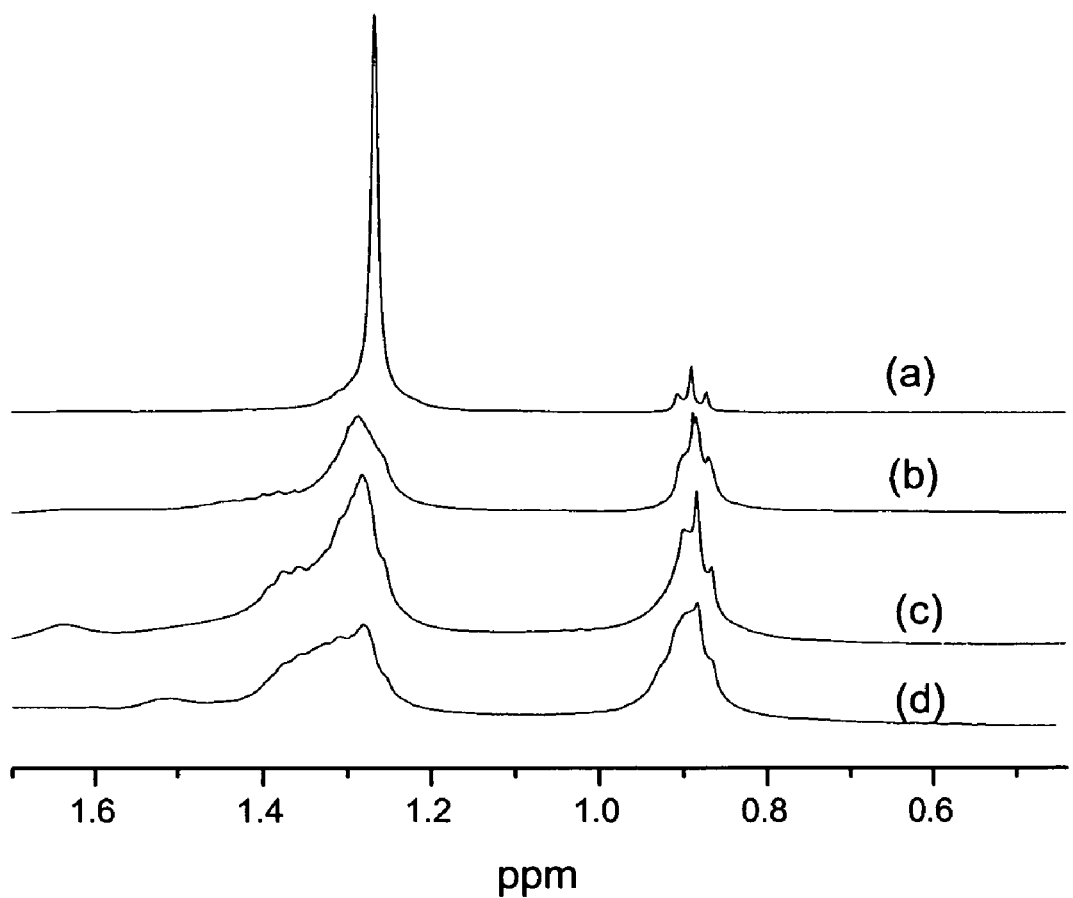
FIG. 10 is a graph showing $^1$H NMR spectra of silicon particles with various alkenes grafted to their surface. (a) 1-pentene, (b) 1-hexene, (c) 1-octene, (d) 1-octadecene. The ratios of the areas of the 1.29 ppm peak to the 0.88 ppm peak are used to estimate the reaction selectivity toward the terminal carbon of the alkene as listed in Table 3.
Figure 11:
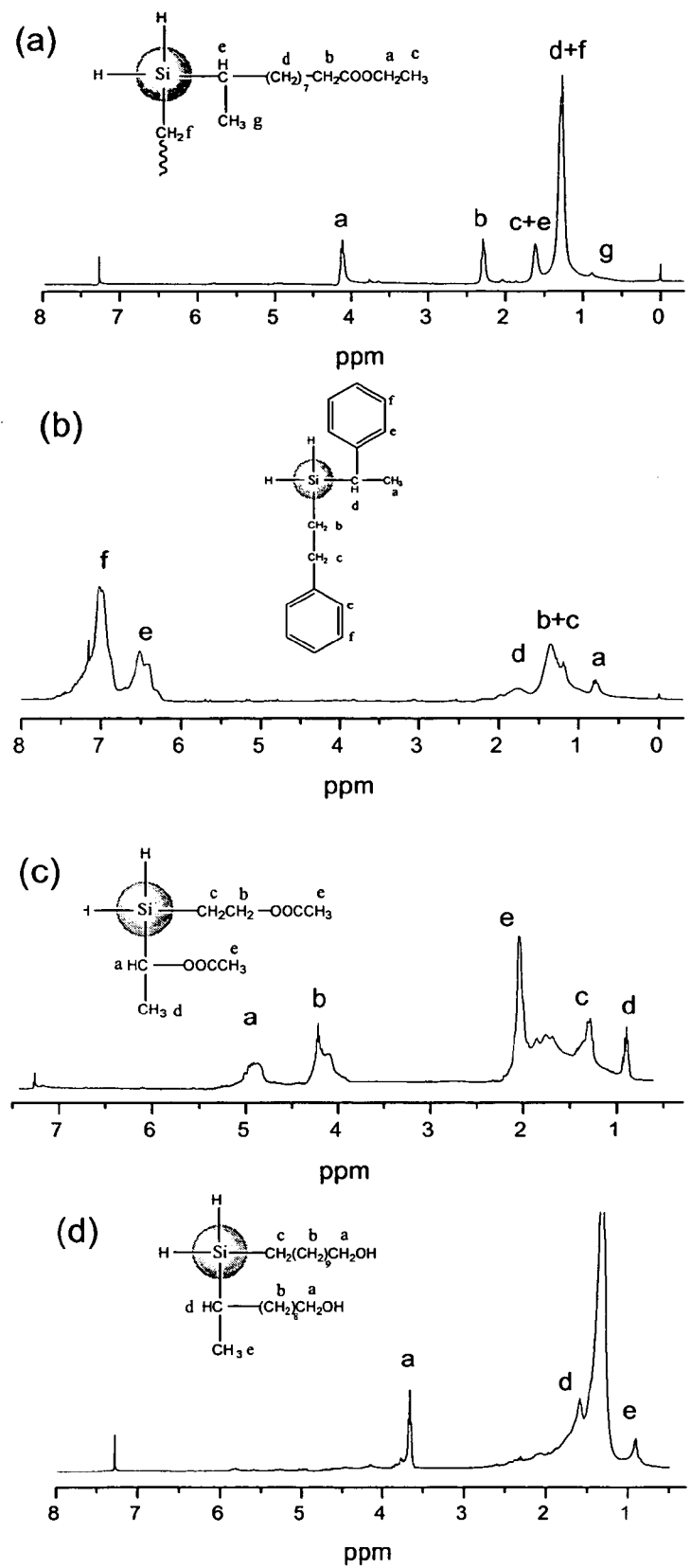
FIGS. 11A-D are graphs showing $^1$H NMR spectra of silicon nanoparticles with ethyl undecylenate (FIG. 11A), styrene (FIG. 11B), vinyl acetate (FIG. 11C), and 10-undecen-1-ol (FIG. 11D) grafted to their surface.

$^1$H NMR spectra from samples that had been dried and redispersed in deuterated chloroform confirmed that the organic molecules were attached via the expected hydrosilylation. FIG. 9 shows the spectrum for 1-dodecene grafted particles. Spectra for samples grafted with other compounds are shown in FIGS. 10 and 11. Peaks were assigned as shown in FIG. 9. Those labeled a and b are at the standard positions for methyl and methylene groups, respectively, in alkanes. For the hydrogens labeled (c) and (d), the assignment is less obvious. In molecular silanes, methyl group protons adjacent to a silicon atom exhibit a smaller chemical shift than those in alkanes. For example, in trihexylsilane, the methylene protons adjacent to the silicon atom appear at 0.58 ppm (Spectral Database for Organic Compounds, National Institute of Advanced Industrial Science and Technology, www.aist.go.jp/RIODB/SDBS/, accessed Apr. 20, 2005). The peak position is similar in other tri-and tetra-alkyl silanes. Similarly, the proton on the tertiary carbon adjacent to silicon in triisopropysilane appears at 1.07 ppm, while protons on tertiary carbons in branched alkanes typically appear at 1.5 to 1.8 ppm (Spectral Database for Organic Compounds SDBS, National Institute of Advanced Industrial Science and Technology, www.aist.go.jp/RIODB/SDBS/, accessed Apr. 20, 2005). Thus, we might expect the signals from the hydrogens labeled (c) and (d) in FIG. 9 to near 0.6 and 1.1 ppm, respectively. However, the peak positions in silanes depend on the other atoms bonded to the silicon. For example, in trichlorooctadecylsilane, the methylene protons adjacent to the silicon atom appear at 1.45 ppm (Spectral Database for Organic Compounds SDBS, National Institute of Advanced Industrial Science and Technology, www.aist.go.jp/RIODB/SDBS/, accessed Apr. 20, 2005), a somewhat higher chemical shift than methylene protons in alkanes. In the experimental procedures described herein, a small peak like that labeled (d) in FIG. 9 was consistently observed that can be most reasonably assigned to hydrogen of the type labeled (d) in FIG. 9 (hydrogen attached to a carbon bonded to two other carbons and the silicon nanoparticle). This peak occurs at a chemical shift typical of a hydrogen atom on a tertiary carbon in an alkane, rather than at a chemical shift typical of a hydrogen atom on a carbon bound to two other carbons and a silicon in a molecular silane. This gives indirect evidence that the hydrogens on the carbon adjacent to the silicon surface have chemical shifts closer to those of hydrogens in alkanes than hydrogens on carbons adjacent to silicon in a molecular tri-or tetr-alkyl silane. Based on this observation, the methylene hydrogens labeled (c) in FIG. 9 have been included with the other methylene hydrogens at 1.3 ppm. This assignment seems to provide the most consistent explanation of all of the spectra.

In hydrosilylation reactions, it is often assumed that the monomer attaches at the terminal (alpha) carbon atom. Some catalysts can confer this specificity as well. However, as described herein, reaction at either end of the double bond is possible. Here, it was observed that the selectivity toward reaction at the terminal carbon was monomer dependent, and that for small alkenes reaction at the second (beta) carbon atom was favored. The selectivity toward reaction at the terminal carbon can be roughly estimated from the area ratio between the 1.29 ppm (methylene) and 0.88 ppm (methyl) peaks in the $^1$H NMR spectrum. For dodecene, the measured ratio of 5.73 as shown in FIG. 9 corresponds to 63% of reaction occurring at the terminal carbon. If it had been assumed that the methylene hydrogens adjacent to the silicon surface, labeled (c) in FIG. 9, were contributing to the peak at 0.9 ppm, along with the methyl hydrogens rather than contributing to the peak near 1.3 ppm, then the expected area ratio of the 1.3 ppm peak to the 0.9 ppm peak would range from 20 to 5 (4 to 1) for attachment only at the alpha carbon, to 18 to 6 (3 to 1) for attachment only at the beta carbon. The observed ratio of 5.73 to 1 is significantly outside this range, further supporting the conclusion that the signal from the methylene hydrogens on the carbon adjacent to the particle appears in the 1.3 ppm peak. The appearance of the peak at 0.9 ppm for particles grafted with styrene, vinyl acetate, and 10-undecen-1-ol as shown in FIG. 11 provides direct evidence of addition at the beta carbon, since in these three cases there are no methyl groups present unless grafting occurs at the beta carbon. Neither the parent molecules nor molecules grafted at the alpha carbon should give a peak at 0.9 ppm, characteristic of the methyl hydrogens. Selectivity toward reaction at the terminal carbon increased with increasing size of the linear alkenes, from 39% for 1-pentene to 64% for 1-octadecene, as summarized in Table 1. The ability to study the hydrosilylation reaction using routine solution NMR spectroscopy is a significant advantage of working with stable colloidal dispersions of particles like those used herein, rather than porous silicon or silicon wafers where solution NMR is not applicable.

Figure 12:
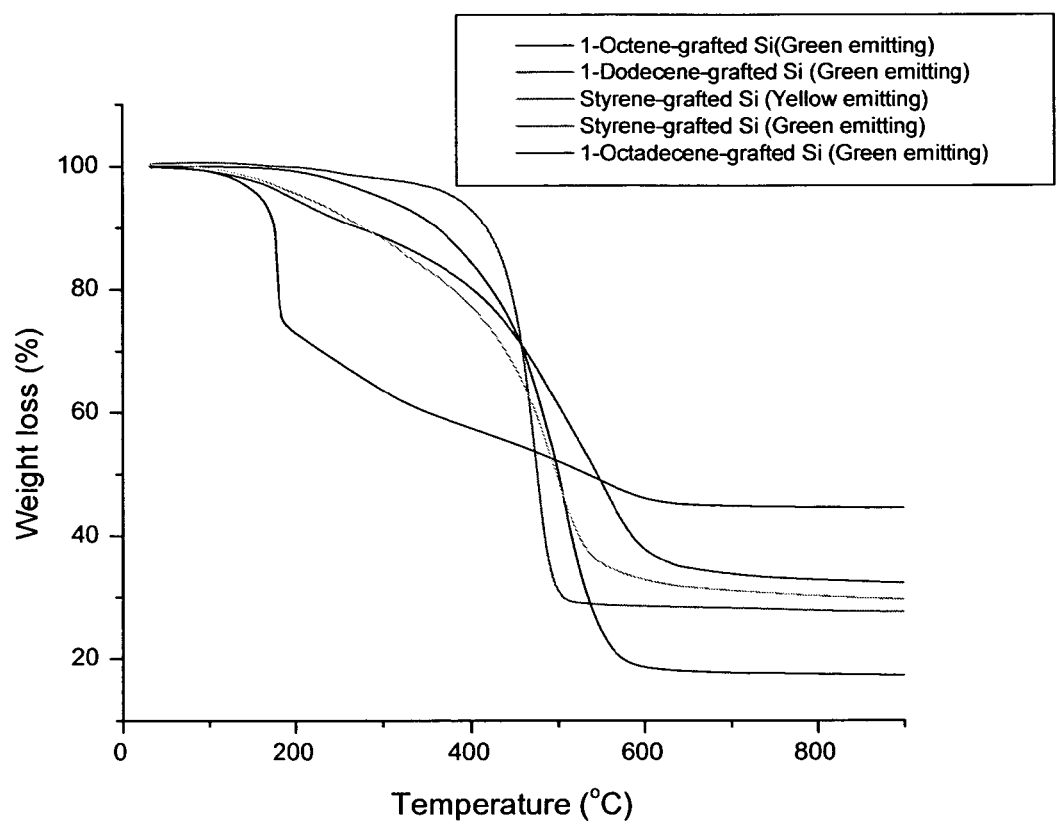
FIG. 12 is a graph showing thermal gravimetric analysis (TGA) curves for grafted silicon nanoparticles heated at 15° C. per minute in a nitrogen atmosphere. The mass fraction of organic in the grafted particles was estimated from such curves by assuming that all of the organic desorbs and that there is no weight gain due to oxidation.

Thermogravimetric analysis (TGA) (see FIG. 12) and $^1$H NMR were used to estimate the degree of grafting of the organic molecules onto the silicon particles. This is shown in more detail in Table 1 for green-emitting nanoparticles. The mass fraction of the organic component of the grafted nanoparticles can be obtained directly from TGA, assuming that all of the organic is removed at the highest temperature and that there is no increase in mass due to silicon oxidation. It can be obtained indirectly from $^1$H NMR by comparison of integrated peak areas from the grafted organic to those from a known quantity of tetramethylsilane (TMS) used as an internal standard. Thus the molar ratio of grafted molecules to silicon atoms in the particle can be estimated, as shown in Table 1. The results based on TGA and $^1$H NMR are reasonably consistent. It is more difficult to estimate the ratio of grafted molecules to surface Si atoms because of uncertainty in the particle size and, therefore, the surface to volume ratio of the surface. However, rough estimates can be made using the fraction of atoms on the surface of particular silicon nanoparticle structures approximately 2 nm in diameter (Zhao et al., Phys. Rev. Lett. 93:015502 (2004), which is hereby incorporated by reference in its entirety). A compact icosohedral structure containing 280 total Si atoms has 120 surface atoms (43%), and the next-larger icosohedral structure with 600 total Si atoms has 200 surface atoms (33%). A compact bulk-like structure with 323 total Si atoms has 124 surface atoms (38%). These are the most compact possible clusters in this size range, so other clusters of similar size will have a slightly larger fraction of surface atoms. The ratios of organic molecules to Si atoms shown in Table 1 are thus comparable to the expected fraction of the Si atoms that are on the surface. This suggests that a nearly complete monolayer has been formed. Table 1 illustrates that for such small particles grafted with organic molecules, the overall structure can contain more organic material than silicon. This is not unreasonable. As an example, consider the compact bulk-like cluster of 323 silicon atoms, which has 124 surface atoms. If one octadecene molecule (with a molecular weight of 252.5 amu) were attached to each of the 124 surface atoms, then the total octadecene mass would be 31310 amu, compared to a silicon mass of 9044 amu. Thus, by mass, the particle would be 78% octadecene and just 22% silicon. This is in reasonable agreement with the values given in Table 1 for octadecene. The situation is similar for the other grafted molecules. For pentene, hexene, and octene, FTIR spectra taken after grafting show a small amount of residual hydrogen on the surface, so it is clear that the organic molecules have not occupied every possible surface site in those cases. However, these small particles have a substantial number of atoms that occupy edge or vertex positions where they may be able to accommodate two organic ligands or an organic ligand and a hydrogen atom.

TABLE 1

Reaction selectivity and grafting degree of various compounds with green-emitting silicon nanoparticles.

| Ligand | Area ratio, $A_{1.29}/A_{0.88}$[a] | Terminal carbon fraction, $n$[b] | Mass Fraction Ligand, $g$[c,d] | Mole Fraction Ligand, $m$[e] | Ligand to Si atom ratio, $r$[f] |
|---|---|---|---|---|---|
| 1-pentene | 1.44 | 38.7 | 0.52 (0.51) | 0.30 (0.29) | 0.43 (0.42) |
| 1-hexene | 1.93 | 39.9 | 0.52 (0.53) | 0.27 (0.27) | 0.36 (0.38) |
| 1-octene | 3.02 | 45.1 | 0.56 (0.54) | 0.24 (0.23) | 0.31 (0.29) |
| 1-dodecene | 5.73 | 63.0 | 0.68 (0.67) | 0.26 (0.26) | 0.36 (0.34) |
| 1-octadecene | 9.05 | 63.9 | 0.83 (0.77) | 0.35 (0.27) | 0.53 (0.37) |
| styrene | — | — | 0.72 (0.67) | 0.40 (0.35) | 0.67 (0.54) |

[a] $A_{1.29}$ and $A_{0.88}$ are integral areas of $^1$H NMR peaks at 1.29 and 0.88 ppm, which are assigned to methylene and methyl protons, respectively.
[b] n is the fraction of reaction occurring at the terminal carbon, calculated from the equation $^2/_3 \times (m-1) \times n + ^1/_3 \times (m-3) \times (1-n) = A_{1.29}/A_{0.88}$, where m is the chain length of the alkene.
[c] Grafting degree, g, is the mass fraction of the organic component, $g = (G_0 - G_1)/G_0$, obtained from TGA, where $G_0$ and $G_1$ are the initial and the final masses, respectively.
[d] Data in parenthesis were estimated from $^1$H NMR spectra using the ratio of the integrated area of peaks due to ligand hydrogens to the peak from TMS (internal standard) hydrogens, using known masses of TMS and grafted particles.
[e] Ligand mole fractions were calculated from $m = (^g/_{MW1})/(^g/_{MW1} + ^{(100-g)}/_{MW2})$, where $MW_1$ and $MW_2$ are molecular weights of the ligand and Si, respectively. Data in parenthesis were from NMR.
[f] Computed from $r = m/(1-m)$. Data in parenthesis were from NMR.

The relative reactivity of the different organic compounds with the hydrogen-terminated silicon nanoparticles was considered qualitatively. Table 2 shows the approximate reaction time required for grafting of various molecules onto silicon nanoparticles of different sizes, as estimated from the time required for the colloidal dispersion to appear clear, rather than cloudy. Required reaction times for the various alkenes and for the two esters used were similar. Styrene reacted more quickly, and the alcohols reacted more slowly. In all cases, the reaction proceeded faster on the smaller (green-emitting) particles. Since the reaction time was taken as the time when the colloidal dispersion became clear, this observation may be affected by the fact that smaller particles are more easily dispersed and might require a lower degree of grafting to form a clear dispersion. The fact that the smallest organic molecules yielded stable dispersions of smaller particles, but not larger particles illustrates the fact that smaller particles are more easily dispersed.

TABLE 2

Qualitative reactivity of various compounds with H-terminated luminescent silicon nanoparticles by photoinitiated hydrosilylation[a]

| | Green emitting | Yellow emitting | Red emitting |
|---|---|---|---|
| 1-pentene | 25 | — | — |
| 1-hexane | 30 | 60 | — |
| 1-octene | 30 | 45 | 60 |
| 1-dodecene | 20 | 45 | 60 |
| 1-octadecene | 30 | 60 | 120 |
| styrene | 3 | 5 | 10 |
| vinyl acetate | 20 | 35 | — |
| ethyl undecylenate | 20 | 30 | 60 |
| 10-undecen-1-ol | 60 | 120 | 180 |
| 5-hexen-1-ol | 45 | 120 | — |

[a] Approximate reaction time, in minutes, for the colloidal dispersion to appear clear, rather than cloudy. This is an indication that substantial attachment of the organic compound has occurred. Missing entries indicate that the solution often did not become clear for that combination of organic compound and particles.

Figure 13:
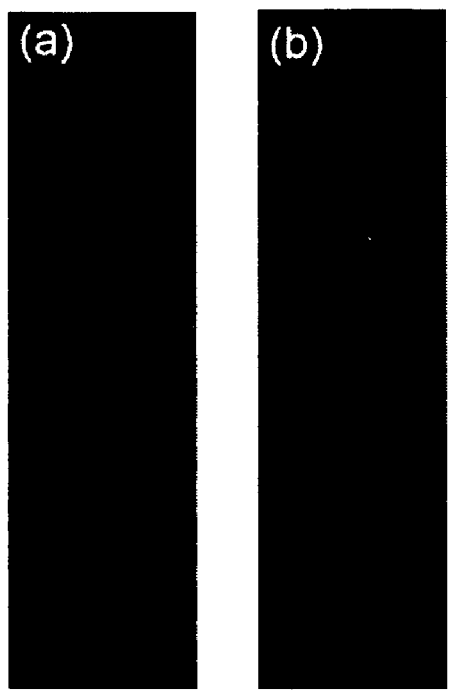
FIGS. 13A-B shows size separation of nanoparticles by thin layer chromatography (TLC), using 2:1 (FIG. 13A) and 1:3 (FIG. 13B) cyclohexane:THF (v/v) mixtures as the mobile phase.
Figure 14:
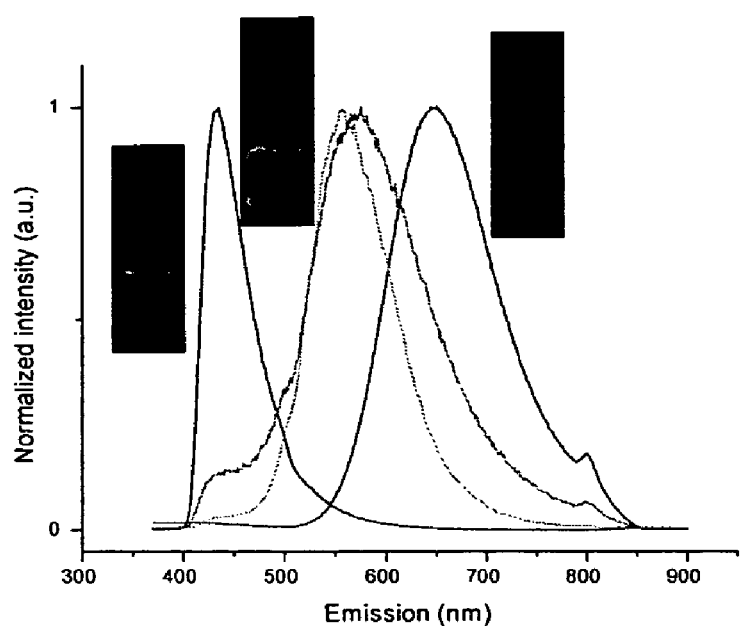
FIG. 14 is a graph showing normalized PL spectra of ethyl undecylenate-grafted silicon fractions separated using column chromatography. The orange spectrum is from the sample that was separated into three fractions with the blue, yellow, and red spectra, respectively. The insets are photos under 355 nm illumination.
Figure 15:
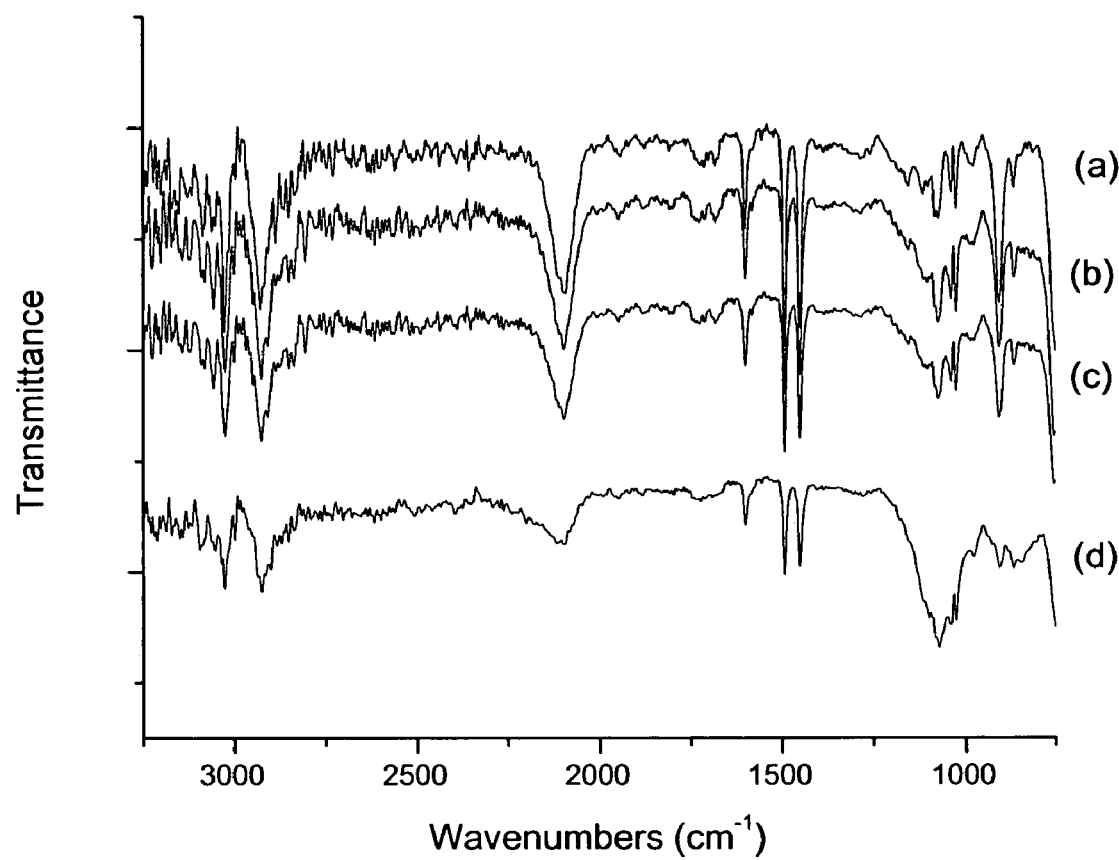
FIG. 15 is a graph showing stability of styrene-grafted silicon particles in air at 70° C. FTIR spectra are shown for particles after (a) 0 min, (b) 60 min, (c) 600 min, and (d) 6000 min. at these conditions. Residual Si—H groups on the surface are oxidized very gradually, but peaks associated with the grafted styrene remain intact.
Figure 16:
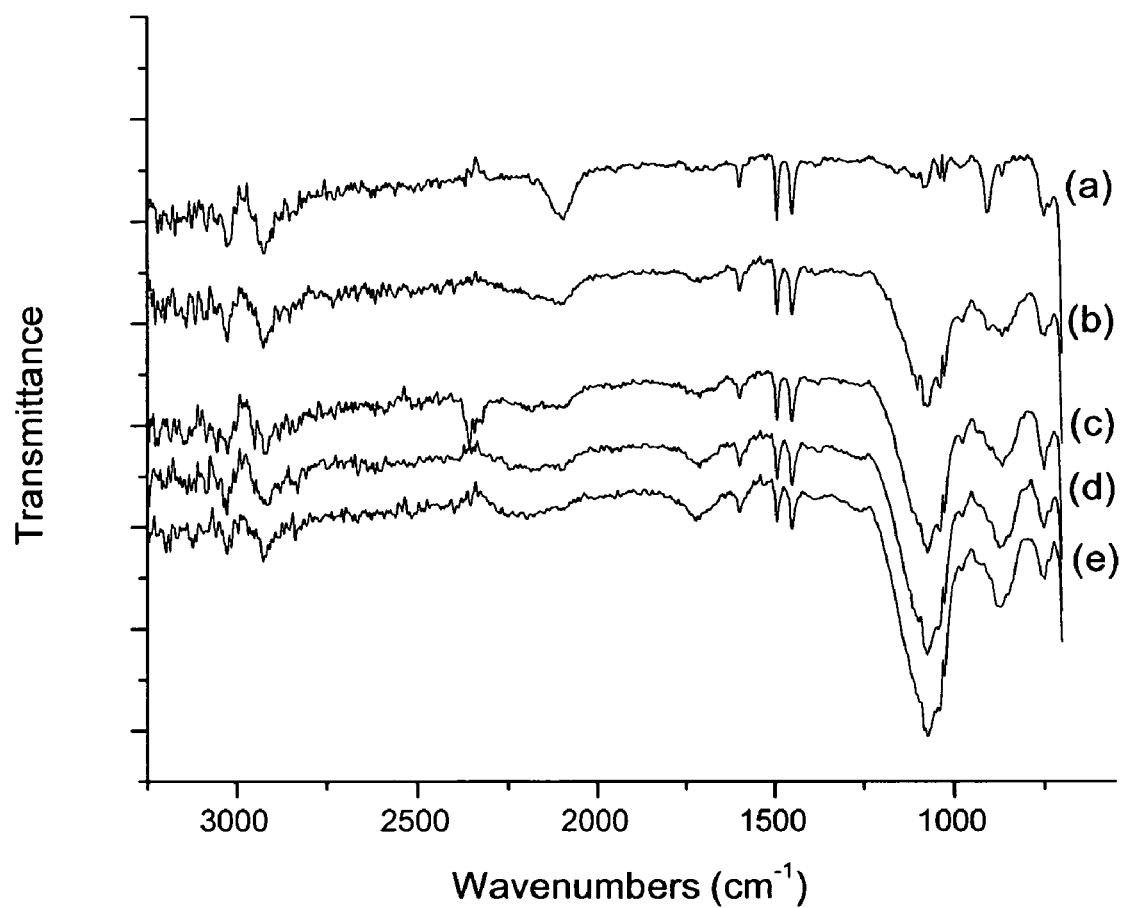
FIG. 16 is a graph showing photooxidation stability of styrene-grafted silicon particles under UV illumination at 254 nm in air. FTIR spectra of particles after (a) 0 min, (b) 1 min, (c) 5 min, (d) 10 min, and (e) 30 min. Residual Si—H groups on the particle surface are rapidly oxidized, but peaks assigned to the grafted styrene remain unchanged.
Figure 17:
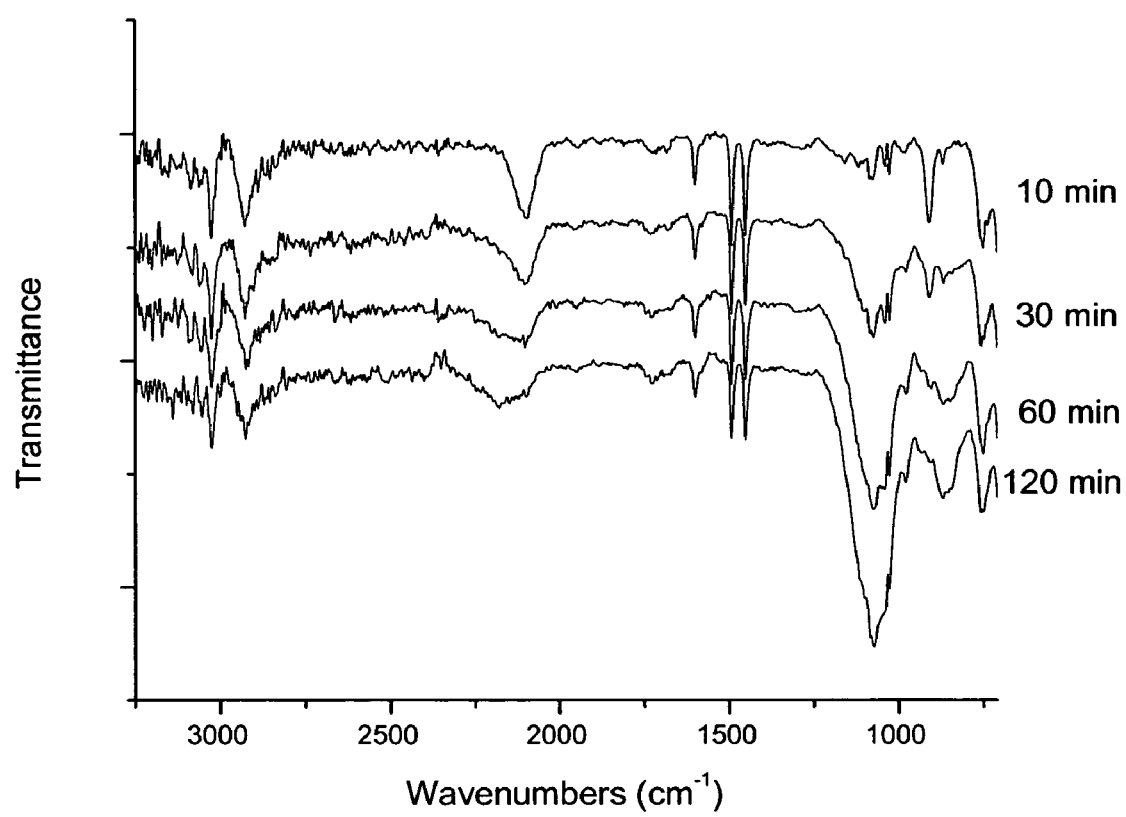
FIG. 17 is a graph showing photo oxidation stability of styrene-grafted silicon particles under UV illumination at 363 mn. FTIR spectra of particles after (a) 10 min, (b) 30 min, (c) 60 min, and (d) 120 min are shown. Residual Si—H groups on the surface are oxidized gradually, but peaks associated with the grafted styrene remain intact.
Figure 18:
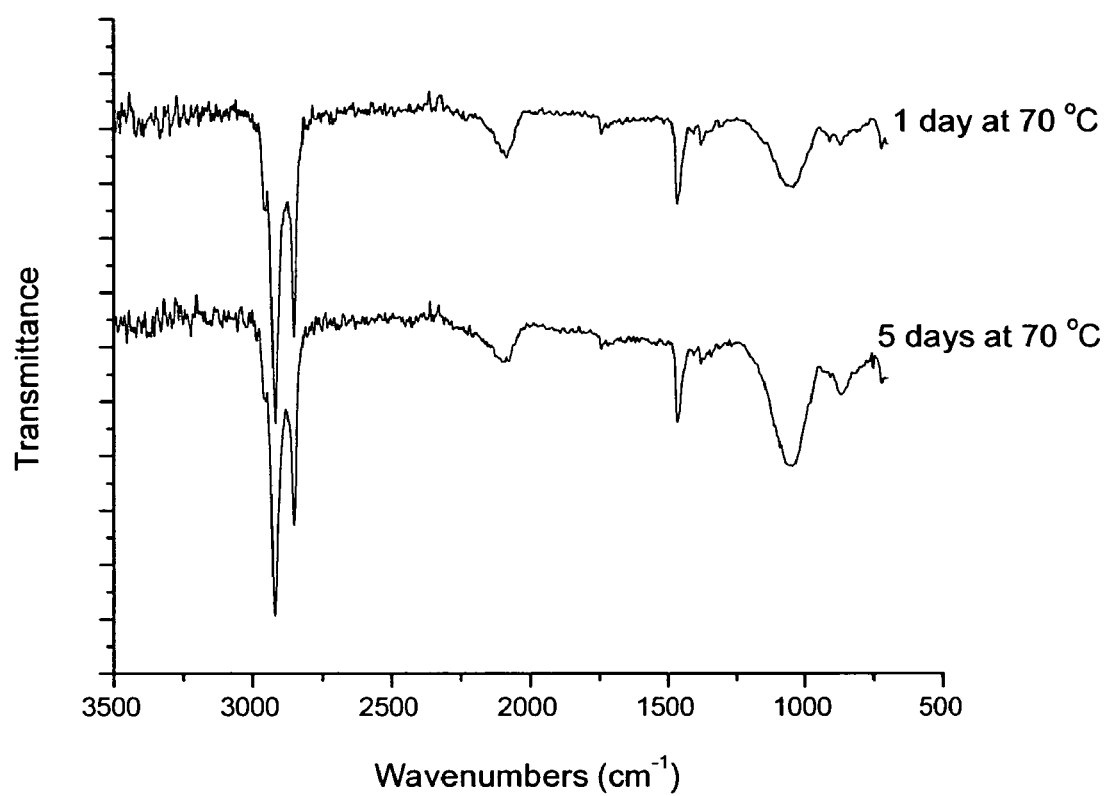
FIG. 18 is a graph showing FTIR spectra showing the thermal stability of 1-dodecene-grafted silicon particles at 70° C. in air. In this case, even the residual Si—H is not oxidized.
Figure 19:
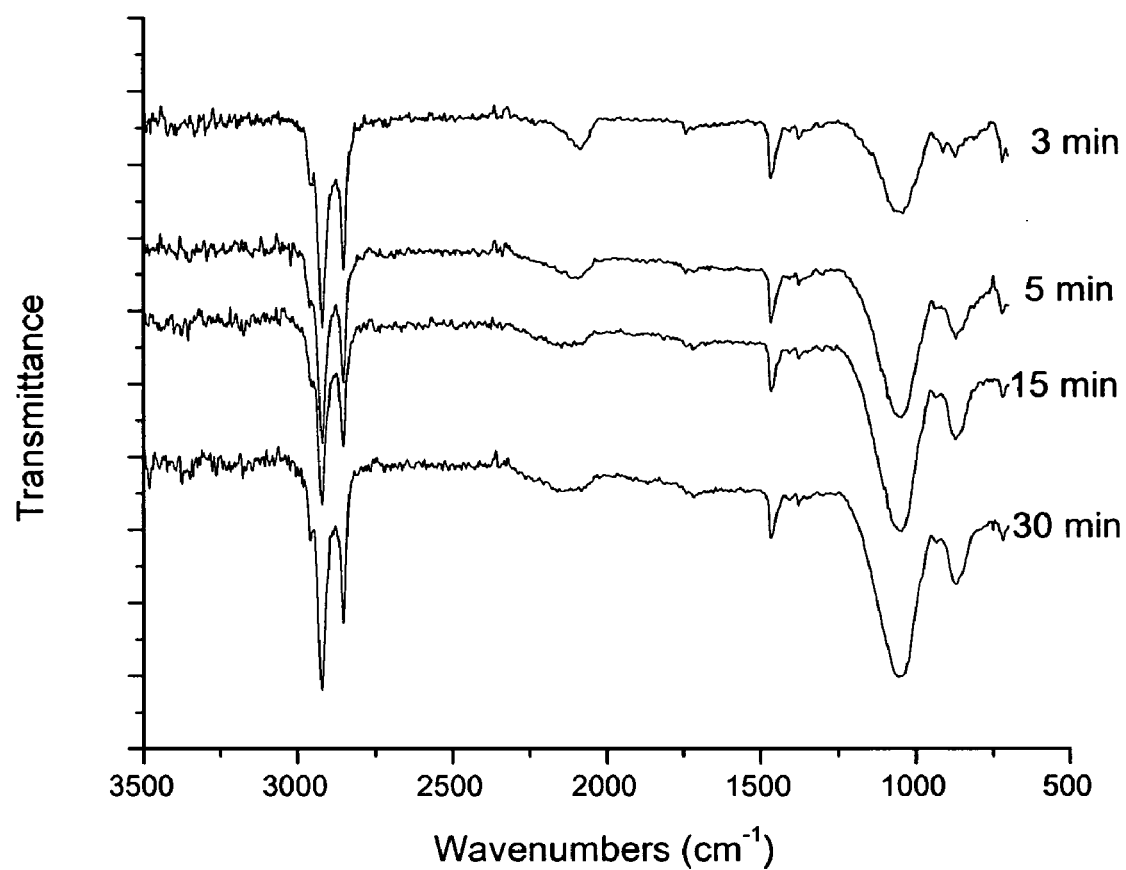
FIG. 19 is a graph showing FTIR spectra showing photo-oxidation of 1-dodecene-grafted silicon particles under UV illumination at 254 nm. Residual Si—H is oxidized over a period of 30 minutes, but the peaks characteristic of the grafted 1-dodecene remain intact.
Figure 20:
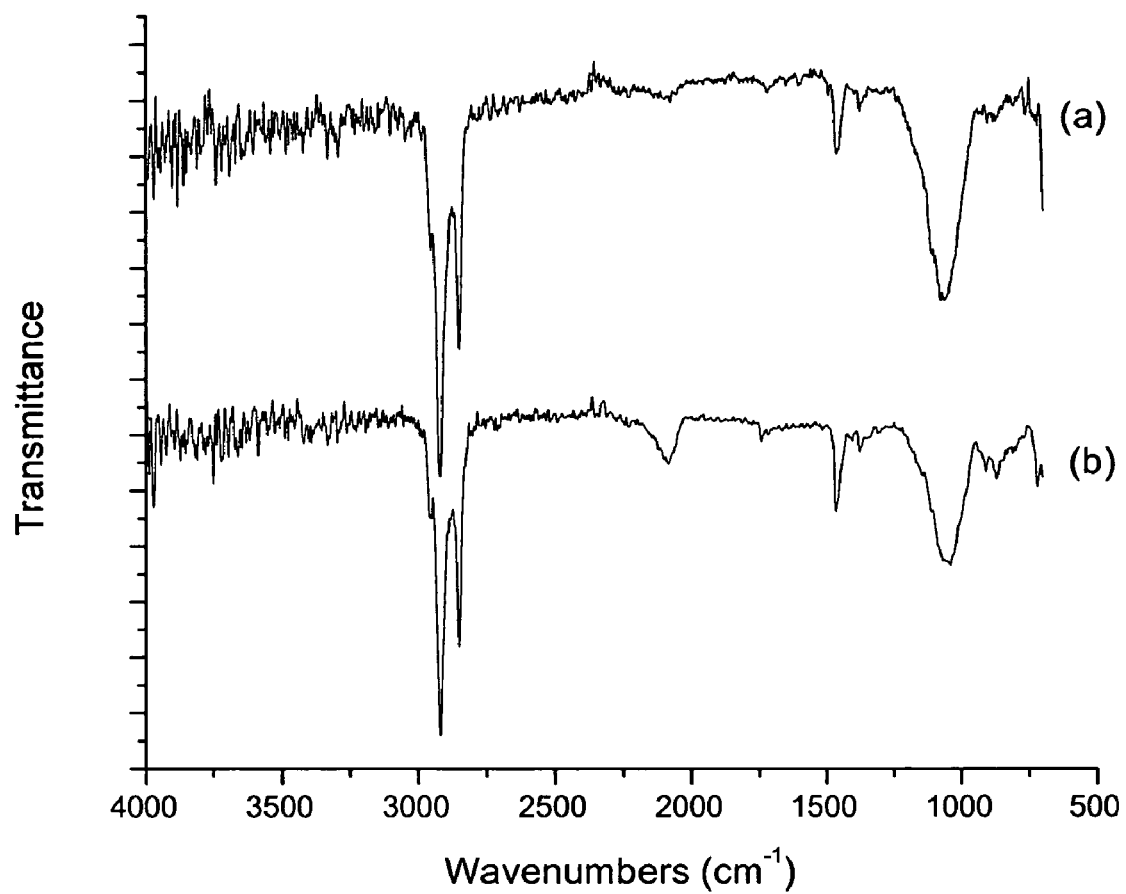
FIG. 20 is a graph showing FTIR spectra showing the stability of 1-dodecene-grafted silicon particles under basic conditions. (a) after 5 min boiling in pH 14 KOH solution, (b) after 15 min at 70° C. in pH 14 KOH solution. Residual Si—H is oxidized completely in boiling pH 14 solution, and is oxidized partially in pH 14 solution at 70° C.
Figure 21:
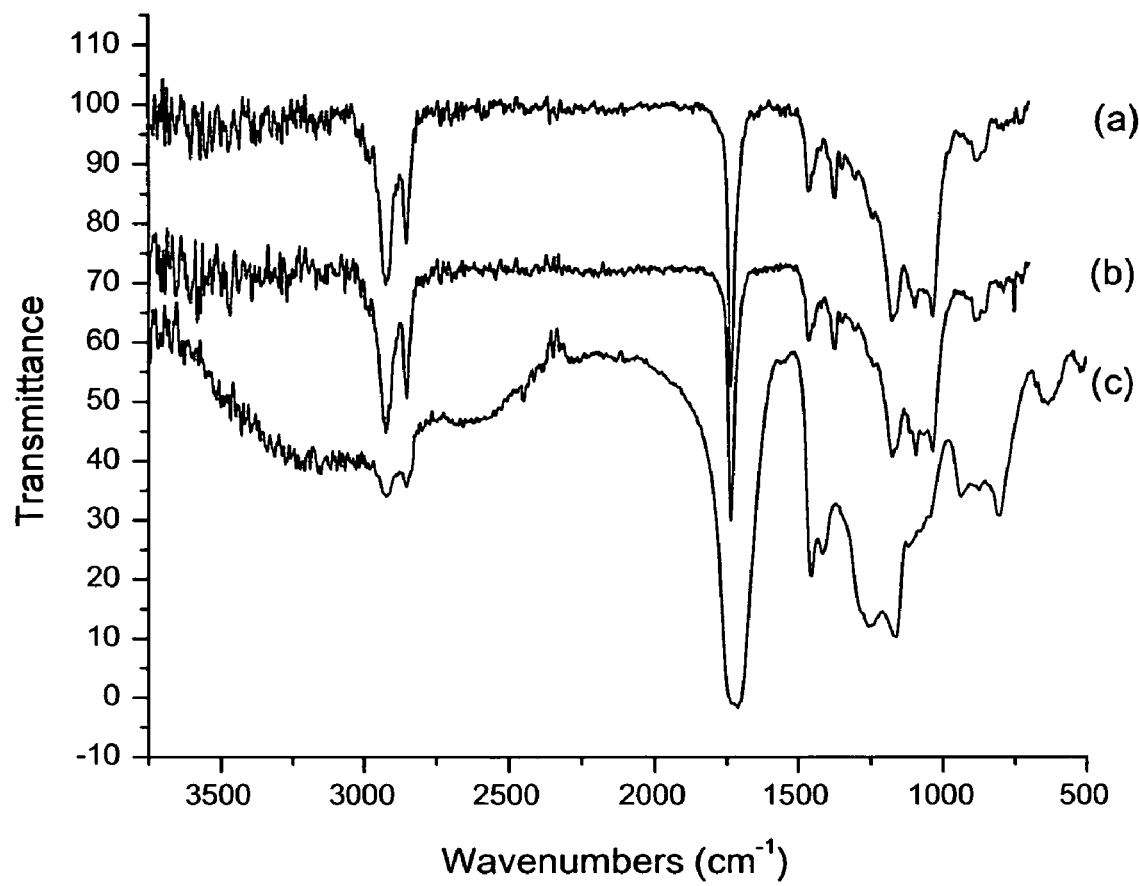
FIG. 21 is a graph showing FTIR spectra showing the thermal stability of 1-dodecene-grafted silicon particles. (a) 2 days at 70° C., (b) 5 days at 70° C., (c) 10 min boiling in pH=14 solution
Figure 22:
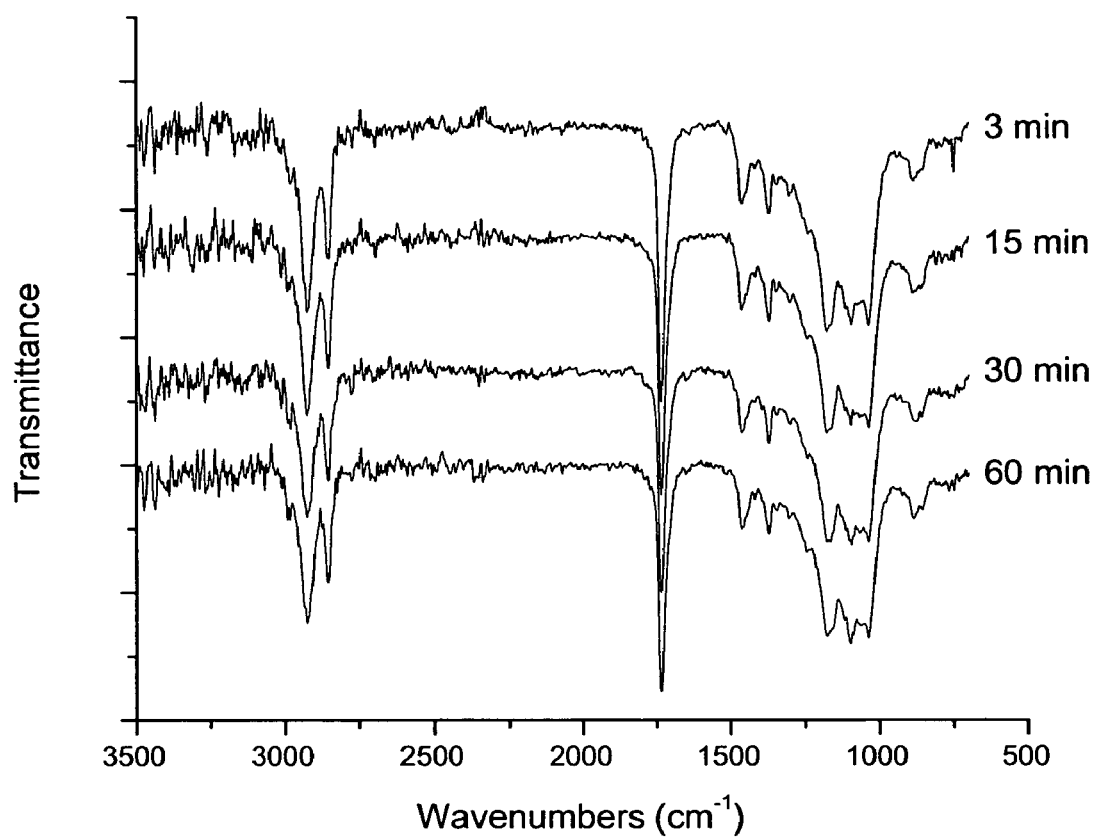
FIG. 22 is a graph showing FTIR spectra showing photo-oxidation of ethyl undecylenate-grafted silicon particles under UV radiation at 254 nm. Residual Si—H groups on the particle surface are rapidly oxidized, but peaks assigned to the grafted ethyl undecylenate remain unchanged.

Dense grafting of an organic monolayer onto the silicon nanoparticles substantially changes their chemical and physical properties. After reaction, the particles formed stable colloidal dispersions in organic solvents including THF, chloroform, toluene, DMF, and DMSO. This ability to form stable dispersions in a range of solvents and solvent mixtures enabled the chromatographic separation of particles by size. Ethyl undecylenate-grafted silicon particles (orange emitting) were size separated via conventional thin layer chromatography (TLC) and column chromatography. FIG. 13 shows photographs of TLC plates upon which the ethyl undecylenate-grafted particles were separated by size, which corresponds to separation by emission color, using different solvent mixtures as the mobile phase. As shown there, when the TLC plate was developed with a 2:1 (v/v) cyclohexane:THF mixture, the smallest (blue-emitting) particles moved further than the largest (red-emitting) particles. However, when the plate was developed with a 1:3 (v/v) cyclohexane:THF mixture, the larger particles moved further. These results can be extended to column chromatography. FIG. 14 shows photographs and PL spectra for three size fractions with blue, yellow and red emission, respectively, that were obtained from an orange-emitting sample by column chromatography with a 2:1 (v/v) cyclohexane:THF mixture as the mobile phase.

Stability of the silicon particles against heat, photooxidation, chemical attack and UV radiation was dramatically improved by the organic monolayer, and the organic monolayer itself was also quite stable. The 1-dodecene monolayer was able to withstand heating at 70° C. in air for 5 days, 30 min illumination with 254 nm UV light, 120 min illumination with 363 nm light, 15 min in pH=14 solution at 70° C., or 5 min in boiling pH=14 solution. Some of these stability checks were also performed for styrene -grafted and ethyl-undecylenate-grafted particles. FTIR spectra before and after these treatments (examples are shown in FIGS. 15 through 22) showed that the organic monolayer remained intact after these treatments, but that in most cases any residual Si—H on the surface was oxidized. In many cases, this oxidation led to a blue-shift of the PL. However, the PL of grafted green-emitting particles did not disappear or red-shift upon extended exposure to air, UV illumination, or basic solutions as did the PL of untreated green-emitting particles. These stability tests were performed for solid particle deposits on the ATR element for FTIR spectroscopy, which precluded quantitative PL measurements on the same samples.

Figure 23:
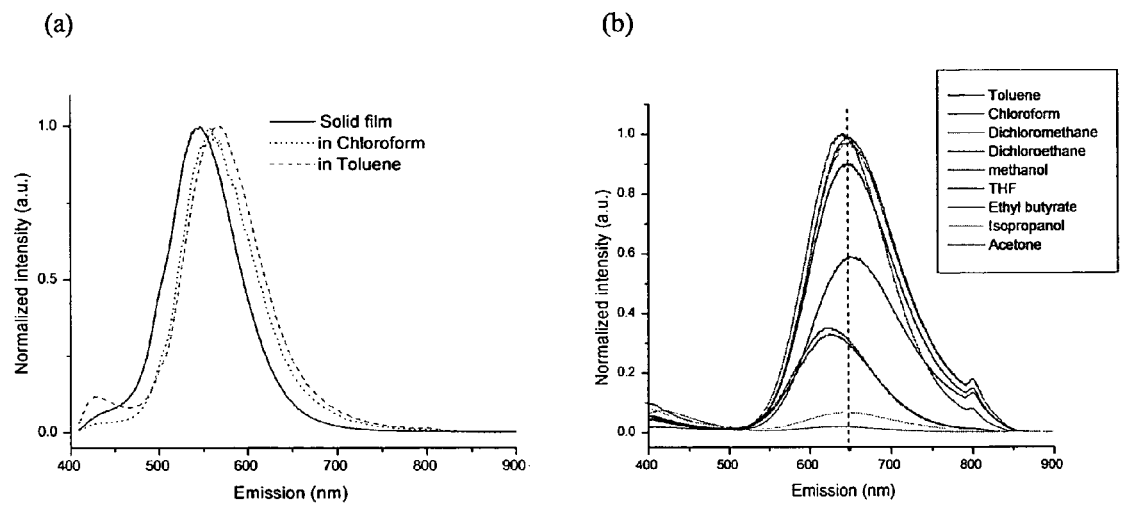
FIGS. 23A-B are graphs showing effect of solvent on emission from grafted silicon nanoparticles (a) red-shift upon dispersion of dry styrene-grafted particles in solvents (FIG. 23A), and (b) variation of PL with solvent for dodecene-grafted particles (FIG. 23B). Solvent changes were made by evaporation of one solvent followed by addition of a new solvent so that the concentration was the same in all measurements.
Figure 24:
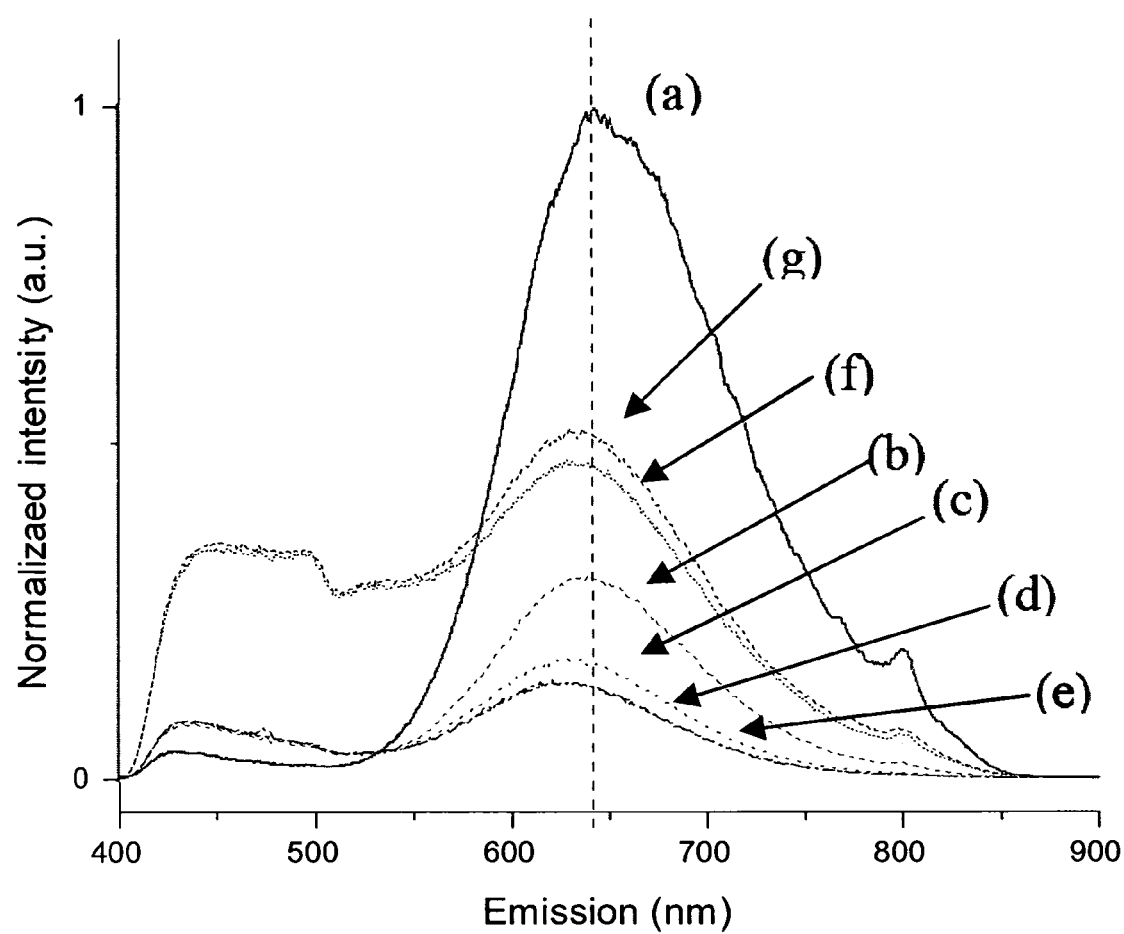
FIG. 24 is a graph showing PL spectra of 1-dodecene-grafted silicon (0.1133 g/l) quenched by triethyl amine (33 g/l) as a function as time. (a) solid line, 0 min, (b) dashed line, 5 min, (c) dotted line, 15 min, (d) dash-dot line, 20 min, (e) dash-dot-dot line, 40 min, (f) short dot, 10 min after addition of TFA (100 g/l), and (g) short dash, 40 min after addition of TFA (100 g/l).
Figure 25:
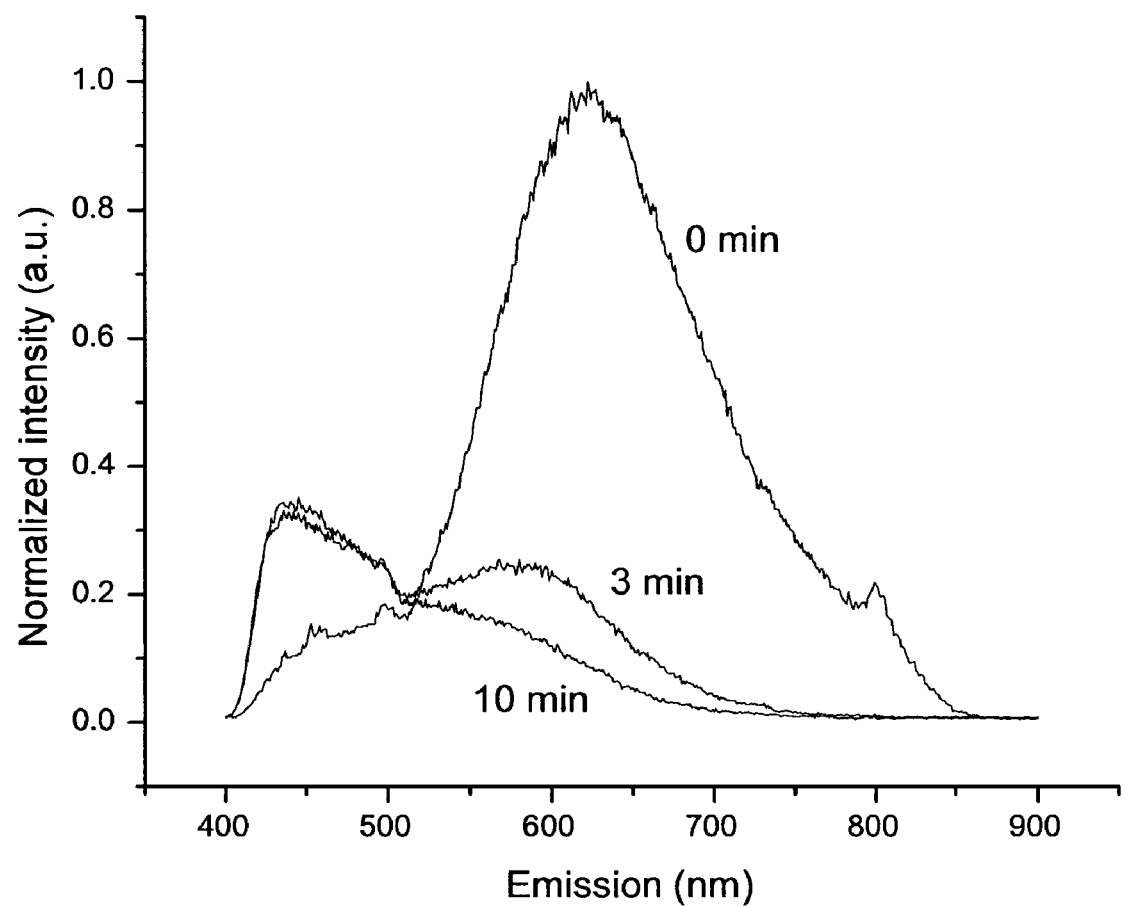
FIG. 25 is a graph showing quenching of emission from 1-octene-grafted silicon particles in chloroform by triethyl amine.
Figure 26:
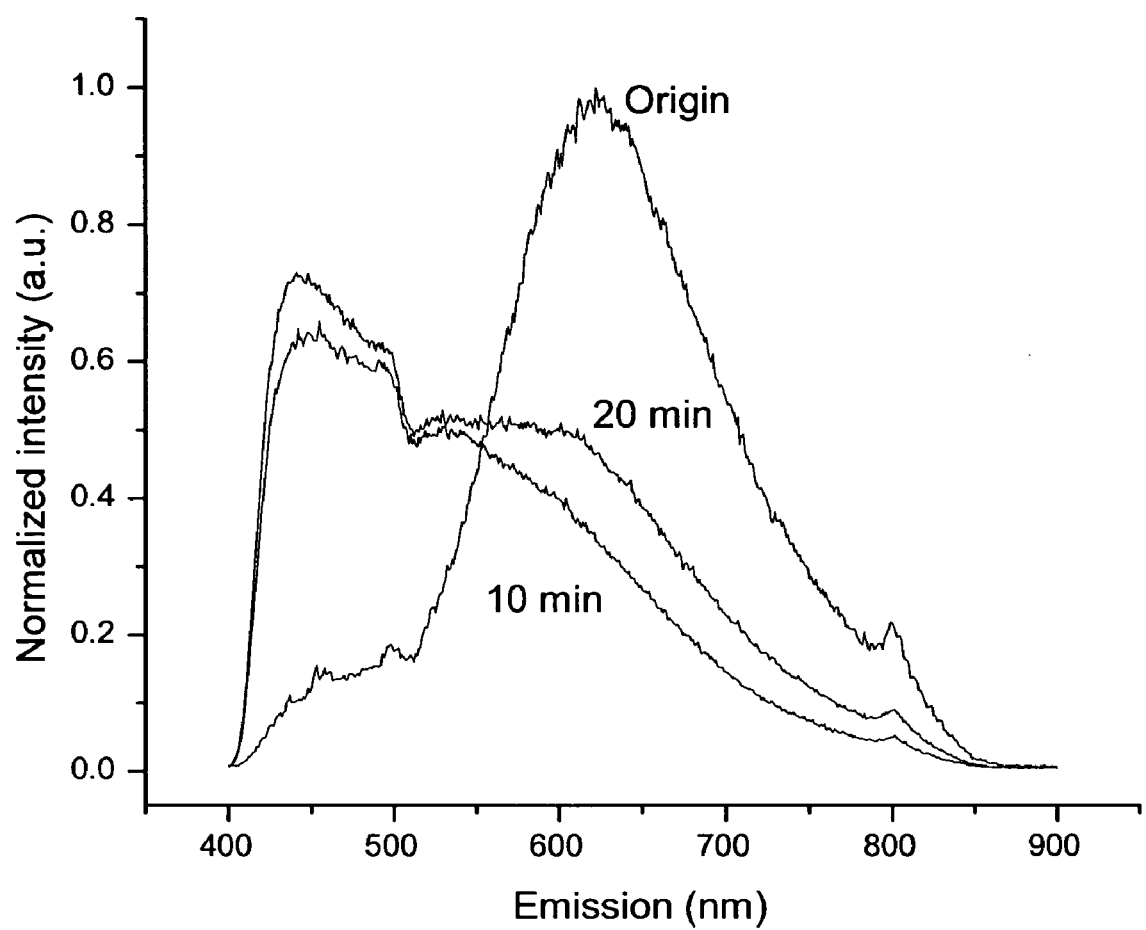
FIG. 26 is a graph showing recovery of PL for 1-octene-grafted silicon particles upon addition of trifluoroacetic acid after quenching by triethyl amine. Spectra are before quenching, 10 minutes after addition of TFA, and 20 minutes after addition of TFA to the quenched particles.
Figure 27:
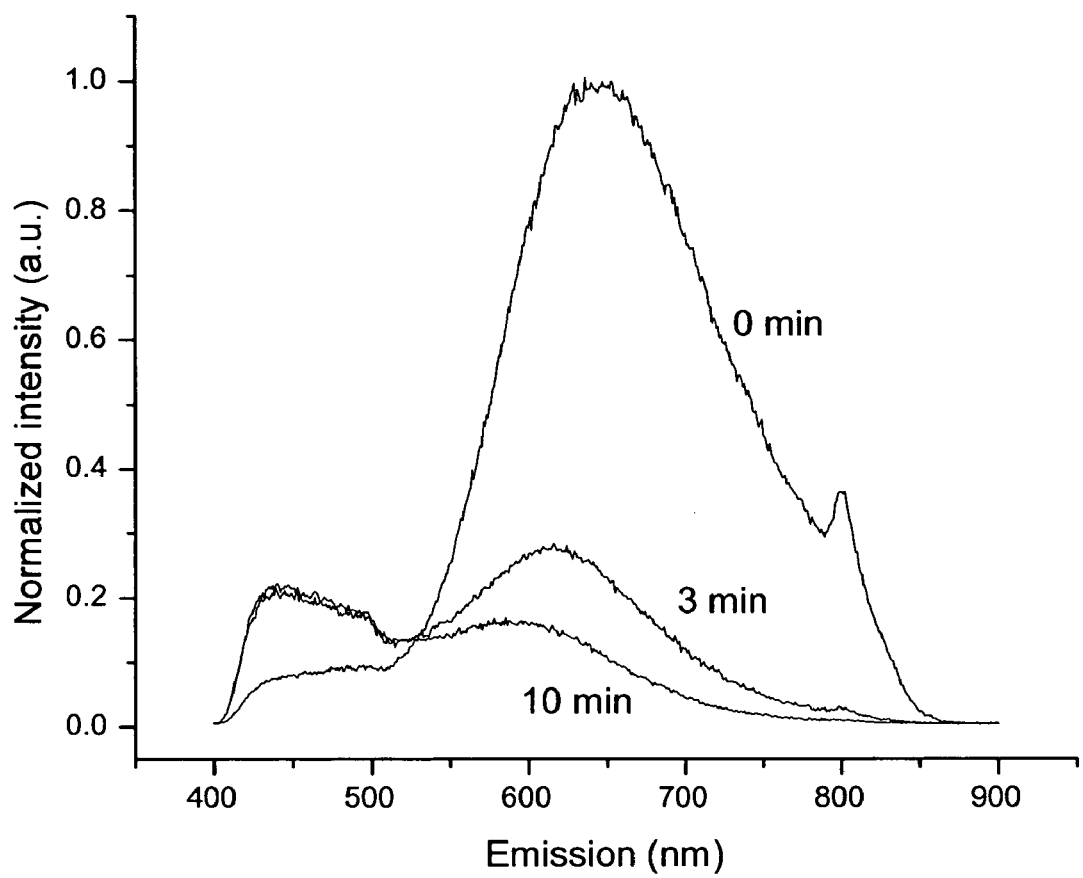
FIG. 27 is a graph showing quenching of PL from 1-octadecene-grafted silicon particles in chloroform by triethyl amine.
Figure 28:
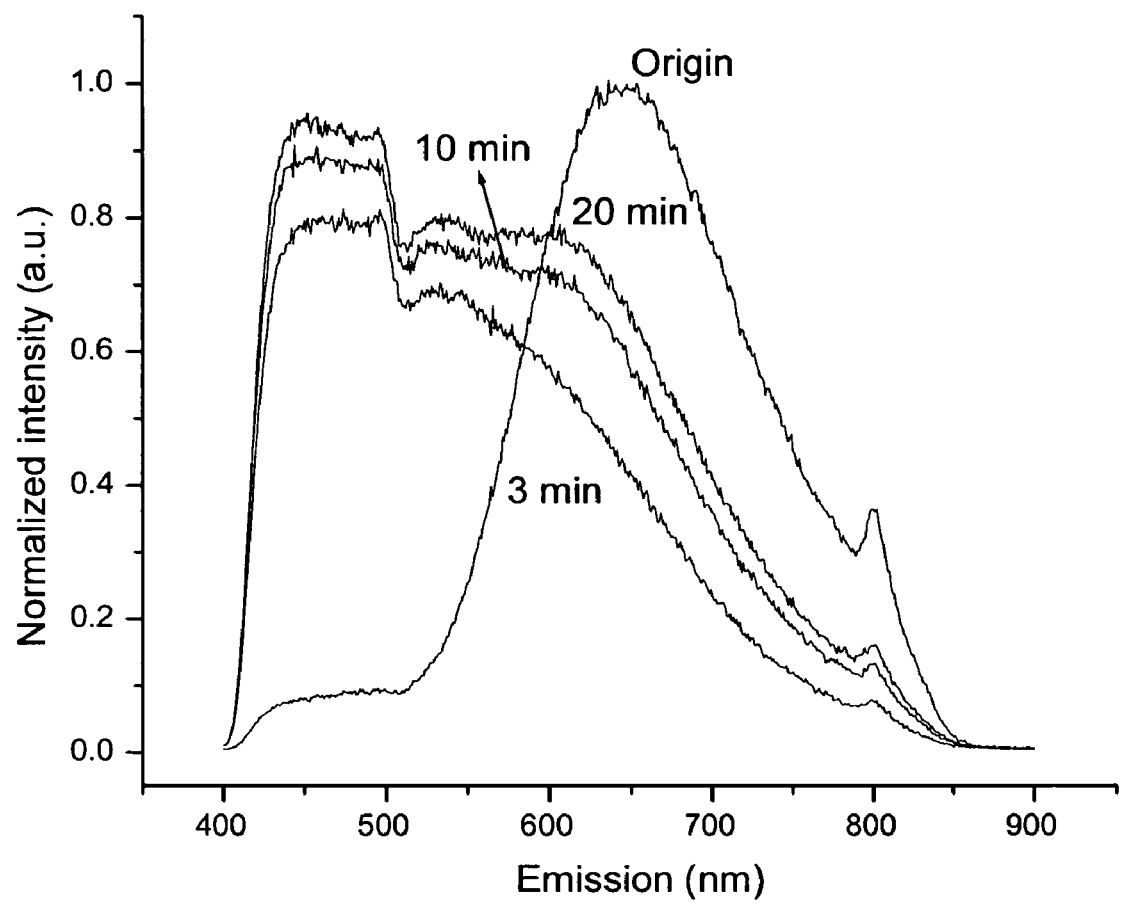
FIG. 28 is a graph showing recovery of PL of quenched 1-octadecene-grafted silicon particles by addition of trifluoroacetic acid in chloroform.
Figure 29:
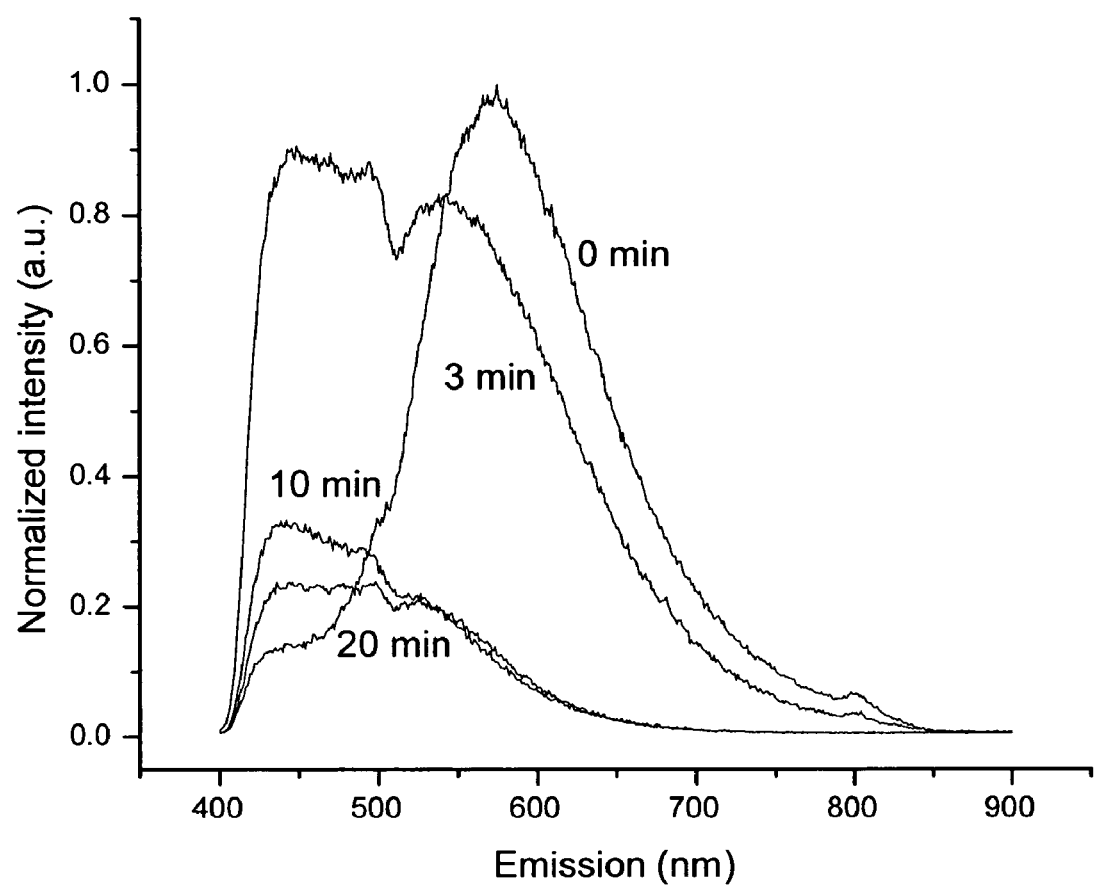
FIG. 29 is a graph showing quenching of PL from styrene-grafted silicon particles in chloroform by triethyl amine.
Figure 30:
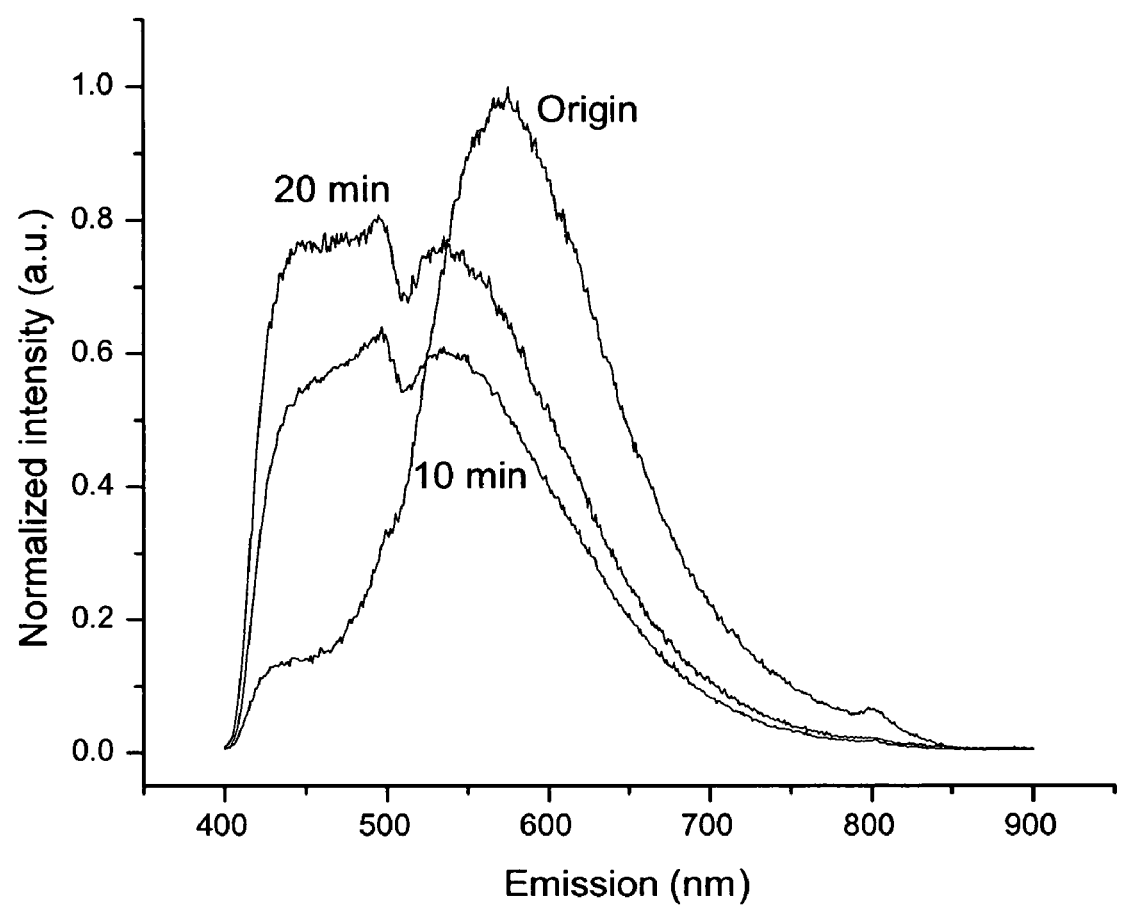
FIG. 30 is a graph showing PL spectra of recovery of quenched styrene-grafted silicon particles by trifluoroacetic acid in chloroform

Even after surface grafting, the PL properties were sensitive to the medium surrounding the particles. When styrene-grafted silicon particles were dispersed in chloroform or toluene, a red-shift of the PL was observed, as shown in FIG. 23. This can be attributed to energy transfer to the solvent (solvent relaxation effect). Energy loss and PL intensity decrease could be qualitatively correlated with chemical differences between the organic monolayer and the solvent used, with the greatest effects seen for oxygen-containing compounds. However, there was no straightforward correlation between these effects and solvent dipole moment, index of refraction, dielectric constant, or orientational polarizability. Emission from grafted silicon particles was partially quenched by triethyl amine, whose ability to quench emission from PSi and Si nanoparticles is well known (Sweryda-Krawiec et al., *J. Phys. Chem.* 100:13776 (1996), Germanenko et al., *J. Phys. Chem. B.* 105:59 (2001), which are hereby incorporated by reference in their entirety). However, complete quenching was not observed, indicating that a densely-grafted organic monolayer on the silicon surface can partially protect the particles against quenching by amines. FIG. 24 shows typical results for quenching with triethyl amine and PL recovery upon addition of trifluoroaceic acid (TFA). Additional results are included in FIGS. 25 through 30. Quenching is not instantaneous, but occurs on a time scale of minutes. Quenching was accompanied by a blue-shift of the main PL emission as well as an 80 to 90% decrease in PL intensity. Both quenching and recovery by addition of TFA were accompanied by an increase in blue emission between 400 and 500 nm. The source of this blue emission cannot be established from the present results. Upon addition of TFA, an organic acid that protonates the triethyl amine, partial recovery of the PL was observed.

When styrene-grafted or 1-dodecene-grafted silicon particles were prepared for TEM imaging by casting a colloidal dispersion of them onto a carbon-coated TEM grid and evaporating the solvent, self-assembled crystalline structures were reproducibly observed. This appears to result from crystallization of the organic component of the grafted nanoparticles.

Figure 31:
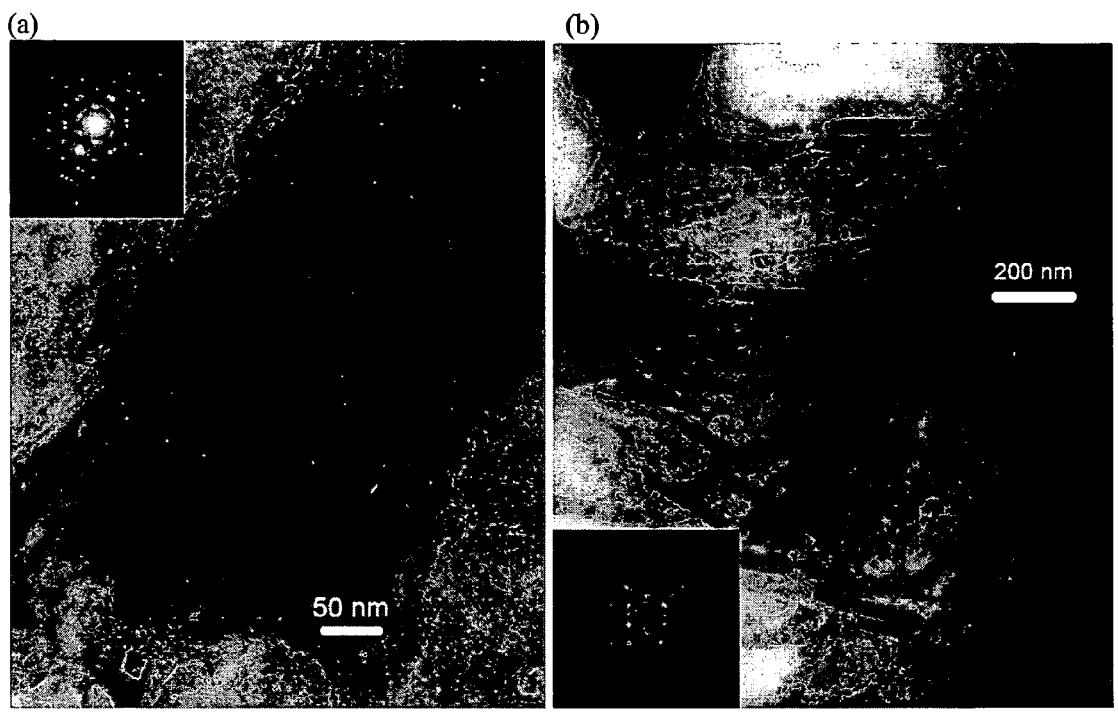
FIGS. 31A-B show crystalline structures formed from (a) 1-dodecene grafted silicon nanoparticles (FIG. 31A), and (b) styrene-grafted silicon nanoparticles (FIG. 31B). The insets are selected area electron diffraction patterns (SAED). TEM grids were prepared by dropping a cyclohexane dispersion (0.13 mg/ml for dodecene grafted particles, 0.15 mg/ml for styrene grafted particles) onto a carbon-coated copper TEM grid and evaporating the solvent.
Figure 32:
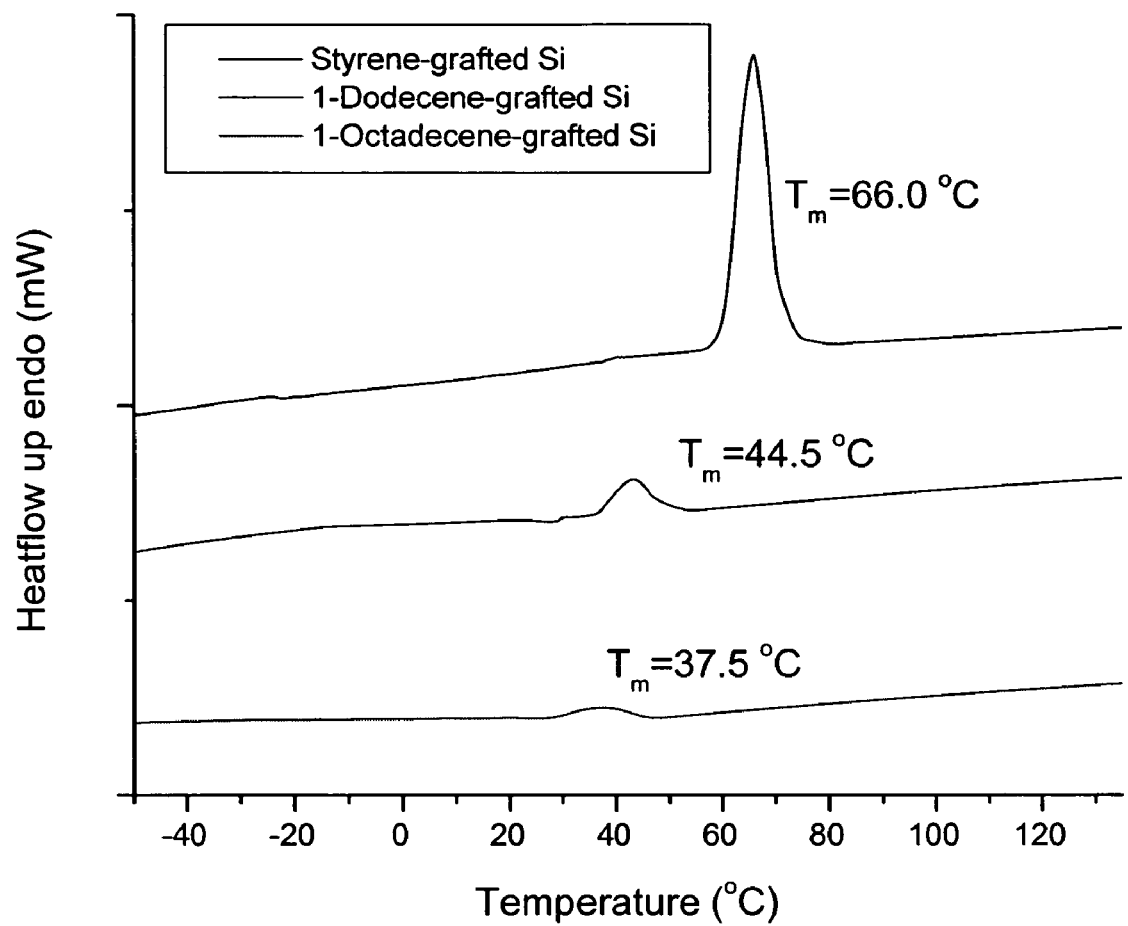
FIG. 32 is a graph showing differential scanning calorimetry (DSC) profiles of grafted silicon particles (green emitting).
Figure 33:
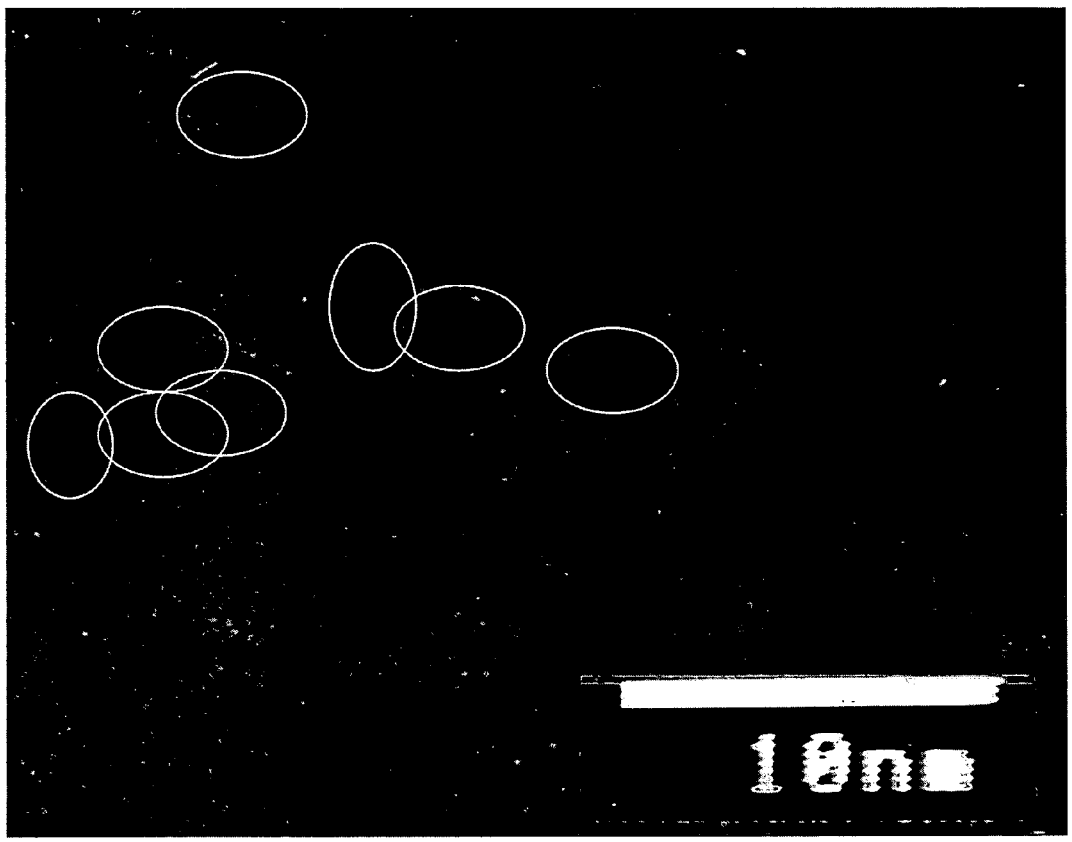
FIG. 33 shows a high-resolution TEM image of part of the region shown in FIG. 31A, after melting by the electron beam. Small crystalline regions are visible, showing that the melted material contains crystalline nanoparticles.
Figure 34:
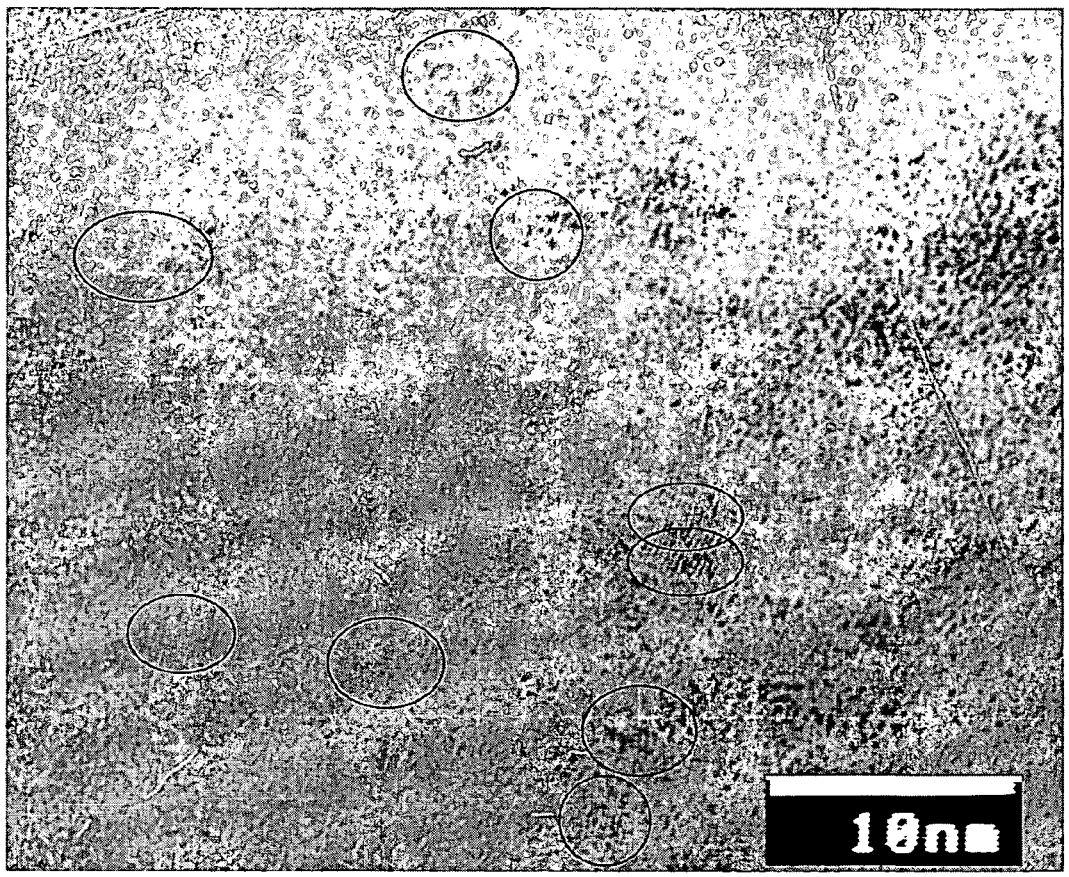
FIG. 34 shows a high-resolution TEM image of part of the region shown in FIG. 31B, after melting by the electron beam. Small crystalline regions are visible, showing that the melted material contains crystalline nanoparticles.

The crystal structure was dependent on what molecule was grafted to the nanoparticle surface. FIG. 31A shows a crystalline structure assembled from 1-dodecene grafted silicon nanoparticles. FIG. 31B shows styrene-grafted silicon nanoparticles assembled into rod-like crystalline domains, roughly 45 nm in diameter. The SAED pattern in the inset of FIG. 31A corresponds to a d-spacing of about 2.14 Å with hexagonal symmetry. A different spot on the same sample, presumably corresponding to a different orientation of the same crystal, gave a distorted hexagonal pattern with d-spacings of about 1.55 Å, 1.84 Å, and 2.03 Å. The SAED pattern in the inset of FIG. 31B has a rectangular pattern corresponding to d-spacings of about 6.1 Å and 6.5 Å. When the electron beam was focused on these structures, they rapidly melted. This is consistent with differential scanning calorimetry (DSC) measurements (FIG. 32) that showed an endothermic phase transition at 44.5° C. for dodecene-grafted silicon and 66° C. for styrene-grafted silicon. These transitions are about 80° C. and 97° C. above the normal melting points of 1-dodecene (mp=−35° C.) and styrene (mp=−31° C), respectively. High-resolution images of the melted region confirmed that it contained silicon nanoparticles within it (FIGS. 33-34). As discussed herein, the mass fraction of silicon in the grafted particles is only about 30% for green-emitting nanoparticles with styrene or 1-dodecene on their surface. This corresponds to a silicon volume fraction of less than 15%. From this perspective, it is perhaps not surprising that the organic molecules can crystallize around the comparatively small silicon cores. The covalent attachment of the organic molecules to the silicon surface presumably restricts their movement and promotes crystallization.

Peak assignments for FTIR spectra of grafted silicon nanoparticles are shown in Table 3 (below) and peak assignments for $^1$H NMR spectra of grafted silicon nanoparticles are shown in Table 4 (below).

TABLE 3

Peak assignments for FTIR spectra of grafted silicon particles.

| Grafted Silicon Particle | Peak Assignments for FTIR Spectra |
|---|---|
| Etched silicon particles (KBr, cm$^{-1}$): | $\nu(SiH_2) = 2105$, $\nu(Si—O) = 1087$, $\delta(SiH_2) = 895$, $\delta(SiH) = 640$. |
| 1-Pentene-grafted silicon particles (ATR, cm$^{-1}$): | $\nu(CH_3) = 2953$, $\nu(CH_2) = 2923$ and 2852, $\nu(CH) = 2920$, $\nu(SiH_2) = 2105$, $\delta(CH_2) = 1470$, $\delta(CH_3) = 1377$, $\nu(Si—O) = 1067$, $\delta(SiH_2) = 895$. |
| 1-Hexene-grafted silicon particles (ATR, cm$^{-1}$): | $\nu(CH_3) = 2954$, $\nu(CH_2) = 2925$ and 2852, $\nu(CH) = 2920$, $\nu(SiH_2) = 2105$, $\delta(CH_2) = 1470$, $\delta(CH_3) = 1377$, $\nu(Si—O) = 1067$, $\delta(SiH_2) = 855$. |
| 1-Octene-grafted silicon particles (ATR, cm$^{-1}$): | $\nu(CH_3) = 2953$, $\nu(CH_2) = 2923$ and 2850, $\nu(SiH_2) = 2110$, $\delta(CH_2) = 1470$, $\delta(CH_3) = 1377$, $\nu(Si—O) = 1077$, $\delta(SiH_2) = 855$. |
| 1-Dodecene-grafted silicon particles (ATR, cm$^{-1}$): | $\nu(CH_3) = 2954$, $\nu(CH_2) = 2925$ and 2852, $\nu(SiH_2) = 2113$, $\delta(CH_2) = 1470$, $\delta(CH_3) = 1377$, $\nu(Si—O) = 1087$, $\delta(SiH_2) = 855$. |
| 1-Octadecene-grafted silicon particles (ATR, cm$^{-1}$): | $\nu(CH_3) = 2954$, $\nu(CH_2) = 2925$ and 2852, $\nu(SiH_2) = 2200$(wide peak), $\delta(CH_2) = 1470$, $\delta(CH_3) = 1377$, $\nu(Si—O) = 1090$, $\delta(SiH_2) = 855$. |
| Styrene-grafted silicon particles (ATR, cm$^{-1}$): | $\nu(CH,\text{aromatic}) = 3024$, $\nu(CH_3 \text{ or } CH_2 \text{ or } CH) = 2940–2865$, $\nu(SiH_2) = 2107$, $\nu(C═C$, skeletal in-plane vibration of benzene ring$) = 1610$ and 1495, $\delta(CH_2) = 1449$, $\nu(Si—O) = 1090$, $\delta(SiH_2) = 910$. |
| Vinyl acetate-grafted silicon particles (ATR, cm$^{-1}$): | $\nu(CH_3 \text{ or } CH_2 \text{ or } CH) = 2965–2886$, $\nu(SiH_2) = 2114$, $\nu(C═O) = 1733$, $\delta(CH_2) = 1465$, $\delta(CH_3) = 1377$, $\nu(C—O—C) = 1234$, $\nu(Si—O) = 1050$, $\delta(SiH_2) = 910$. |
| Ethyl undecylenate-grafted silicon particles (ATR, cm$^{-1}$): | $\nu(CH_3) = 2934$, $\nu(CH_2) = 2886$, $\nu(C═O) = 1735$, $\delta(CH_2) = 1462$, $\delta(CH_3) = 1370$, $\nu(C—O—C) = 1180$, $\nu(Si—O) = 1040$. |

TABLE 3-continued

Peak assignments for FTIR spectra of grafted silicon particles.

| Grafted Silicon Particle | Peak Assignments for FTIR Spectra |
|---|---|
| 1-Hexen-5-ol-grafted silicon particles (ATR, cm$^{-1}$): | $\nu$(OH) = 3580–3300$\nu$ (CH$_3$) = 2954, $\nu$(CH$_2$) = 2920 and 2845, $\nu$(SiH$_x$) = 2114(wide peak), $\delta$(CH$_2$) = 1470, $\delta$(CH$_3$) = 1380, $\nu$(Si—O) = 1070, $\delta$(SiH$_2$) = 900. |
| 10-undecen-1-ol-grafted silicon particles (ATR, cm$^{-1}$): | $\nu$(OH) = 3600–3310, $\nu$(CH$_3$) = 2950, $\nu$(CH$_2$) = 2917 and 2843, $\delta$(CH$_2$) = 1465, $\delta$(CH$_3$) = 1375, $\nu$(Si—O) = 1050–1030. |
| Sulfonated styrene-grafted silicon particles (ATR, cm$^{-1}$): | $\nu$(OH) = 3800–3000, $\nu$(Si=O) = 1645, $\nu$(S=O) = 1390, $\nu$(Si—O) = 1200–1030, $\delta$(S=O) = 784. |

TABLE 4

Peak assignments for $^1$H NMR spectra of grafted silicon particles.

| Grafted Silicon Particle | Peak Assignments for $^1$H NMR Spectra |
|---|---|
| 1-Pentene, 1-hexene, 1-octene, 1-dodecene or 1-octadecene-grafted silicon particles (ppm, CDCl$_3$): | $\delta$ = 1.8–1.50(CH, m), 1.29(CH$_2$, m), 0.88(CH$_3$, t). |
| Ethyl undecylenate-grafted silicon particles (ppm, CDCl$_3$): | $\delta$ = 4.15(COOCH$_2$, t), 2.30(CH$_2$CO, t), 1.57(CH, s), 1.31(CH$_2$, s), |
| Styrene-grafted silicon particles (ppm, CDCl$_3$): | $\delta$ = 7.15, 6.55(aromatic protons, m), 2.03(CH, s), 1.60–1.0(CH$_2$, m), 0.90(CH$_3$, m). |
| Vinyl acetate-grafted silicon particles (ppm, CDCl$_3$): | $\delta$ = 4.90(COO—CH, m), 4.20(COOCH$_2$, m), 2.05(CH$_2$COO, m), 1.23(CH$_2$, m), 0.91(CH$_3$, s). |
| 10-undecen-1-ol-grafted silicon particles (ppm, CDCl$_3$): | $\delta$ = 3.62(HOCH$_2$, t), 1.64(CH, s), 1.33(CH$_2$, m), 0.92(CH$_3$, d). |

Example 10

Organically Capped Silicon Nanoparticles with Blue Photoluminescence Prepared by Hydrosilylation Followed by Oxidation As shown in Examples 11-17, a facile method of preparing stable blue-emitting silicon nanoparticles that are dispersible in common organic solvents has been developed (Hua et al., Langmuir 22(9):4363-4370 (2006), which is hereby incorporated by reference in its entirety). Oxidation of yellow-emitting silicon nanoparticles with an organic monolayer grafted to their surface, using either UV irradiation in solution or heating in air, converted them to blue-emitting particles. The evolution of the PL spectrum and infrared absorption spectrum of the particles was followed during the oxidation process. The PL spectrum showed a decrease in the PL emission peak near 600 nm and the appearance and increase in intensity of a PL emission peak near 460 nm, rather than a smooth blue-shift of the emission spectrum from yellow to blue. The organic monolayer grafted to the particle surface was not degraded by this oxidation process, as demonstrated by FTIR and NMR spectroscopy. Similar results were achieved for particles with styrene, 1-octene, 1-dodecene, and 1-octadecene grafted to the surface, demonstrating that it is the silicon nanocrystal, and not the organic component, that is essential to this process. The organic monolayer allows the nanoparticles to form stable clear colloidal dispersions in organic solvents and provides for the possibility of further chemical functionalization of the particles. Combined with previous work on organically grafted silicon nanoparticles with green through near-infrared emission, this enables the efficient and scalable preparation of stable colloidal dispersions of organically grafted silicon nanoparticles with emission spanning the entire visible spectrum.

In summary, a facile method was developed to prepare blue-emitting silicon nanoparticles as colloidal dispersions in a variety of common solvents. Oxidation of yellow-emitting silicon nanoparticles having an organic monolayer grafted to their surface, using either UV irradiation in solution or heating of dry particles in air, converted them from yellow-emitting to blue-emitting. The organic monolayer grafted to the particle surface was not affected by this oxidation process. The presence of the organic monolayer allows these nanoparticles to form stable dispersions in a variety of common organic solvents, and provides for the possibility of further chemical functionalization of the particles. Combined with previous work on surface grafted silicon nanoparticles with green through near infrared emission, this enables the efficient and scalable preparation of stable colloidal dispersions of organically grafted silicon nanoparticles with emission spanning the entire visible spectrum. The mechanism of blue emission from these particles remains an open question, to be addressed by further studies using time-resolved PL and PLE measurements and more refined structural characterization of the particles.

Example 11

Materials Used for the Experimental Procedures Described in Examples 12 to 17

Silane (SiH$_4$), (electronic grade, Scott Gases), 1-octene (Acros, 99+ wt %), 1-dodecene (Acros, 94 wt %), 1-octadecene (Acros, tech, 90 wt %), and styrene (Aldrich, 99 wt %, 15 ppm tert-4-tert-butylcatechol), were used as received. The Si nanoparticles were prepared by dissociating silane (SiH$_4$) via heating with a CO$_2$ laser beam (Coherent, Model 42, 60 Watts) in an aerosol reactor, as described in detail previously (Li et al., Langmuir 19:8490 (2003), which is hereby incorporated by reference in its entirety). The resulting particles, ranging from 5 to 10 nm in diameter, were collected on cellulose nitrate membrane filters. They did not exhibit photoluminescence and were not readily dispersed in common solvents.

Example 12

Etching Procedure

The etching protocol used here was optimized to produce hydrogen-terminated particles with very little oxygen on their surface, and has been described in detail previously (Hua et al., Langmuir 21:6054-6062 (2005), which is hereby incorporated by reference in its entirety). The particles were etched with an acid mixture of HF (48 wt %) and HNO$_3$ (69 wt %) (10/1, v/v). In a typical experiment, 20 to 50 mg of silicon nanoparticles was dispersed via sonication into 2 to 6 ml of methanol. 11 ml of acid mixture was added to the resulting dispersion. The particle sizes decreased and the particle surfaces were passivated during this etching process. As a result, the particles exhibited bright, visible photoluminescence. The color of the photoluminescence changed from red to yellow to green as the etching proceeded. The etching rate decreased with increasing amount of methanol used to disperse the particles initially. When the desired emission color was reached, the etching was slowed by adding about 10 ml of methanol or a methanol/water mixture (1/3, v/v). The particles were collected on a polyvinylidene fluoride (PVDF) membrane filter (pore size 100 nm) and washed with a large amount of the water/methanol mixture to remove any adsorbed acid mixture. Finally, the particles were rinsed with pure methanol. The etching time required to obtain yellow-emitting particles was typically from 4 to 12 minutes. This time varies significantly with the initial particle size, age of unetched particles, and exact composition of the etching solution.

Example 13

Photoinitiated Hydrosilylation

The freshly etched hydrogen-terminated silicon nanoparticles were transferred into a 25 ml Aldrich Schlenk-type reactor containing a magnetic stirrer and 2 to 3 ml of the compound that was to be grafted to the particles via photoinitiated hydrosilylation. In the work presented herein, styrene, 1-octene, 1-dodecene, and 1-octadecene were grafted to the hydrogen-terminated nanoparticles, but a variety of other compounds with a terminal double bond can be grafted to the particles by the same basic procedure (Hua et al., *Langmuir* 21:6054-6062 (2005), which is hereby incorporated by reference in its entirety). Sonication was used to disperse the particles, but a stable colloidal dispersion was not formed and the reactor contents appeared cloudy in all cases. The reactor was attached to a high-vacuum line and the contents were degassed using at least three freeze-thaw cycles. A Rayonet Photochemical Reactor (Southern New England Ultraviolet Co.) equipped with 10 RPR-2537 Å UV tubes was used to initiate the hydrosilylation reaction. The reaction time required varied substantially depending on the compound being attached to the particles and the particle size, as described previously (Hua et al., *Langmuir* 21:6054-6062 (2005), which is hereby incorporated by reference in its entirety). Typical reaction times were 5 minutes for styrene, 45 minutes for 1-octene or 1-dodecene, and 60 minutes for 1-octadecene. After reaction, a clear dispersion was obtained. It was drawn through a PTFE syringe filter (pore size 0.45 µm). Excess styrene or 1-octene was evaporated under vacuum at room temperature. Excess 1-dodecene was removed under vacuum at 60° C., and 1-octadecene in a vacuum oven at 90° C. After the photoinitiated hydrosilylation, some unreacted hydrogen typically remained on the nanoparticle surface, as evidenced by FTIR spectroscopy.

Example 14

Oxidation of Grafted Silicon Particles Under UV Radiation in Air

Dry grafted silicon particles were dispersed in 3 ml chloroform or toluene and the solution was capped (to prevent solvent evaporation) and subjected to UV radiation in a Rayonet Photochemical Reactor equipped with 10×RPR-2537 Å UV tubes in the presence of air. In this case, the solvent was not degassed and presumably remained saturated with dissolved oxygen. During the oxidation, the PL and FTIR spectra were followed as described herein. The time required for emission to shift from yellow to blue varied from as little as 2 hours for some styrene-grafted samples to more than twelve hours for some samples with long-chain alkanes grafted to their surface. Details of the time-course of reaction are given below. After reaction, the particle dispersion was passed through a PTFE syringe filter (pore size=0.45 µm) and the solvent was evaporated. The resulting sample was readily redispersed in chloroform or toluene.

Example 15

Thermal Oxidation of Grafted Silicon Particles at 140° C. in Air

Dry grafted silicon particles were introduced into a 3-ml vial and placed into an oven at 140° C. The oven contained room air and was not purged. After one day, the solid sample was cooled to room temperature and dispersed in 3 ml chloroform or toluene. The resulting solution emitted blue under a handheld UV lamp (355 nm). The solid sample was redispersed in chloroform or toluene. It was passed through a PTFE syringe filter (pore size=0.45 µm) and then the solvent was removed using a rotary evaporator.

Example 16

Characterization

Fourier transform infrared (FTIR) spectra were obtained using a Mattson Galaxy Series 5000 FTIR spectrometer. The spectra for grafted silicon particles were determined in the horizontal attenuated total reflectance (ATR) mode of the spectrometer by casting a drop (chloroform or toluene dispersion) on the internal reflection element card and allowing the solvent to evaporate. $^1$H and $^{13}$C NMR spectra were obtained using a 400 MHz INOVA-400. Photoluminescence (PL) spectra were recorded using a Perkin-Elmer model LS-50 fluorescence spectrometer with a 390 nm emission cutoff filter. The excitation wavelength was set at 355 nm and emission scanning was carried out from 400 to 900 nm. For each PL measurement made during the course of the oxidation process, 50 microliters of the silicon nanoparticle dispersion was added to 2 ml of toluene in a quartz cuvette. Quantum yield (QY) measurements were made under illumination from a 404 nm LED using an integrating sphere to collect emission. The QY was determined by reference to two standard dyes, Coumarin 102 and Coumarin 522B. High resolution transmission electron microscopy (HRTEM) and electron diffraction were carried out using a JEOL model JEM 2010 microscope at an acceleration voltage of 200 kV.

Example 17

Results and Discussion Relating to Experiments Described in Examples 10-16

Figure 35:
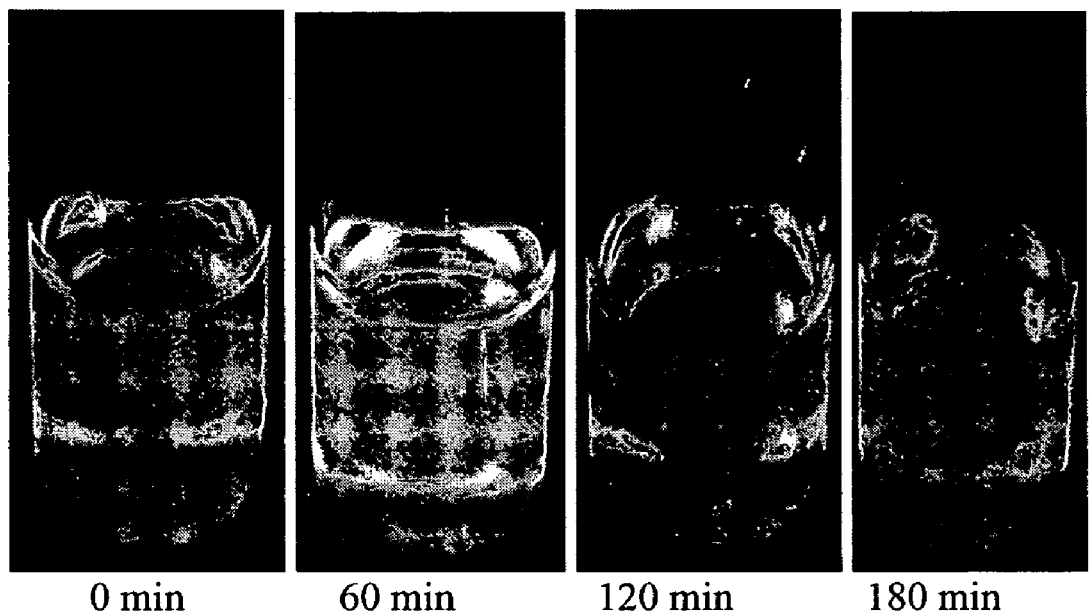
FIG. 35 shows photographs illustrating photoluminescence from styrene-grafted silicon nanoparticles after different periods of time under 254 nm UV illumination. For the photographs, the particles were illuminated with a 355 nm handheld UV lamp.

When carrying out photoinitiated hydrosilylation of green-emitting particles with styrene, it was observed that the PL emission red-shifted if exposure to 254 nm UV light was continued after the hydrosilylation was complete. This appeared to result from partial surface oxidation of the silicon particles by traces of oxygen still present in solution after the styrene had been degassed by multiple freeze-thaw cycles, based on the appearance of Si—O—Si stretching vibrations at 1050 cm$^{-1}$ in the FTIR spectrum of the particles after 3 minutes of reaction. This oxidation could introduce states within the bandgap, leading to red-shifted emission or loss of emission. Furthermore, after the particles were dried at 70° C. for 100 h in air, the emission red-shifted further from light green to yellow while the intensity of the Si—H stretching vibration decreased due to the further oxidation of remaining Si—H$_x$ on the silicon particle surface. Thus, styrene-grafted particles that initially had green emission showed a red-shift of their PL and a decrease in PL intensity when they were oxidized. This is qualitatively the same result that has been widely observed for particles without organic molecules grafted to their surface. However, styrene-grafted silicon particles that had yellow or orange emission before oxidation exhibited qualitatively different behavior. The remainder of this section describes only experiments starting from particles that had been etched for a shorter time to produce samples with orange or yellow emission. Styrene was grafted to the surface of these particles as described herein. When the styrene-grafted yellow-emitting particles were dispersed in chloroform or toluene, from which dissolved oxygen had not been removed, and were further treated by UV radiation at 254 nm, a change in their emission from yellow to blue was observed as shown in FIG. 35.

Figure 36:
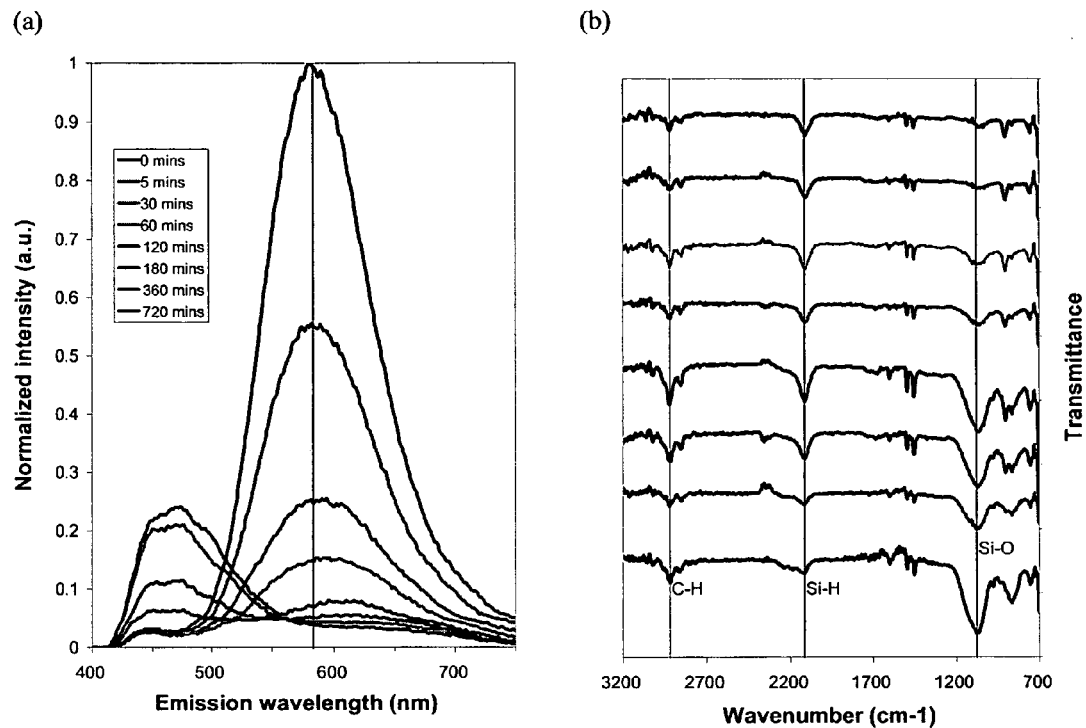
FIGS. 36A-B are graphs showing PL spectra (FIG. 36A) and FTIR spectra (FIG. 36B) of styrene-grafted silicon particles after different periods of time under 254 nm UV illumination in toluene. All PL spectra are normalized to the initial spectrum, so relative intensities can be compared between them. PL and FTIR spectra are from the same experiment at corresponding times, as indicated by the line colors.

This oxidation process and transformation from yellow to blue emission were followed using photoluminescence spectroscopy and FTIR spectroscopy as shown in FIG. 36. Initially, the emission peak near 580 rim decreased in intensity and slightly red-shifted with increasing irradiation time, as shown in FIG. 36A. All PL spectra in FIG. 36A were measured under identical conditions, and were all normalized to the peak intensity of the initial spectrum, before UV induced oxidation. Thus, the intensities are directly comparable among the different spectra in FIG. 36A. It should be noted that the red-shift in the overall yellow emission peak cannot necessarily be associated with a red-shift in the emission from a given particle. A more likely explanation is that the largest particles, which emit at longer wavelengths, are somewhat less reactive toward oxidation. If that is the case, then the emission intensity from the large particles would decrease more slowly than that from the smaller particles, resulting in a red-shift of the spectrum from the ensemble of particles. At any given wavelength outside of the blue peak, the emission intensity decreases monotonically with time. Note that FIG. 36 presents results for a different sample than that shown in the photos in FIG. 35. The time required for oxidation and change in the PL emission color varied somewhat from sample to sample. The sample shown in FIG. 35 oxidized faster than the sample for which data are shown in FIG. 36. Although the quantum yield (QY) for a single sample was not followed during the course of the oxidation process, the QY was measured for two styrene-grafted samples after oxidation. Under 404 nm excitation, those two samples had peak emission wavelengths of 485 nm and 487 nm, and QY of 6.6±1.5% and 7.1±1.5%, respectively. This is roughly the same as the typical QY measured for yellow-emitting styrene-grafted particles, which ranges from 2% to 10% for samples prepared in our laboratory by the methods used here. Although in cases like that shown in FIG. 36, the peak intensity of the blue emission was lower than that of the initial yellow emission, changes in absorption cross-section of the particles are also occurring, so this intensity decrease cannot directly be interpreted as a decrease in QY. Once the UV oxidation was ended, the blue emission was quite stable. Samples stored as dispersions in toluene under room illumination and ambient atmosphere have thus far maintained their blue luminescence, as well as their colloidal stability, for at least 8 months.

The infrared spectrum of the particles was measured during the course of this photo-oxidation by extracting ~200 microliters of the silicon particle dispersion, dropping it on the internal reflection element of the spectrometer's attenuated total reflectance (ATR) accessory, and allowing the solvent to evaporate. The IR spectrum of the particle film was then measured in the horizontal ATR mode of the FTIR spectrometer. FIG. 36B shows the FTIR spectra from the same sample whose PL spectra are shown in FIG. 36A. During the first hour of irradiation, the primary change in the PL spectrum is the decrease in intensity and slight red-shift of the yellow emission. The most notable change in the IR spectrum during this time is the appearance of a broad absorption peak near 1050 cm$^{-1}$ that corresponds to Si—O stretching. During this time, there is not any dramatic change in the absorption peak near 2100 cm$^{-1}$ that corresponds to Si—H stretching frequencies. This suggests that oxidation is occurring without displacing hydrogen from the surface. After two hours, the intensity of the Si—H peak relative to the hydrocarbon modes near 2900 cm$^{-1}$ has decreased somewhat. At irradiation times from 2 to 6 hours, the primary change in the PL spectrum is an increase in the intensity of the blue emission. The intensity of the Si—O infrared absorption relative to the Si—H features continues to increase during this time, but no new features appear. The Si—H peak continues to decrease during this time. Between 6 and 12 hours, there is little further change in the PL spectrum or the FTIR spectrum. Even after 12 hours of irradiation, there is still a small amount of Si—H remaining in this sample. The IR absorption peaks characteristic of the styrene moiety (υ(CH$_3$, CH$_2$ or CH) at 2940-2865 cm$^{-1}$, υ(C=C, skeletal in-plane vibration of benzene ring) at 1610 and 1495 cm$^{-1}$, and δ(CH$_2$) at 1449 cm$^{-1}$), remained stable throughout the 12 hours of irradiation. This indicates that oxidation did not displace or oxidize the organic groups grafted to the surface.

Figure 37:
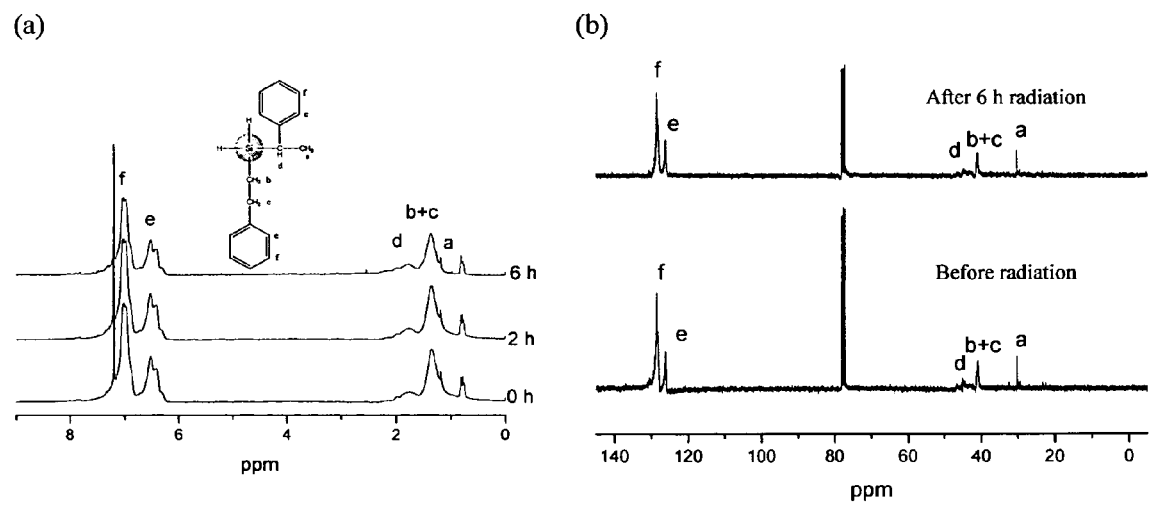
FIGS. 37A-B are graphs showing $^1$H NMR (FIG. 37A) and $^{13}$C NMR (FIG. 37B) spectra from styrene-grafted silicon particles before and after UV irradiation at 254 nm.

To further investigate the stability of the organic monolayer under UV irradiation, in a separate experiment, $^1$H NMR and $^{13}$C NMR were performed on a dispersion of the particles in deuterated chloroform, as shown in FIG. 37. The proton signals in FIG. 37A (δ=7.15, 6.55 (aromatic protons, m), 2.03 (CH, s), 1.60-1.0 (CH$_2$, m), 0.90 (CH$_3$, m)) can be assigned as shown schematically in the inset. These signals were unchanged by the UV radiation and accompanying oxidation. No new peaks were observed. Similarly, $^{13}$C NMR spectra (FIG. 38B) showed that the organic monolayer was not degraded. The treated styrene-grafted silicon particles formed clear stable colloidal dispersions in chloroform, dichloromethane, toluene, tetrahydrofuran, dimethylformamide and dimethylsulfoxide. The lack of change in the NMR spectra and in the organic-related components of the FTIR spectrum, along with the fact that the particles maintained their blue emission in different solvents, provides evidence that the blue emission comes from the silicon nanoparticles and does not arise from the organic monolayer or the solvent. UV illumination of styrene in toluene under the same conditions does not lead to any luminescence. UV illumination of particles without an organic monolayer on their surface, whether as a powder or in a solvent from which dissolved oxygen has not been removed, leads to a reduction in intensity or complete loss of yellow luminescence, but does not lead to blue luminescence from them. Although toluene was used as the solvent in all UV induced oxidation experiments discussed herein, similar results were also achieved using chloroform as the solvent and without any solvent (irradiating a dry film of particles).

Figure 38:
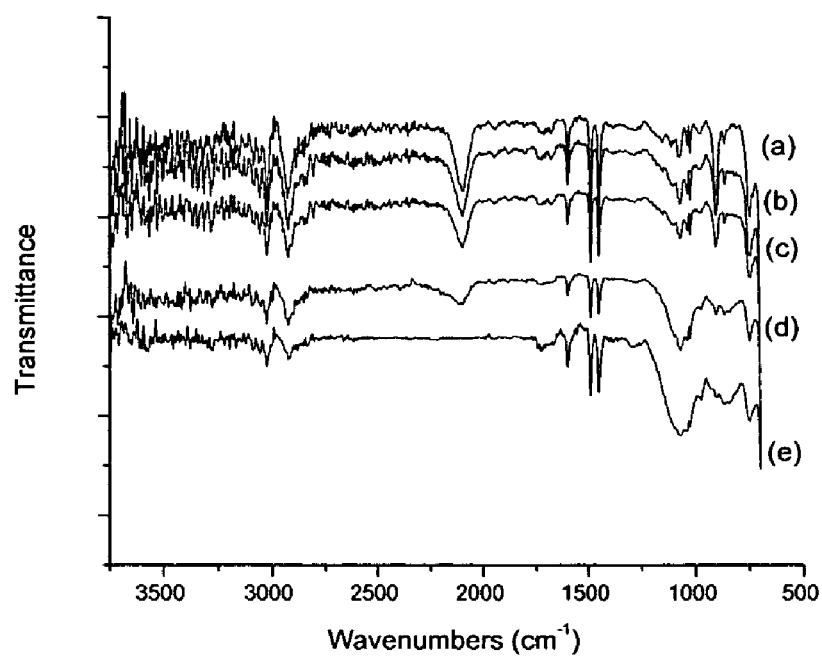
FIG. 38 is a graph showing oxidation of styrene-grafted silicon particles upon heating in air. FTIR spectra are shown for particles after (a) 0 min, (b) 60 min, (c) 600 min, and (d) 6000 min. at 70° C. and (e) after 1 day at 140° C.

The same oxidation-induced blue-shift of the photoluminescence could be achieved by extended heating of the particles in air at 140° C. After 1 day of heating, oxidation similar to that generated by UV irradiation was observed. However, the particles were quite resistant to oxidation when heated at lower temperature. FIG. 38 shows FTIR spectra for styrene-grafted silicon nanoparticles after different periods of heating at 70° C. and for particles after heating for one day at 140° C. Even after more than 4 days at 70° C., there was residual hydrogen remaining on the particle surface, and the PL emission was not significantly changed. However, after 1 day at 140° C., substantial oxidation had occurred and the FTIR spectrum was similar to that of the particles treated with UV irradiation at 254 nm. The photoluminescence from these particles was also very similar to that from the UV irradiated particles. Because this thermal treatment was performed on dry powders that had to be re-dispersed in a solvent to make photoluminescence measurements, following the course of the oxidation with a series of PL and FTIR measurements as done for the UV irradiated particles was not attempted.

Figure 39:
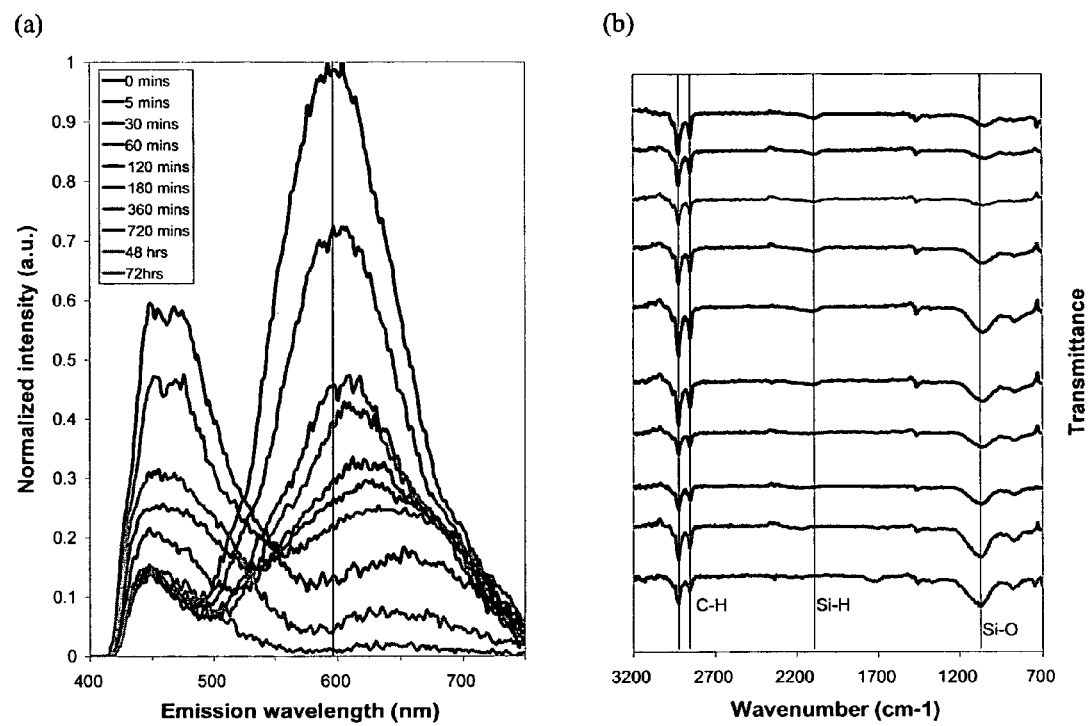
FIGS. 39A-B are graphs showing PL spectra (FIG. 39A) and FTIR spectra (FIG. 39B) of dodecene-grafted silicon particles after different periods of time under 254 nm UV illumination in toluene. All PL spectra are normalized to the initial spectrum, so relative intensities can be compared between them. PL and FTIR spectra are from the same experiment at corresponding times, as indicated by the line colors.

Silicon nanoparticles grafted with alkyl chains, including 1-octene, 1-dodecene, and 1-octadecene were treated with the same methods to generate blue emitting silicon nanoparticles. FIG. 39 shows the evolution of the PL spectrum and FTIR spectrum of 1-dodecene grafted particles during photooxidation. The process proceeded somewhat more slowly in this case than for the styrene-grafted particles, but the results were quite similar otherwise. The dodecene-grafted particles had much less residual hydrogen on their surface after hydrosilylation than the styrene-grafted particles had, and this sample already showed a small amount of surface oxidation prior to irradiation. This experiment was continued for 72 hours, but the maximum blue PL intensity was achieved after 12 hours. At longer times, the intensity of the entire spectrum decreased slowly. As was the case for the styrene-grafted particles, most of the oxidation seen in the FTIR spectrum occurred during the first two hours, but the oxide peak continued to grow slowly over the entire 72-hour period. The maximum intensity of the blue emission, relative to the initial yellow emission, was somewhat higher in this case than for the styrene-grafted particles for which results were shown in FIG. 36.

Figure 40:
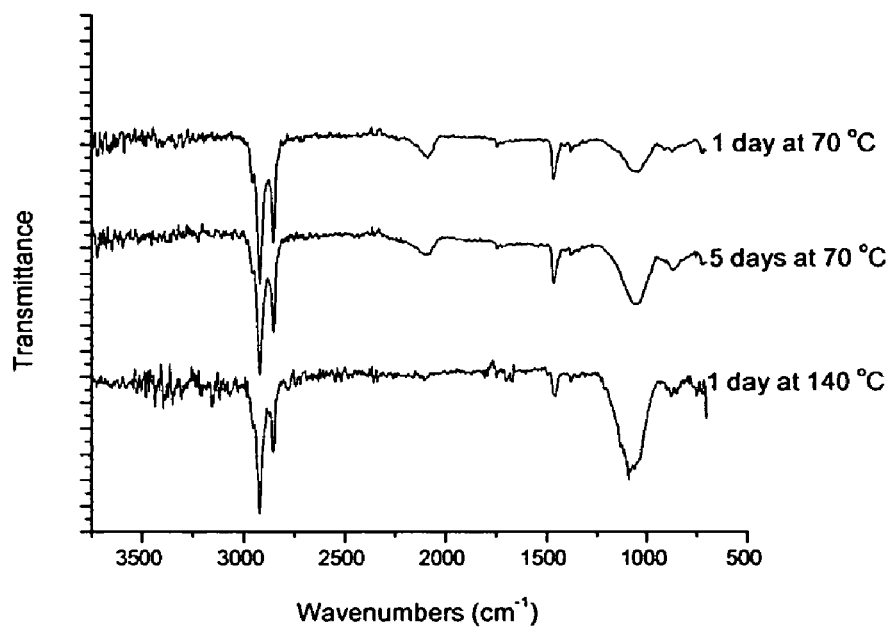
FIG. 40 is a graph showing FTIR spectra showing the thermal oxidation of 1-dodecene-grafted silicon particles in air.
Figure 41:
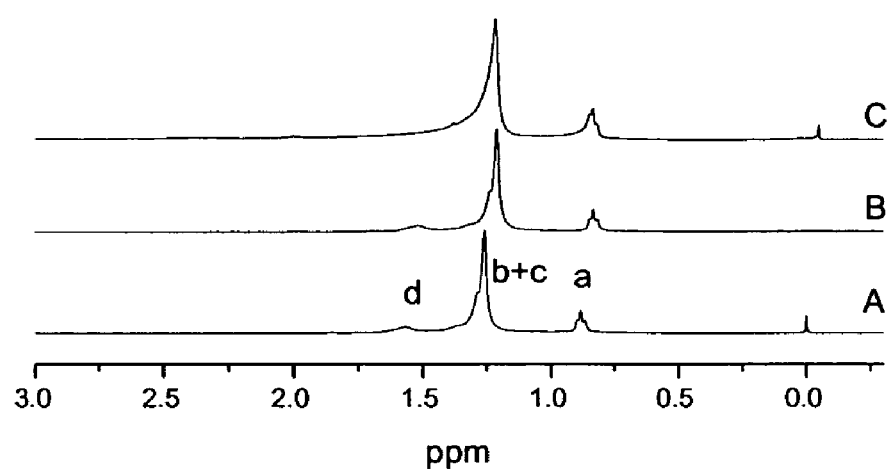
FIG. 41 is a graph showing $^1$H NMR spectra from 1-dodecene-grafted silicon particles before oxidation (A), after 6 h irradiation at 254 nm (B), and after 1 day of heating in air at 140° C. (C). Peaks a and b+c are assigned to $CH_3$ and $CH+CH_2$, respectively. Peak (d) is attributed to slight $H_2O$ contamination in the $CDCl_3$ solvent.

FIG. 40 shows the FTIR spectra of dodecene-grafted particles heated in air. Like the styrene-grafted particles, the 1-dodecene grafted particles are quite resistant to oxidation in air at 70° C. The FTIR spectrum shows that some surface hydrogen is still present after 5 days at 70° C. However, after 1 day at 140° C., the FTIR spectrum showed substantial surface oxidation and complete disappearance of the Si—H feature. The particles heated at 140° C. also exhibited blue photoluminescence. FIG. 41 shows the $^1$H NMR spectrum from 1-dodecene grafted particles before and after oxidation. The FTIR and $^1$H NMR spectra confirm that the organic monolayer was not significantly degraded by either the thermal or UV oxidation.

Figure 42:
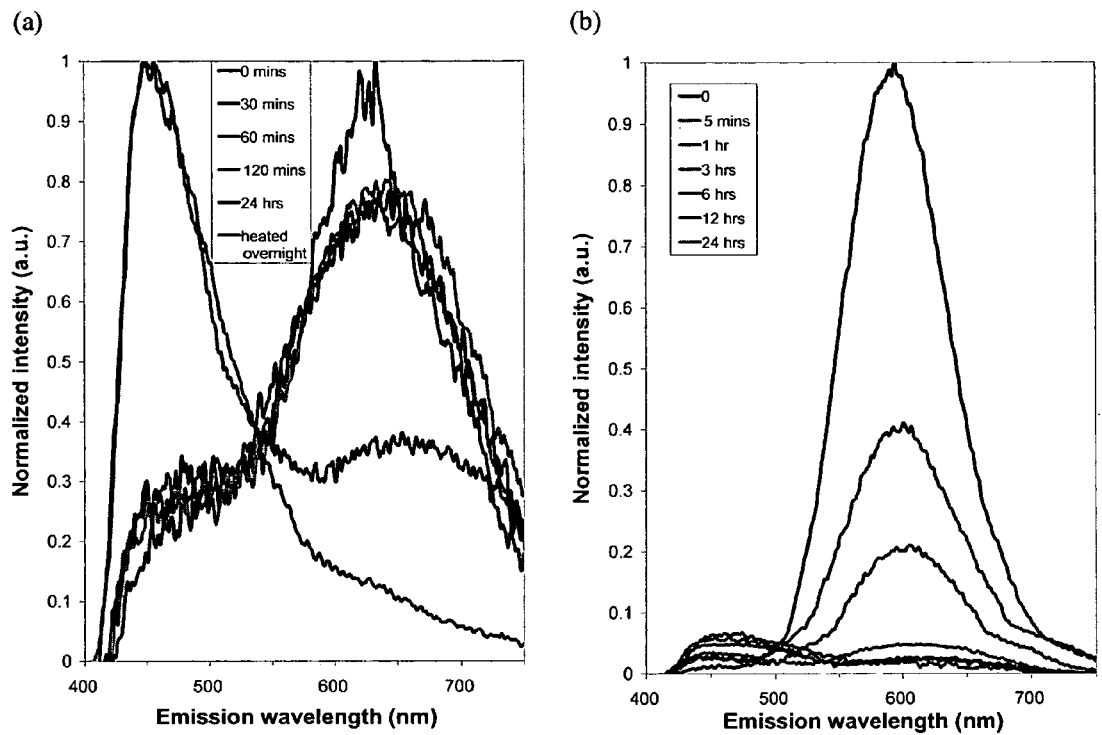
FIGS. 42A-B are graphs showing PL spectra from (a) 1-octadecene-grafted silicon particles (FIG. 42A) and (b) 1-octene grafted silicon particles (FIG. 42B) after different periods of illumination with 254 nm light. For the octadecene grafted particles, the final spectrum after 24 hours of illumination has been separately normalized and a normalized spectrum from particles that were heated for 24 hours in air at 140° C. is included for comparison.

Similar results were obtained for 1-octene-grafted and 1-octadecene grafted particles. FIG. 42 shows the PL spectra from 1-octadecene grafted nanoparticles and 1-octene grafted particles. For the 1-octadecene grafted particles the photooxidation was slower than for styrene or 1-dodecene grafted particles, but after 24 hours of illumination the particles showed blue photoluminescence. FIG. 42A also includes the PL spectrum for 1-octadecene grafted particles that had been heated in air at 140° C. The blue component of the photoluminescence is essentially identical to that from the UV-treated particles. For the 1-octadecene grafted particles, the PL emission after oxidation was slightly narrower and peaked at somewhat shorter wavelength compared to that for styrene grafted particles and 1-dodecene grafted particles. For 1-octene grafted particles, the time scale for the oxidation was similar to that for styrene-grafted particles. The final blue PL emission was at somewhat longer wavelength and somewhat broader than for styrene-grafted or 1-dodecene-grafted particles. Thus, for these alkyl-capped particles, the oxidation rate seems to decrease with increasing chain length, as might be expected if transport through the alkyl monolayer limits the oxidation rate. The blue emission peak obtained after oxidation seems to become narrower and more intense with increasing length of the alkyl chains.

Taken together, the results presented herein show that controlled oxidation of organically capped yellow-emitting photoluminescent silicon nanoparticles provides a general means of producing blue-emitting silicon nanoparticles. This oxidation can be driven by UV light or by heating with similar results, and can be achieved with different organic molecules attached to the nanoparticle surface. The intensity and quantum yield of the blue emission following oxidation are comparable to those of the yellow emission prior to oxidation. The mechanism of the blue photoluminescence from these particles remains a topic for further studies using time-resolved PL and PLE measurements and other techniques that are beyond the scope of the present study. The manner in which the PL spectra shown in FIGS. 36, 39, and 43 change, with a decrease in the yellow or orange emission accompanied by or followed by an increase in the blue emission, suggests that the change is not due to a simple, smooth reduction in the size of the silicon core that would result in a blue-shift due to increased quantum confinement. In that case, one would expect a smooth blue-shift of the spectrum. Instead, a change in the luminescence mechanism is likely. However, the fact that such similar results are achieved by different treatments and with different organic molecules grafted to the surface suggests that it is changes in the silicon core or at its surface, rather than any change in the organic component, that result in the blue luminescence. It must be noted that all measurements here have been made on an ensemble of particles that presumably contains both luminescent ("bright") and non-luminescent ("dark") particles. Thus, it cannot be concluded from these experiments that a given particle is converted from yellow-emitting to blue-emitting. It may, for example, be that yellow-emitting particles are becoming "dark" and simultaneously and/or subsequently "dark" particles are becoming blue-emitting.

Figure 43:
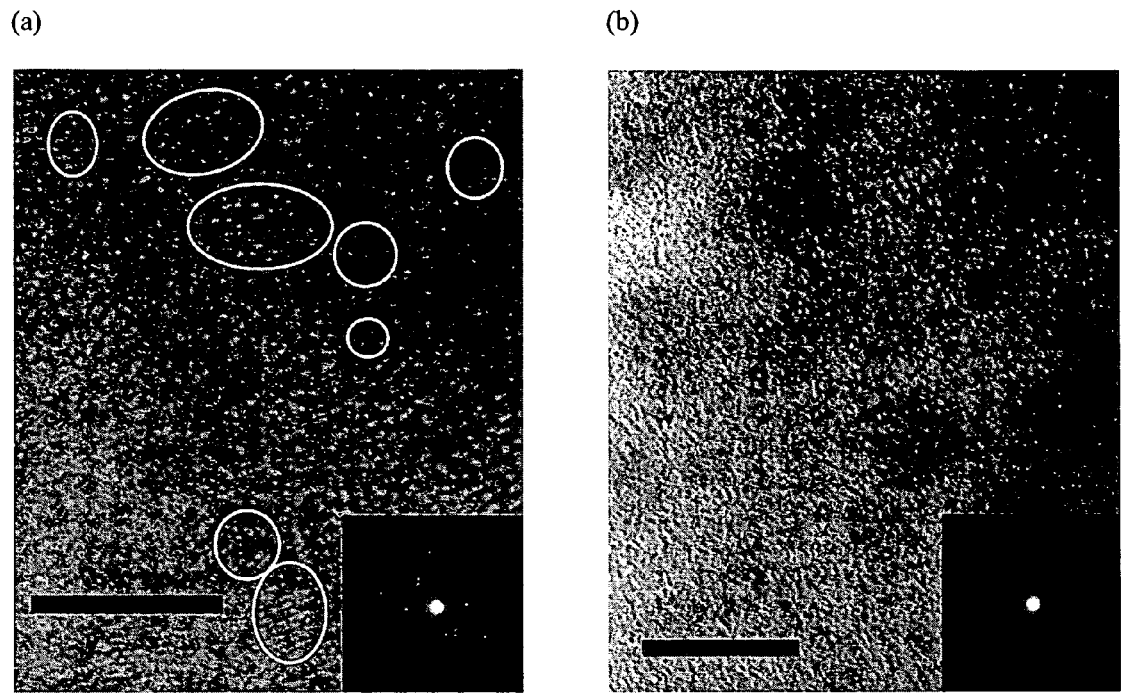
FIGS. 43A-B are graphs showing HRTEM images of (a) yellow-emitting nanoparticles before UV-induced oxidation (FIG. 43A), and (b) blue-emitting nanoparticles after UV-induced oxidation (FIG. 43B).

Likewise, the molecular-level changes that occur during oxidation remain to be identified in more detail. A conclusive determination has not been made from the experiments presented herein whether a crystalline silicon core remains after oxidation, although crystallinity by HRTEM after oxidation as not been detected. As shown previously (Hua et al., *Langmuir* 21:6054-6062 (2005), which is hereby incorporated by reference in its entirety), yellow-emitting samples without any organic grafted to their surface show some crystallinity in x-ray diffraction, and TEM images of them show crystalline domains with diameters near 2 nm. After grafting a monolayer of an organic molecule to the surface, it may be more difficult to detect crystallinity because of interference from the organic layer. The situation is further complicated by the fact that a distribution of particle sizes is invariably present, so any crystallinity seen in XRD or TEM measurements may correspond to only the largest particles in the distribution, and these may not be the particles from which the emission arises. Nonetheless, attempts at HRTEM imaging of particles before and after oxidation have been made. Typical results are shown in FIG. 43. While it is difficult to identify individual particles in these images, it is clear that some crystalline domains, exhibiting lattice fringes in HRTEM, are visible prior to the oxidation, and that none can be observed after oxidation. This is consistent with selected area electron diffraction patterns (shown as insets, FIG. 43), in which clear diffraction spots are visible prior to oxidation, but only diffuse rings are present after oxidation. X-ray photoelectron spectroscopy (XPS) was also performed on the samples for which the TEM images are shown in FIG. 43. However, no firm conclusions could be drawn from the results. As expected, only peaks corresponding to C, O, and Si were observed. There was an increase in the O to Si ratio after oxidation, but this could not be reliably quantified, due to C and O contamination that is invariably introduced to these high surface area samples during sample preparation. There was a slight change in the Si 2 p lineshape but no change in the position or lineshape of the O 1 s or C 1 s peaks.

Despite the evidence of increased oxidation and reduced crystallinity presented above, it is clear that the particles are not fully oxidized to $SiO_2$ under these conditions. When the particles are heated to much higher temperatures, such that they fully oxidize, there is an obvious change in their appearance (from brown to white) and they no longer luminesce. The fact that, as shown for 1-dodecene grafted particles in FIG. 39, the Si—O peak in the FTIR spectrum continues to increase even at very long times for which the blue emission intensity slowly decreases also suggests that emission does not arise from fully oxidized particles. While it appears that the emission does not arise from the organic monolayer itself, it is clear that the organic monolayer plays a key role in the oxidation process that leads to the blue emission, since oxidation of particles without an organic molecule grafted to their surface did not result in blue photoluminescence. This suggests that the organic monolayer plays a role in limiting the extent of oxidation, and that this partial, but not complete, protection of the particle from oxidation is essential in obtaining the blue emission. Overall, the results presented herein suggest that the blue luminescence arises neither from quantum-confined states in a smaller silicon core nor from states in fully-oxidized $SiO_2$, and further work will be required to determine the source of the blue luminescence from these particles. Nonetheless, the present work represents a significant technological advance, since it allows convenient production of stable blue-emitting particles that have been difficult to produce by other means, from yellow-emitting particles that can be much more easily produced.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A method for preparing photoluminescent silicon nanoparticles having uniformly hydrogen-terminated surfaces that are essentially free of residual oxygen, said method comprising:
providing a plurality of silicon nanoparticles;
acid etching the silicon nanoparticles with an acid mixture comprising about 80 to 95 volume percent of a concentrated hydrofluoric acid solution and about 5 to 20 volume percent of a nitric acid solution, wherein said concentrated hydrofluoric acid solution comprises about 40 to 55 weight percent of hydrofluoric acid and said concentrated nitric acid solution comprises about 60 to 75 weight percent of nitric acid under conditions effective to produce photoluminescent silicon nanoparticles; and
rinsing the photoluminescent silicon nanoparticles with a rinsing mixture comprising water and methanol under conditions effective to yield photoluminescent silicon nanoparticles having uniformly hydrogen-terminated surfaces that are essentially free of residual oxygen.

2. The method according to claim 1, wherein said acid mixture comprises a hydrofluoric acid/nitric acid solution comprising about a 10:1 ratio by volume of concentrated hydrofluoric acid solution to concentrated nitric acid solution.

3. The method according to claim 2, wherein said concentrated hydrofluoric acid solution comprises about 46 to 52 weight percent of hydrofluoric acid and said concentrated nitric acid solution comprises about 66 to 72 weight percent of nitric acid.

4. The method according to claim 1, wherein said rinsing mixture comprises a mixture of water and methanol comprising about 10 to 40 volume percent methanol.

5. The method according to claim 1, wherein said rinsing mixture comprises a mixture of water and methanol comprising about 20 to 30 volume percent methanol.

6. The method according to claim 1, wherein the photoluminescent silicon nanoparticles produced by the acid etching step have a diameter of between about 0.1-10 nanometers.

7. The method according to claim 6, wherein the photoluminescent silicon nanoparticles produced by the acid etching step have a diameter of between about 0.1-3 nanometers.

8. The method according to claim 6, wherein the photoluminescent silicon nanoparticles produced by the acid etching step have a diameter of between about 3-4 nanometers.

9. The method according to claim 6, wherein the photoluminescent silicon nanoparticles produced by the acid etching step have a diameter of between about 4-5 nanometers.

10. The method according to claim 1, wherein the photoluminescent silicon nanoparticles produced by the etching step emit photoluminescence selected from the group consisting of red photoluminescence, orange photoluminescence, yellow photoluminescence, green photoluminescence, and blue photoluminescence.

11. The method according to claim 1 further comprising:
grafting an organic molecule to the surface of the photoluminescent silicon nanoparticles after the rinsing step.

12. The method according to claim 11, wherein said grafting is carried out by photoinitiated hydrosilylation.

13. The method according to claim 11, wherein said organic molecule contains a terminal double bond.

14. The method according to claim 13, wherein said organic molecule is selected from the group consisting of 1-pentene, 1-hexene, 1-octene, 1-decene, 1-dodecene, 1-octadecene, styrene, vinyl acetate, ethyl undecylenate, 1-hexen-5-ol, 10-undecen-1-ol, and derivatives thereof.

15. A method for preparing photoluminescent silicon nanoparticles having uniformly hydrogen-terminated surfaces that are essentially free of residual oxygen, said method comprising:
providing a plurality of silicon nanoparticles;
acid etching the silicon nanoparticles with an acid mixture comprising about 35 to 48 weight percent hydrofluoric acid and about 2 to 15 weight percent nitric acid to produce photoluminescent silicon nanoparticles; and
rinsing the photoluminescent silicon nanoparticles with a rinsing mixture comprising water and methanol under conditions effective to yield photoluminescent silicon nanoparticles having uniformly hydrogen-terminated surfaces that are essentially free of residual oxygen.

16. The method according to claim 10 further comprising:
grafting an organic molecule to the photoluminescent nanoparticle to form an organically capped photoluminescent silicon nanoparticle and
partially oxidizing the organically capped photoluminescent nanoparticle under conditions effective to yield a blue-emitting photoluminescent silicon nanoparticle.

17. The method according to claim 16, wherein said partially oxidizing step comprises treating the organically capped photoluminescent silicon nanoparticle at a temperature between 140 and 160 centigrade under conditions effective to yield a blue-emitting photoluminescent silicon nanoparticle.

18. The method according to claim 16, wherein said partially oxidizing step comprises treating the organically capped photoluminescent silicon nanoparticle with ultraviolet radiation under conditions effective to yield a blue-emitting photoluminescent silicon nanoparticle.

19. The method according to claim 16, wherein the organic layer is an organic monolayer or an organic multilayer.

20. The method according to claim 16, wherein the organic layer comprises an organic molecule selected from the group consisting of 1-pentene, 1-hexene, 1-octene, 1-decene, 1-dodecene, 1-octadecene, styrene, vinyl acetate, ethyl undecylenate, 1-hexen-5-ol, 10-undecen-5-ol, and derivatives thereof.

* * * * *